United States Patent
Higuchi et al.

(10) Patent No.: US 8,537,550 B2
(45) Date of Patent: Sep. 17, 2013

(54) WIRING BOARD AND POWER CONVERSION DEVICE

(75) Inventors: Masato Higuchi, Fukuoka (JP); Yasuhiko Kawanami, Fukuoka (JP); Katsushi Terazono, Fukuoka (JP); Koji Higashikawa, Fukuoka (JP); Akira Sasaki, Fukuoka (JP); Takayuki Morihara, Fukuoka (JP); Takashi Aoki, Fukuoka (JP); Tetsuya Ito, Fukuoka (JP); Yukihisa Nakabayashi, Fukuoka (JP); Tasuku Isobe, Fukuoka (JP); Kiyonori Koguma, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 65 days.

(21) Appl. No.: 13/329,423

(22) Filed: Dec. 19, 2011

(65) Prior Publication Data

US 2012/0236500 A1 Sep. 20, 2012

Related U.S. Application Data

(63) Continuation of application No. PCT/JP2010/060332, filed on Jun. 18, 2010.

(30) Foreign Application Priority Data

Jun. 19, 2009 (JP) .................................. 2009-146954

(51) Int. Cl.
 *H05K 7/20* (2006.01)
(52) U.S. Cl.
 USPC ...... 361/699; 361/679.53; 361/700; 361/711; 361/720; 165/80.4; 165/80.5; 165/104.21; 165/104.26; 165/104.33; 257/714; 174/252; 363/141; 363/143; 363/144

(58) Field of Classification Search
 USPC .............. 361/679.46, 679.53, 688, 689, 700, 361/701, 704, 708–712, 715, 712–724; 165/80.2, 80.4, 80.5, 104.11, 104.21, 104.26, 165/104.33, 185; 257/713–719; 174/15.1, 174/15.2, 16.3, 252; 363/141, 143, 144
 See application file for complete search history.

(56) References Cited

U.S. PATENT DOCUMENTS 4,631,636 A * 12/1986 Andrews ........................ 361/699
4,739,443 A * 4/1988 Singhdeo ...................... 361/689

(Continued)

FOREIGN PATENT DOCUMENTS

| CN | 101707192 A | * | 5/2012 |
|---|---|---|---|
| JP | 03-255690 | | 11/1991 |
| JP | 04-316389 | | 11/1992 |
| JP | 05-299788 | | 11/1993 |
| JP | 06-152172 | | 5/1994 |
| JP | 406152172 A | * | 5/1994 |

(Continued)

OTHER PUBLICATIONS

International Search Report for corresponding International Application No. PCT/JP2010/060332, Sep. 21, 2010.

(Continued)

*Primary Examiner* — Michail V Datskovskiy
(74) *Attorney, Agent, or Firm* — Ditthavong Mori & Steiner, P.C.

(57) ABSTRACT

A wiring board includes a conductor plate including a wiring portion and an electrode portion connected to a power conversion semiconductor element, a liquid-cooling pipe mounted near the conductor plate and causing a cooling liquid to be supplied therethrough, and an insulating resin material arranged at least between the conductor plate and the liquid-cooling pipe.

20 Claims, 53 Drawing Sheets

(56) References Cited

U.S. PATENT DOCUMENTS

| | | | |
|---|---|---|---|
| 5,161,090 A * | 11/1992 | Crawford et al. | 361/700 |
| 5,203,399 A * | 4/1993 | Koizumi | 165/104.33 |
| 5,283,715 A * | 2/1994 | Carlsten et al. | 361/702 |
| 6,377,457 B1 * | 4/2002 | Seshan et al. | 361/690 |
| 6,496,370 B2 * | 12/2002 | Geusic et al. | 361/699 |
| 6,788,537 B2 * | 9/2004 | Saita et al. | 361/700 |
| 7,090,001 B2 * | 8/2006 | Zhou et al. | 165/104.21 |
| 7,800,908 B2 * | 9/2010 | Schulz-Harder et al. | 361/708 |
| 2006/0146496 A1 * | 7/2006 | Asfia et al. | 361/700 |
| 2008/0239671 A1 * | 10/2008 | Amano et al. | 361/699 |
| 2010/0277868 A1 * | 11/2010 | Beaupre et al. | 361/700 |

FOREIGN PATENT DOCUMENTS

| | | | |
|---|---|---|---|
| JP | 11041750 A * | | 2/1999 |
| JP | 11-112113 | | 4/1999 |
| JP | 02000138485 A * | | 5/2000 |
| JP | 2007-027570 | | 2/2007 |
| JP | 2007-273884 | | 10/2007 |
| JP | 2009-117606 | | 5/2009 |

OTHER PUBLICATIONS

Written Opinion for corresponding International Application No. PCT/JP2010/060332, Sep. 21, 2010.

* cited by examiner

FRONT VIEW

BOTTOM VIEW

SIDE VIEW

FRONT VIEW

SIDE VIEW

BOTTOM VIEW

REAR VIEW

WIRING BOARD AND POWER CONVERSION DEVICE

CROSS-REFERENCE TO RELATED APPLICATIONS

The present application is a continuation application of PCT/JP2010/060332, filed Jun. 18, 2010, which claims priority to Japanese Patent Application No. 2009-146954, filed Jun. 19, 2009. The contents of these applications are incorporated herein by reference in their entirety.

BACKGROUND OF THE INVENTION

1. Field of the Invention

Embodiments disclosed herein relate to a wiring board and a power conversion device.

2. Discussion of the Background

One example of a power conversion device is described in Japanese Unexamined Patent Application Publication No. 2007-273884. In the power conversion device, a power module is mounted to each of upper and lower surfaces of a wring board, and a pair of cooling plates is arranged in sandwiching relation to outer surfaces of the power modules mounted on the upper and lower sides.

Thus, the above-mentioned power conversion device has the structure sandwiching the outer surfaces of the power modules by the pair of cooling plates. With that structure, heat is dissipated from the outer surfaces of the power modules, which are heat generating sources, and heat tends to remain at inner surfaces (i.e., connection surfaces to the wiring board and electrode surfaces) of the power modules.

SUMMARY OF THE INVENTION

According to one aspect of the present invention, there is provided a wiring board including a conductor plate including a wiring portion and an electrode portion connected to a power conversion semiconductor element, a liquid-cooling pipe mounted near the conductor plate and causing a cooling liquid to be supplied therethrough, and an insulating resin material arranged at least between the conductor plate and the liquid-cooling pipe.

According to another aspect of the present invention, there is provided a power conversion device including a power conversion semiconductor element and a wiring board electrically connected to the power conversion semiconductor element, the wiring board including a conductor plate including a wiring portion and an electrode portion connected to the power conversion semiconductor element, a liquid-cooling pipe mounted near the conductor plate and causing a cooling liquid to be supplied therethrough, and an insulating resin material arranged at least between the conductor plate and the liquid-cooling pipe.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
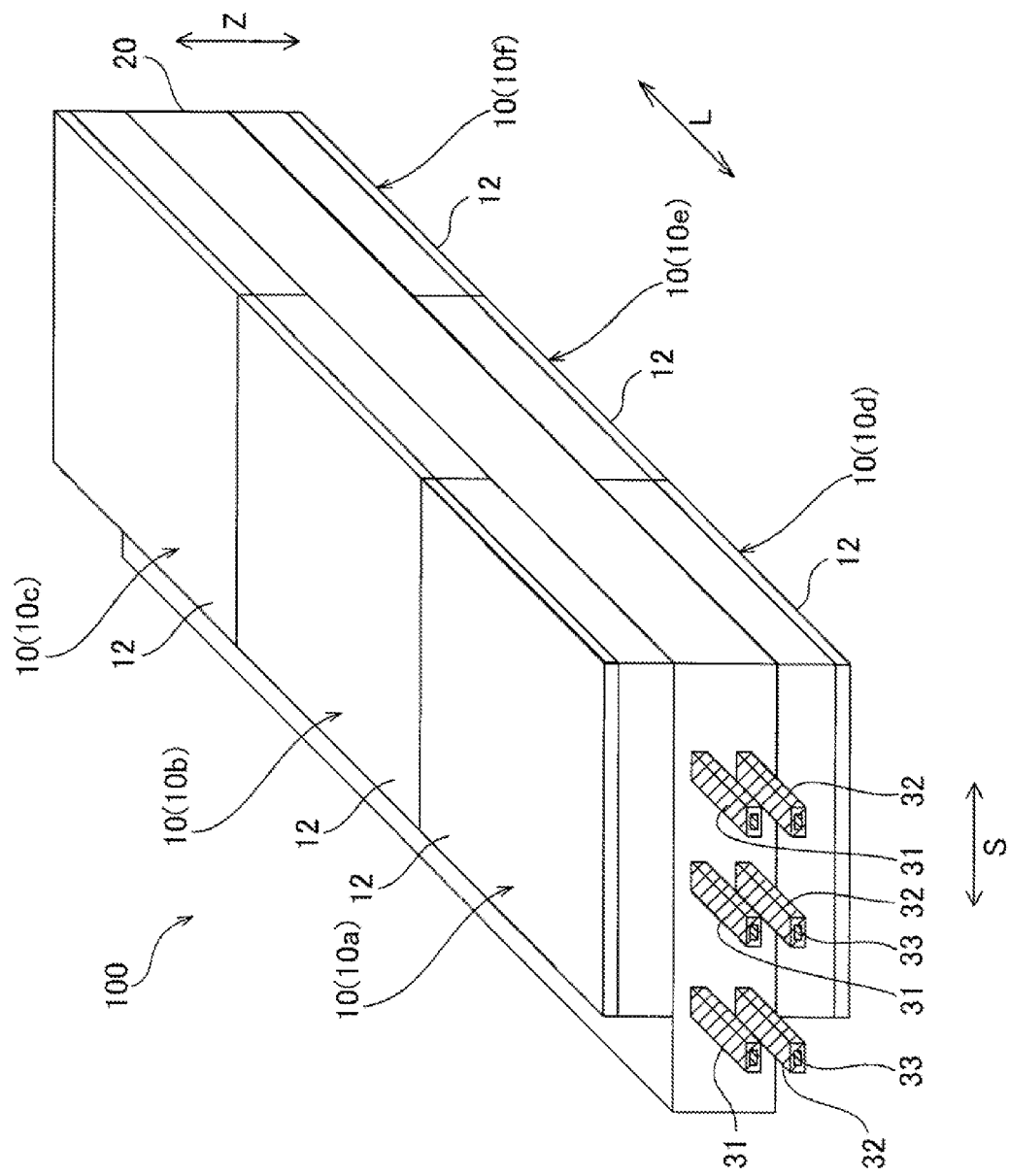
FIG. 1 is a perspective view of a power conversion device, the view representing a first embodiment.

Embodiments will now be described with reference to the accompanying drawings, wherein like reference numerals designate corresponding or identical elements throughout the various drawings.

The embodiments will be described below with reference to the drawings.

First Embodiment

An overall construction of a power conversion device 100 including a wiring board 20, according to a first embodiment, is described with reference to FIGS. 1 to 10. The first embodiment represents one example of the power conversion device.

Figure 2:
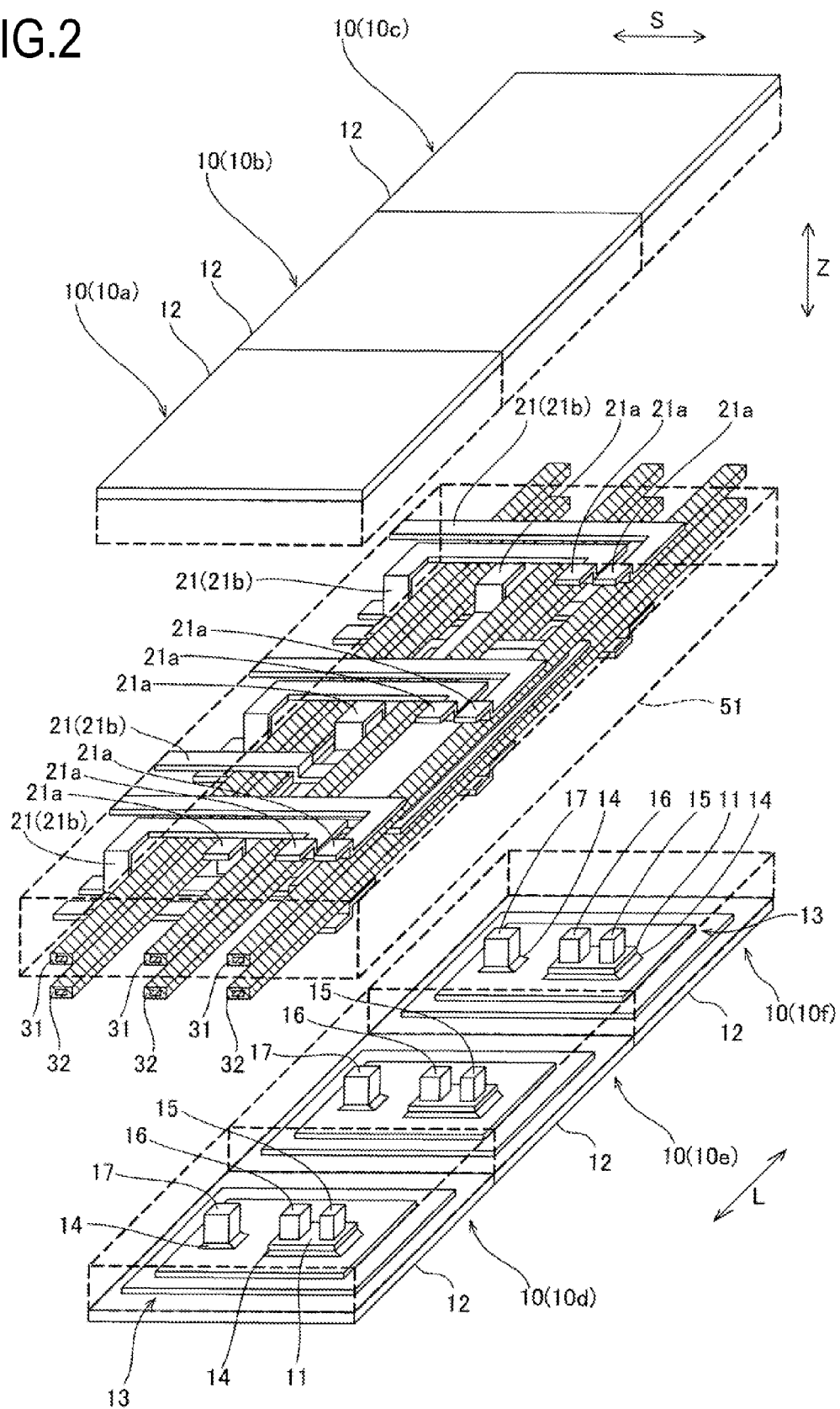
FIG. 2 is an exploded perspective view of the power conversion device, the view representing the first embodiment.
Figure 3:
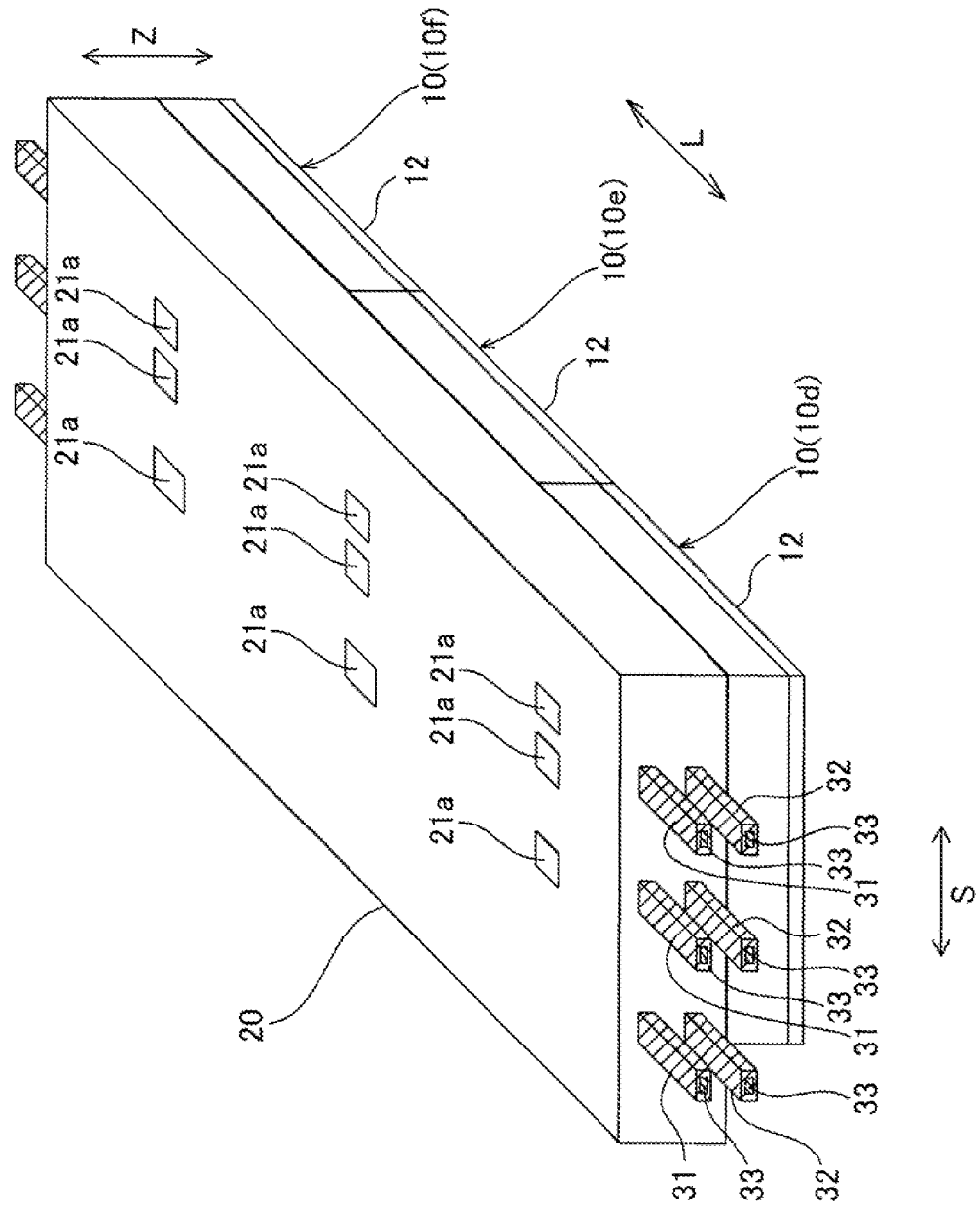
FIG. 3 is a perspective view illustrating a state where upper-side power modules in the power conversion device are removed, the view representing the first embodiment.
Figure 4:
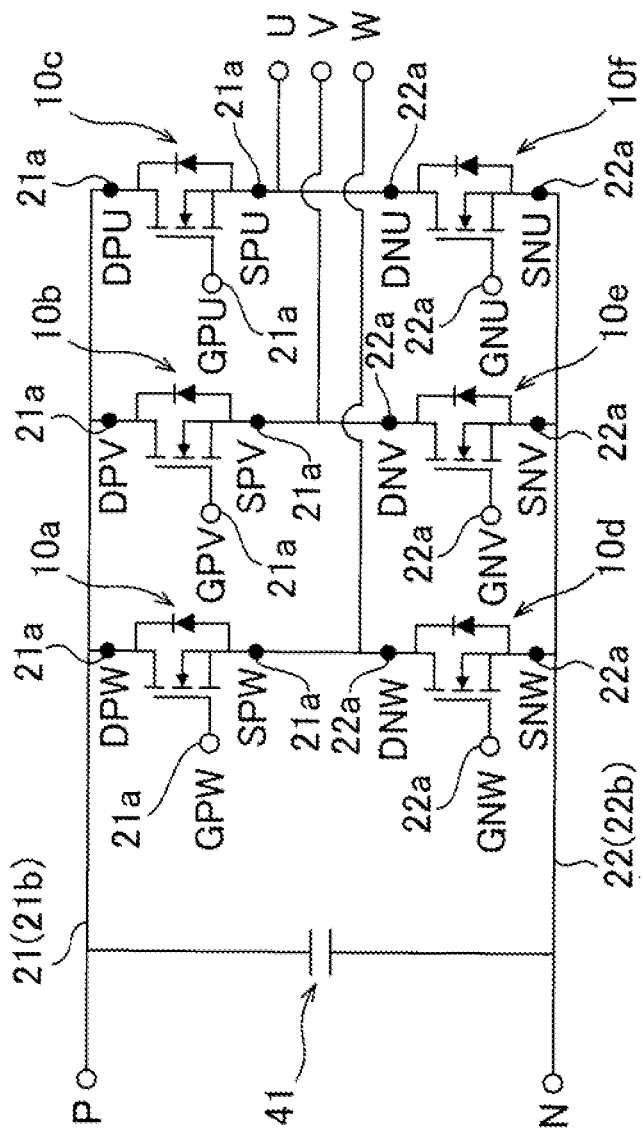
FIG. 4 is a circuit diagram of the power conversion device, the diagram representing the first embodiment.

As illustrated in FIGS. 1 to 3, the power conversion device 100 includes six power modules 10 and a wiring board 20 that is electrically connected to the power modules 10. The six power modules 10 are arranged such that three power modules 10a, 10b and 10c are positioned on the upper surface side of the wiring board 20 and three power modules 10d, 10e and 10f are positioned on the lower surface side of the wiring board 20 in relation sandwiching the wiring board 20 from above and below (in the Z-direction). As illustrated in FIG. 4, every two of the six power modules 10a to 10f in pair are connected in parallel in three stages, whereby a 3-phase full-bridge circuit is constituted.

Figure 5:
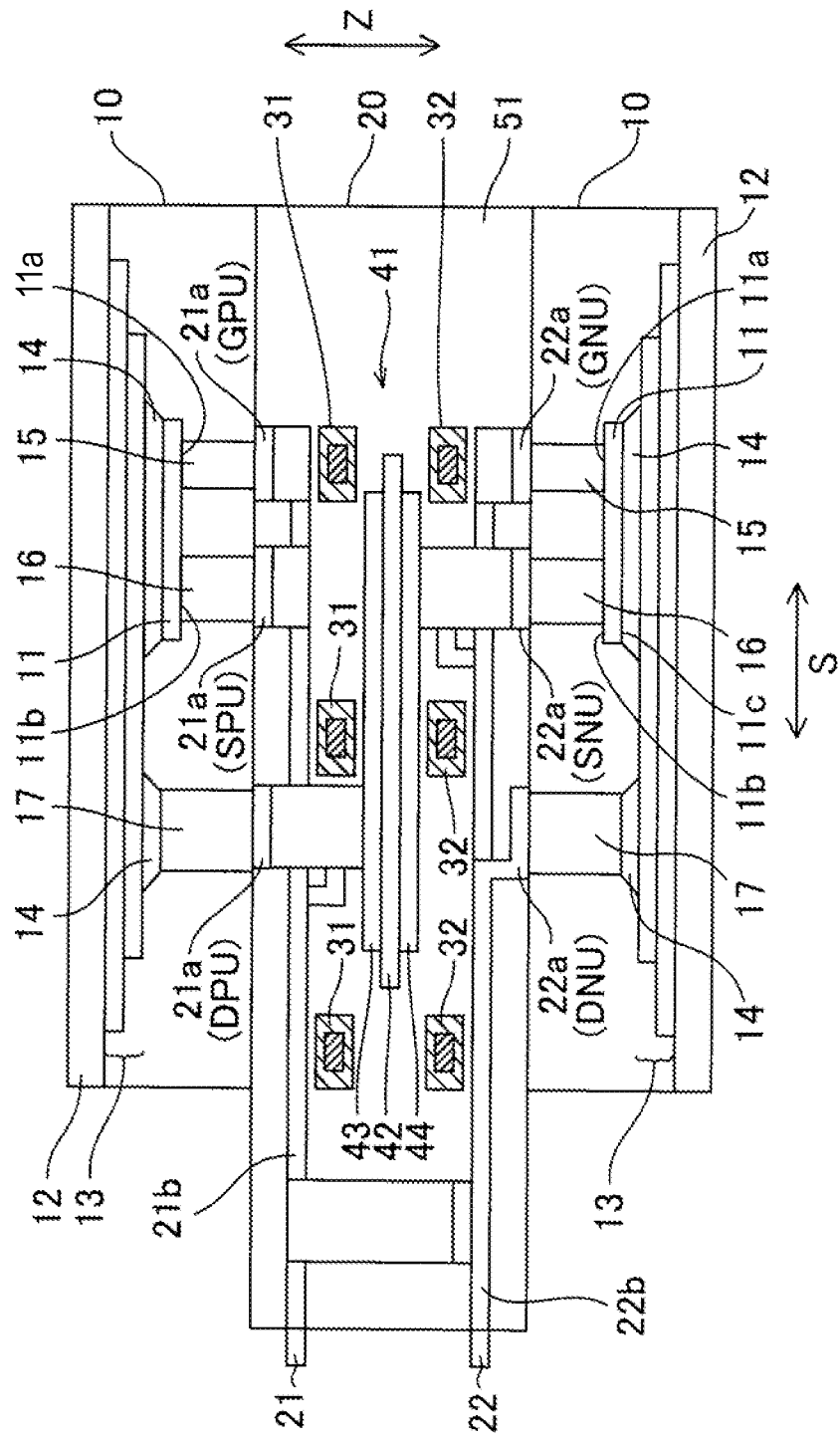
FIG. 5 is a sectional view, looking from a lengthwise direction, of the power conversion device, the view representing the first embodiment.

The six power modules 10 (10a to 10f) have the same structure. More specifically, as illustrated in FIG. 5, the power module 10 includes a semiconductor element 11, one metal plate 12 positioned at a bottom surface of the power module 10, an insulation circuit board 13 for electrically insulating the semiconductor element 11 and the metal plate 12 from each other, a bond (bonding material) 14 made of a solder, a gate terminal 15, a source terminal 16, and a drain terminal 17, those three terminals being used for connection to the wiring board 20. While each of the illustrated power modules 10 includes one semiconductor element 11, the power module 10 may include a plurality of semiconductor elements 11. The semiconductor element 11 is one example of a "power conversion semiconductor element", which term is used in the appended claims. The gate terminal 15, the source terminal 16, and the drain terminal 17 are each one example of an "electrode conductor", which term is used in this specification.

The semiconductor element 11 is formed of a FET (Field-Effect Transistor) capable of performing a high-frequency switching operation. The semiconductor element 11 has a control electrode 11a and a source electrode 11b both disposed on a front principal surface of the semiconductor element 11, and a drain electrode 11c disposed on a rear surface thereof. In FIG. 4, a parasitic diode (body diode) connected in parallel between a drain and a source is formed in the semiconductor element 11. The semiconductor element 11 in this embodiment is formed on a SiC substrate, called a high-frequency switching device, which contains silicon carbide (SiC) as a principal component. The metal plate 12 at the bottom surface of the power module 10 is provided for joining with a cooling unit, such as a heatsink. By attaching, e.g., the cooling unit to the metal plate 12, heat can be dissipated from the bottom surface (outer surface) side of the power module 10. The bond 14 is applied for bonding the semiconductor element 11 and the drain terminal 17 to the insulation circuit board 13. The gate terminal 15 and the source terminal 16 are joined respectively to the control electrode 11a and the source electrode 11b of the semiconductor element 11. The gate terminal 15, the source terminal 16, and the drain terminal 17 are formed to be exposed at an upper surface (electrode surface) of the power module 10 while they are positioned substantially flush with each other.

As illustrated in FIGS. 6 to 9, the wiring board 20 in this embodiment includes a plurality of conductor plates 21 and 22 for connection to the terminals (i.e., the gate terminal 15, the source terminal 16, and the drain terminal 17) of the power module 10, a plurality of liquid-cooling pipes 31 and 32 through which a cooling liquid 33 is supplied, a capacitance member 41 in the form of a flat plate, and an insulating resin material 51. The conductor plate 21 and the conductor plate 22 are respectively one example of a "first conductor plate" and one example of a "second conductor plate", which terms are used in the appended claims. The liquid-cooling pipe 31 and the liquid-cooling pipe 32 are respectively one example of a "first liquid-cooling pipe" and one example of a "second liquid-cooling pipe", which terms are used in the appended claims.

The conductor plates 21 and 22 are each made of metal plate (see FIG. 10) in the form of a flat plate (bus bar) and are each provided plural for connection to the terminals (i.e., the gate terminal 15, the source terminal 16, and the drain terminal 17) of the power module 10. More specifically, the conductor plates 21 are arranged on the upper surface side of the wiring board 20 and are constructed such that they are connected to the terminals (i.e., the gate terminals 15, the source terminals 16, and the drain terminals 17) of the three power modules 10a to 10c on the upper surface side of the wiring board 20. Also, the conductor plates 22 are arranged on the lower surface side of the wiring board 20 and are constructed such that they are connected to the terminals (i.e., the gate terminals 15, the source terminals 16, and the drain terminals 17) of the three power modules 10d to 10f on the lower surface side of the wiring board 20. The conductor plates 21 and 22 are disposed to extend in the widthwise direction (direction S) of the wiring board 20 as viewed from above. The conductor plates 21 and 22 have, respectively, electrode portions 21a and 22a and wiring portions 21b and 22b, which are connected to corresponding ones of the terminals (i.e., the gate terminals 15, the source terminals 16, and the drain terminals 17) of the power modules 10. The electrode portions 21a and 22a of the conductor plates 21 and 22 are formed to be exposed, respectively, at the upper and lower surfaces of the wiring board 20 while they are positioned substantially flush with each other. The electrode portions 21a and 22a can be electrically connected, by surface mounting, to the terminals (i.e., the gate terminals 15, the source terminals 16, and the drain terminals 17), which are exposed at the upper surfaces (electrode surfaces) of the power modules 10 in substantially flush relation. In the drawings, "D" denotes a drain, "S" denotes a source, and "G" denotes a gate. "P" and "N" denote respectively a P-pole and an N-pole. Further, "U", "V" and "W" denote respectively a U-phase, a V-phase, and a W-phase. In the drawings, properties of each electrode, etc. are indicated by a combination of those letters for easier understanding by those skilled in the art.

Thus, the drain terminals 17 of the power modules 10a to 10c on the upper surface side, illustrated in FIG. 4, are connected to the P-pole through the corresponding electrode portions 21a (DPW, DPV and DPU), respectively, and are connected to a first conductor 43 of the capacitance member 41 described later. The source terminals 16 of the power modules 10a to 10c are connected respectively to a W-terminal, a V-terminal, and a U-terminal through the corresponding electrodes 21a (SPW, SPV and SPU). The drain terminals 17 of the power modules 10d to 10f on the lower surface side are connected respectively to a W-terminal, a V-terminal, and a U-terminal through the corresponding electrodes 22a (DNW, DNV and DNU). The source terminals 16 of the power modules 10d to 10f are connected to the N-pole through the corresponding electrode portions 22a (SNW, SNV and SNU), and are connected to a second conductor 44 of the capacitance member 41 described later. Further, the gate terminals 15 of the power modules 10a to 10f are connected respectively to a control circuit (not shown) through the corresponding electrodes 21a and 22a (GPW, GPV, GPU, GNW, GNV and GNU). As a result, a 3-phase full-bridge circuit using the six power modules 10a to 10f is constituted.

Figure 8:
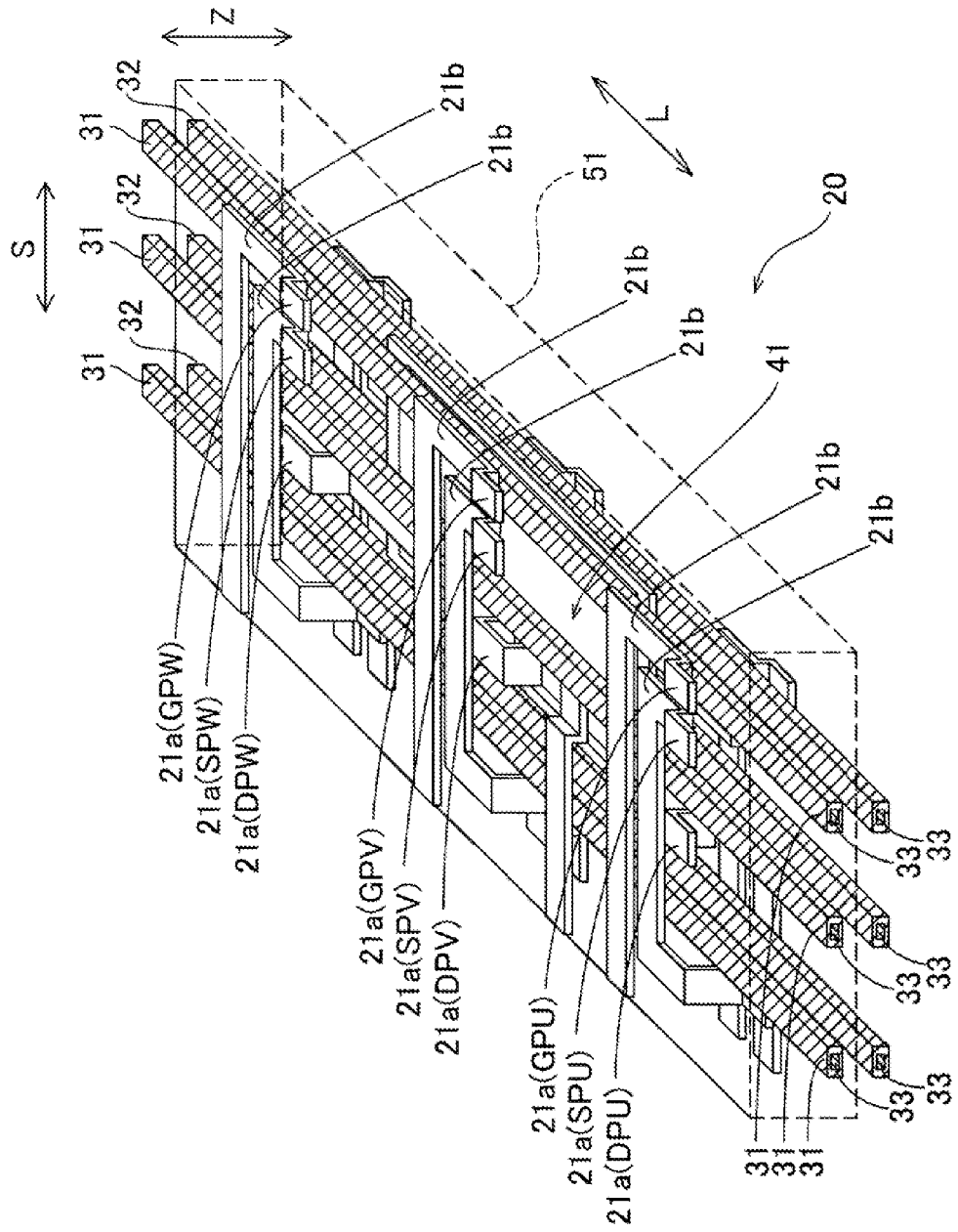
FIG. 8 is a perspective view to explain an inner structure of the wiring board in the power conversion device, the view representing the first embodiment.
Figure 9:
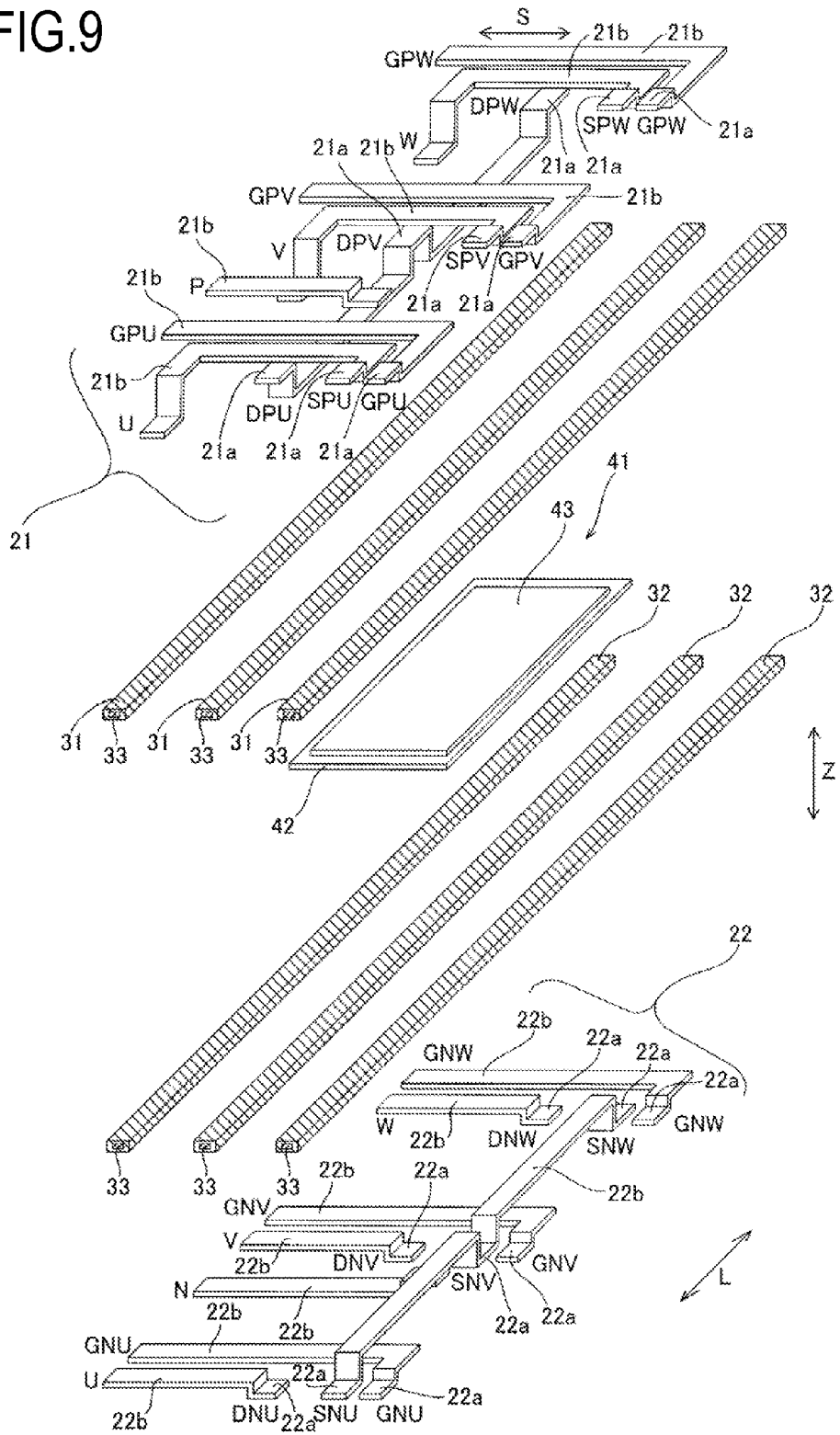
FIG. 9 is an exploded perspective view of the wiring board in the power conversion device, the view representing the first embodiment.
Figure 10:
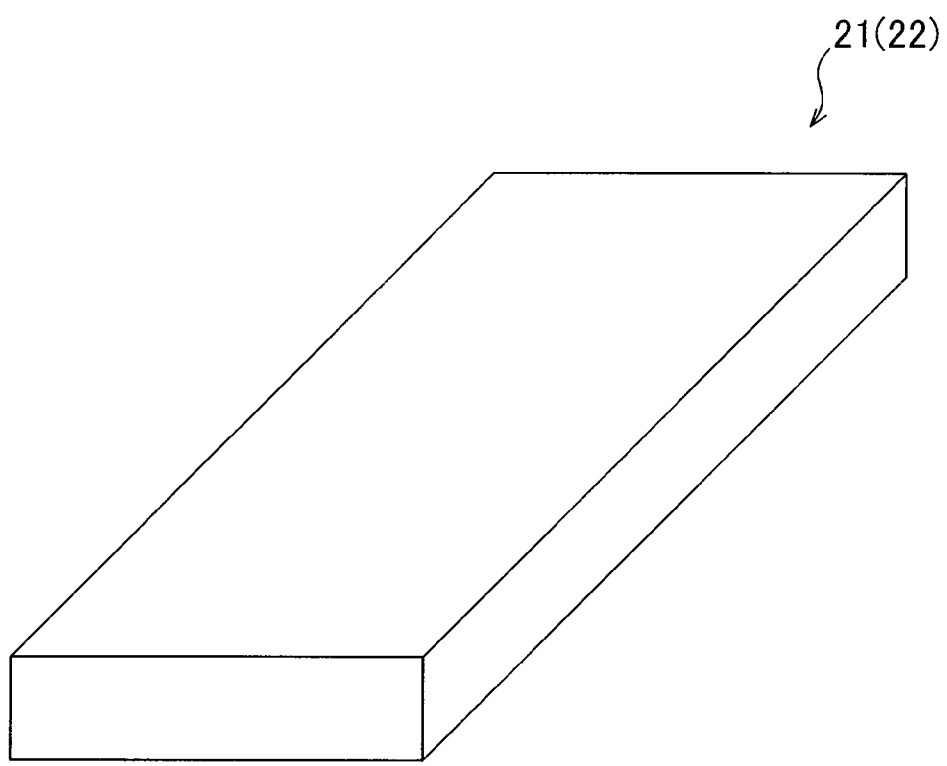
FIG. 10 is a perspective view to explain a conductor plate used in the wiring board in the power conversion device, the view representing the first embodiment.

As illustrated in FIGS. 8 and 9, the liquid-cooling pipes 31 and 32 are disposed to linearly extend in the lengthwise direction (direction L) of the wiring board 20 in crossed relation to the conductor plates 21 and 22 as viewed from above. The liquid-cooling pipe 31 on the upper surface side of the wiring board 20 is disposed three near the conductor plates 21 on the upper surface side of the wiring board 20, and the three liquid-cooling pipes 31 are arranged side by side at respective positions between the conductor plates 21 and the first conductor 43 (later described) of the capacitance member 41. The liquid-cooling pipe 32 on the lower surface side of the wiring board 20 is disposed three near the conductor plates 22 on the lower surface side of the wiring board 20, and the three liquid-cooling pipes 32 are arranged side by side at respective positions between the conductor plates 22 and the second conductor 44 (later described) of the capacitance member 41. Thus, a total of six liquid-cooling pipes 31 and 32 are disposed in the wiring board 20. The liquid-cooling pipes 31 and 32 are disposed to penetrate through the wiring board 20 in the lengthwise direction (direction L) and to be exposed to the outside such that the liquid-cooling pipes 31 and 32 can be connected to an upstream or downstream device, e.g., a liquid-cooling pump or a heat exchanger. With the above-described arrangement, in this embodiment, heat conducted from the power modules 10 through the conductor plates 21 and 22 is absorbed and dissipated by the cooling liquid 33 that flows through the liquid-cooling pipes 31 and 32 near the conductor plates 21 and 22. Accordingly, heat can be dissipated from not only the bottom surface (metal plate 12) side of each power module 10, but also from the inside of the power conversion device 100 (i.e., from the electrode surface side of each power module 10).

Figure 6:
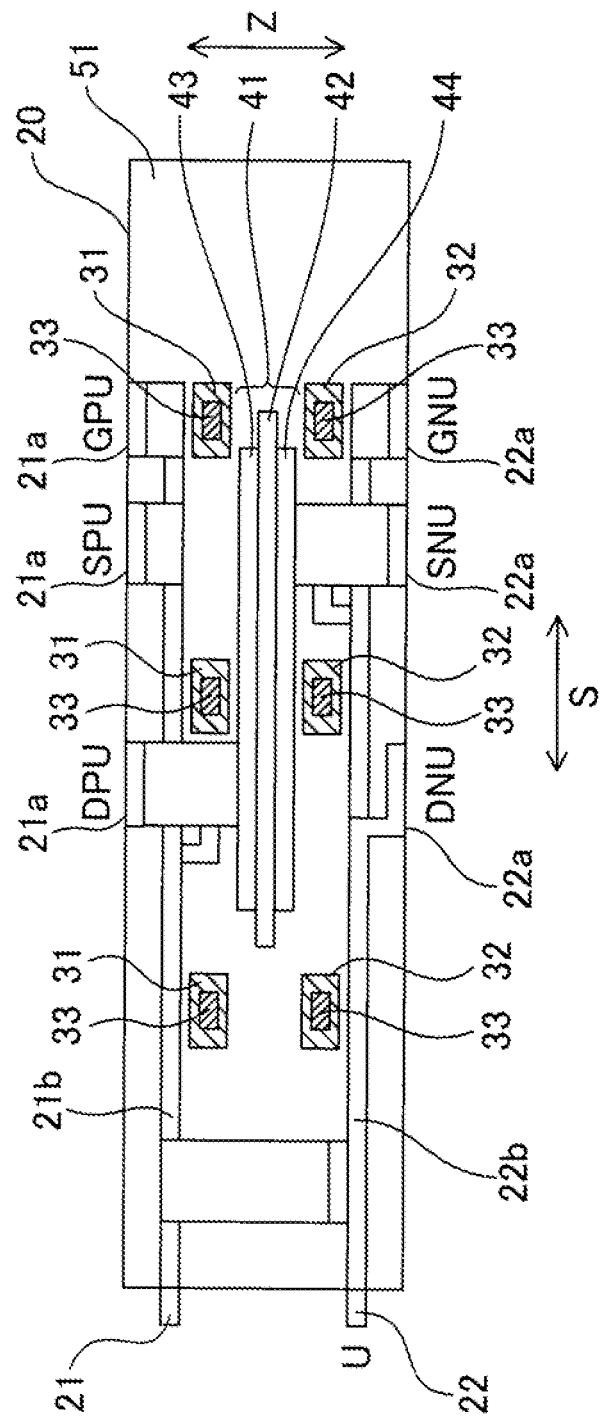
FIG. 6 is a sectional view of a wiring board in the power conversion device, the view representing the first embodiment.

As illustrated in FIG. 6, the capacitance member 41 includes a dielectric plate 42 having a plate-like shape and made of, e.g., ceramic, a plate-like first conductor 43 arranged on the upper side (upper surface) of the dielectric plate 42, and a plate-like second conductor 44 arranged on the lower side (lower surface) of the dielectric plate 42. As illustrated in FIGS. 4 and 5, the conductor plates 21 connected to the drain terminals 17 of the power modules 10a to 10c (see FIG. 2) on the upper surface side through the electrode portions 21a (DPW, DPV and DPU) are connected to the P-pole. Further, the wiring portions 21b are connected to the first conductor 43 of the capacitance member 41. The conductor plates 22 connected to the source terminals 16 of the power modules 10d to 10f (see FIG. 2) on the lower surface side through the electrode portions 22a (SNW, SNV and SNU) are connected to the N-pole. Further, the wiring portions 22b are connected to the second conductor 44 of the capacitance member 41. With such an arrangement, the capacitance member 41 formed of the dielectric plate 42 sandwiched between the first conductor 43 and the second conductor 44 functions as a capacitor (so-called snubber capacitor) illustrated in the circuit diagram of FIG. 4. As illustrated in FIG. 9, by reducing the wiring (i.e., the conductor plates 21 and 22) arranged in a central layer of the wiring board 20, a degree of freedom in shape of the capacitance member 41 is increased. Also, it is easier to secure a sufficient area of the capacitance member 41 (i.e., the dielectric plate 42, the first conductor 43, and the second conductor 44). As a result, a high-performance (high-capacitance) capacitor can be constituted.

Figure 7:
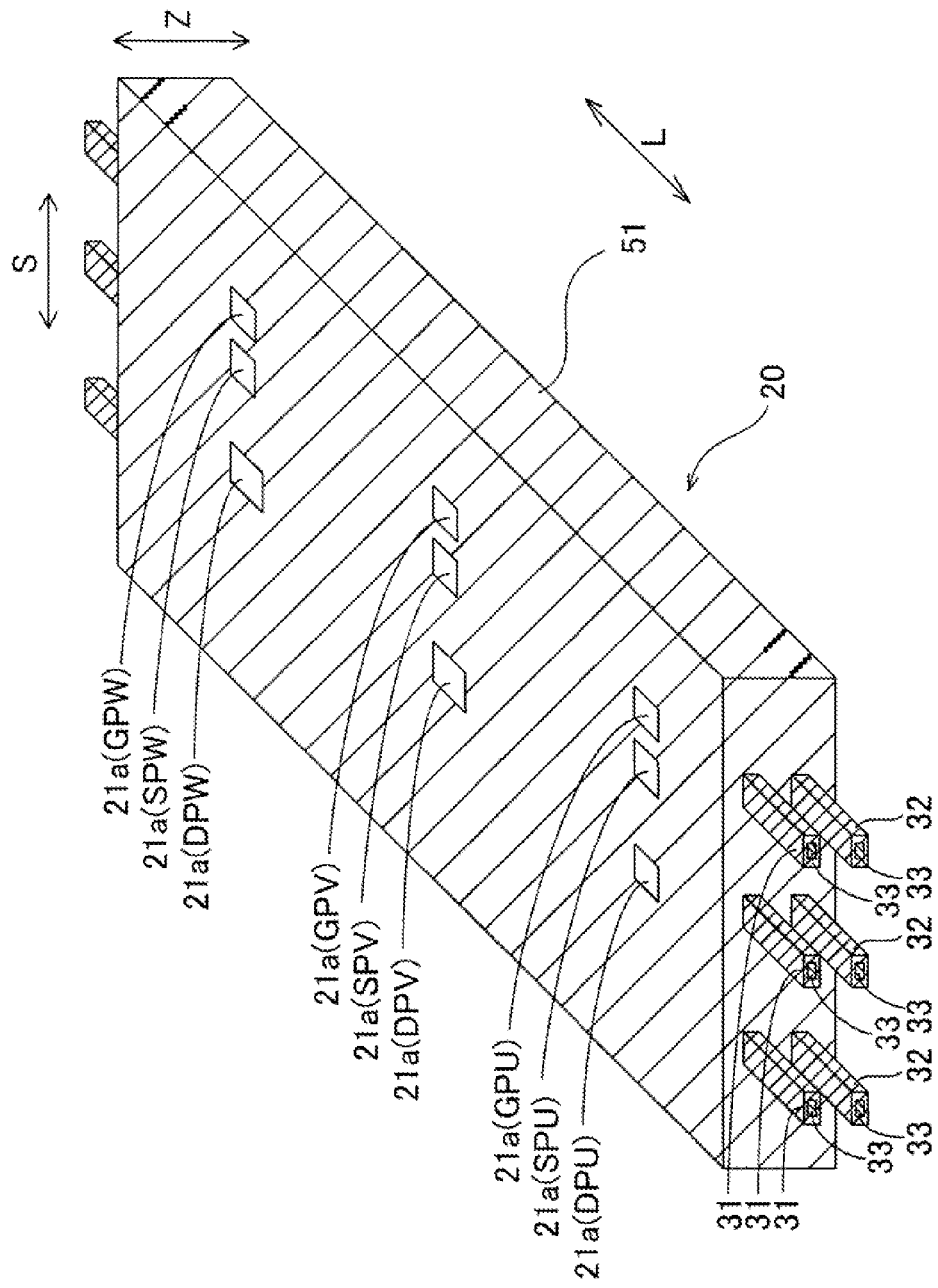
FIG. 7 is a perspective view of the wiring board in the power conversion device, the view representing the first embodiment.

In FIGS. 7 and 8, the insulating resin material 51 is made of a glass epoxy resin and is disposed so as to fill spaces between adjacent ones of the plural conductor plates 21 and 22, the plural liquid-cooling pipes 31 and 32, and the capacitance member 41. In this embodiment, electrical coupling between the conductor plates 21 and 22 and electrical coupling between each of the conductor plates 21 and 22 and the capacitance member 41 (corresponding one of the first conductor 43 and the second conductor 44) are established, for example, by welding or soldering. Thereafter, the conductor plates 21 and 22 of the wiring board 20, the liquid-cooling pipes 31 and 32, and the capacitance member 41 are integrated by molding the resin material 51. Thus, the resin material 51 covers the surroundings of the liquid-cooling pipes 31 (32) and forms an outer shape of the wiring board 20. Further, the resin material 51 is molded to cover the conductor plates 21 (22) while the electrode portions 21a (22a) of the conductor plates 21 (22) are exposed. The terminals (i.e., the gate terminals 15, the source terminals 16, and the drain terminals 17) of the power modules 10 can be connected to the exposed electrode portions 21a (22a). The resin material 51 is made of, e.g., an epoxy resin containing a filler (not shown) that serves to increase thermal conductivity. For example, alumina, silica, aluminum nitride, or silicon nitride is used as the filler serving to increase thermal conductivity. Accordingly, the resin material 51 has the function as an insulator for insulating the liquid-cooling pipes 31 and 32 and the capacitance member 41 from each other, and the function as a heat conductor for efficiently dissipating heat to the liquid-cooling pipes 31 and 32.

Thus, in this embodiment, the wiring board 20 includes the liquid-cooling pipes 31 (32), which are disposed near the conductor plates 21 (22) including the electrode portions 21a (21b) and the wiring portions 21b (22b) both connected to the semiconductor element 11 of the power module 10, and which allow the cooling liquid to be supplied therethrough. With such an arrangement, since the wiring board 20 is cooled with the liquid-cooling pipes 31 (32), heat generated from the semiconductor element 11 can be dissipated from the connection surface side between the semiconductor element 11 and the wiring board 20 (i.e., from the inner side of the power conversion device 100). The heat generated from the semiconductor element 11 is conducted in large part to the wiring board 20 through electrically coupled conductors (i.e., the gate terminal 15, the source terminal 16, and the drain terminal 17 of the semiconductor element 11 and the electrode portions 21a (21b) and the wiring portions 21b (22b) of the conductor plates 21 (22) in the wiring board 20). Therefore, the heat conducted from the semiconductor element 11 to the conductor plates 21 (22) can be effectively dissipated by arranging the liquid-cooling pipes 31 (32) near the conductor plates (22). Further, since the wiring board 20 is molded with the insulating resin material 51 that is filled between the conductor plates 21 (22) and the liquid-cooling pipes 31 (32), an insulation distance (spacing distance) between the conductor plates 21 (22) and the liquid-cooling pipes 31 (32) is shortened in comparison with the case where the conductor plates 21 (22) and the liquid-cooling pipes 31 (32) are simply spaced from each other. The conductor plates 21 (22) and the liquid-cooling pipes 31 (32) can be positioned closer to each other corresponding to the reduction of the insulation distance. As a result, heat conduction paths from the conductor plates 21 (22) to the liquid-cooling pipes 31 (32) can be shortened and the heat can be more effectively dissipated. As described above, the power conversion device 100 according to the first embodiment can effectively dissipate heat from the power conversion device 100.

In this embodiment, because of molding the insulating resin material 51 that contains the filler serving to increase thermal conductivity, the thermal conductivity of the head conduction paths formed by the insulating resin material 51 filled between the conductor plates 21 (22) and the liquid-cooling pipes 31 (32) can be increased with the filler. Therefore, the heat dissipation ability of the power conversion device 100 is further increased.

In this embodiment, the resin material 51 is molded to cover the conductor plates 21 (22) while the electrode portions 21a (22a) of the conductor plates 21 (22) are exposed such that the semiconductor element 11 can be connected to the exposed electrode portions 21a (22a). With such an arrangement, the conductor plates 21 (22) can be insulated from the surroundings with the presence of the insulating resin material 51. As a result, the distances between the adjacent wiring portions 21b (22b) of the conductor plates 21 (22), which are electrically connected to the electrodes (i.e., the gate terminals 15, the source terminals 16, and the drain terminals 17) of the semiconductor elements 11, can be reduced for closer arrangement, whereby the size of the power conversion device 100 can be reduced. In general, when trying to reduce the size of the power conversion device 100, it is difficult to increase the ability of dissipating the heat from the semiconductor element 11. According to this embodiment, however, since the liquid-cooling pipes 31 (32) are arranged within the wiring board 20, the heat can be effectively dissipated from the inner side of the power conversion device 100. It is hence possible to reduce the size of the power conversion device 100 and to effectively dissipate the heat generated in the power conversion device at the same time.

In this embodiment, the resin material 51 is molded to cover the surroundings of the liquid-cooling pipes 31 (32). If air exists around the liquid-cooling pipes 31 (32), heat dissipation efficiency with the liquid-cooling pipes 31 (32) inside the wiring board 20 is hard to increase with the presence of air having small thermal conductivity. In contrast, since the resin material 51 is molded to cover the surroundings of the liquid-cooling pipes 31 (32), heat inside the wiring board 20 can be more easily dissipated to the liquid-cooling pipes 31 (32) and the heat dissipation effect in the power conversion device 100 can be increased.

In this embodiment, the conductor plates 21 (22) are disposed to extend in the widthwise direction (direction S) of the wiring board 20 as viewed from above. Further, the liquid-cooling pipes 31 (32) are disposed to extend in the lengthwise direction (direction L) of the wiring board 20 in crossed relation to the conductor plates 21 (22) as viewed from above. With such an arrangement, the liquid-cooling pipes 31 (32) can be each used in common to the plural conductor plates 21 (22), and hence many conductor plates 21 (22) can be cooled by a less number of liquid-cooling pipes 31 (32).

In this embodiment, the capacitance member 41 includes the dielectric plate 42, the first conductor 43 arranged on the upper surface of the dielectric plate 42, and the second conductor 44 arranged on the lower surface of the dielectric plate 42, and the first conductor 43 and the second conductor 44 of the capacitance member 41 are connected respectively to the wiring portions 21b (22b) of the conductor plates 21 (22). As a result, noises in the conductor plates 21 (22) connected to the semiconductor elements 11 can be absorbed by the capacity (capacitance) of the capacitance member 41. Hence, the noises can be avoided from being transmitted to external circuits at positions near the semiconductor elements 11.

In this embodiment, the liquid-cooling pipes 31 are arranged between the first conductor 43 of the capacitance member 41 and the conductor plates 21 on the upper surface side of the wiring board 20. Further, the liquid-cooling pipes 32 are arranged between the second conductor 44 of the capacitance member 41 and the conductor plates 22 on the lower surface side of the wiring board 20. With such an arrangement, the semiconductor elements 11 (i.e., the power modules 10) can be connected to both the surfaces of the wiring board 20 on the upper side and the lower side, whereby the size of the power conversion device 100 can be reduced. Further, the liquid-cooling pipes 31 and the liquid-cooling pipes 32 can be disposed respectively on the upper surface side and the lower surface side corresponding to the semiconductor elements 11 that are heat generating sources. As a result, it is possible to reduce the overall size of the power conversion device 100 and to more effectively dissipate heat from the power conversion device 100 at the same time.

In this embodiment, the wiring portions 21b of the conductor plates 21 are connected to the first conductor 43 of the capacitance member 41. Further, the wiring portions 22b of the conductor plates 22 are connected to the second conductor 44 of the capacitance member 41. With such an arrangement, the capacitance member 41 can be disposed at a nearby position between the conductor plates 21 connected to the semiconductor elements 11 (i.e., the power modules 10a to 10c) on the upper surface side and the conductor plates 22 connected to the semiconductor elements 11 (i.e., the power modules 10d to 10f) on the lower surface side. Further, the wiring length (inductance) between each of the semiconductor elements 11 on the upper and lower surface sides and the capacitance member 41 can be reduced. As a result, a surge voltage caused by the inductance of the conductor plate 21 (22) between the semiconductor element 11 and the capacitance member 41 can be suppressed.

In this embodiment, the conductor plates 21 (22), the liquid-cooling pipes 31 (32), and the capacitance member 41 can be integrated with one another by molding the insulating resin material 51 while ensuring desired insulation between adjacent ones of the conductor plates 21 (22), the liquid-cooling pipes 31 (32), and the capacitance member 41 with the insulating resin material 51. Therefore, the distances between adjacent conductors inside the wiring board 20 and the distances between the conductor plates 21 (22) and the liquid-cooling pipes 31 (32) can be easily reduced such that the conductor plates 21 (22), the liquid-cooling pipes 31 (32), and the capacitance member 41 are arranged in closer relation. As a result, the wiring board 20 can be easily obtained which can reduce the size of the power conversion device 100 and which can effectively dissipate heat from the power conversion device 100.

In this embodiment, since the conductor plates 21 (22) are each made of a metal plate in the form of a flat plate (bus bar), thermal conductivity of the conductor plates 21 (22) can be increased in comparison with the case using copper foils to form wiring lines. Accordingly, the heat dissipation to the liquid-cooling pipes 31 (32) disposed near the conductor plates 21 (22) can be more effectively performed.

In this embodiment, since the semiconductor element 11 is formed by using a semiconductor made of SiC, the semiconductor element 11 can be operated at a higher speed than that in the case using a semiconductor made of Si to form the semiconductor element 11.

Second Embodiment

A second embodiment will be described below. Unlike the first embodiment in which the conductor plates 21 and 22 in the wiring board 20 are each made of a metal plate (see FIG.

10) in the form of a flat plate (bus bar), a conductor plate 121 (122) formed by bundling a plurality of conductor lines 123 into a plate-like shape is used in the second embodiment. The structure of a wiring board is the same as that in the first embodiment, and hence the description thereof is omitted. The conductor plates 121 and 122 are respectively one example of the "first conductor plate" and one example of the "second conductor plate", which terms are used in the appended claims.

Figure 11:
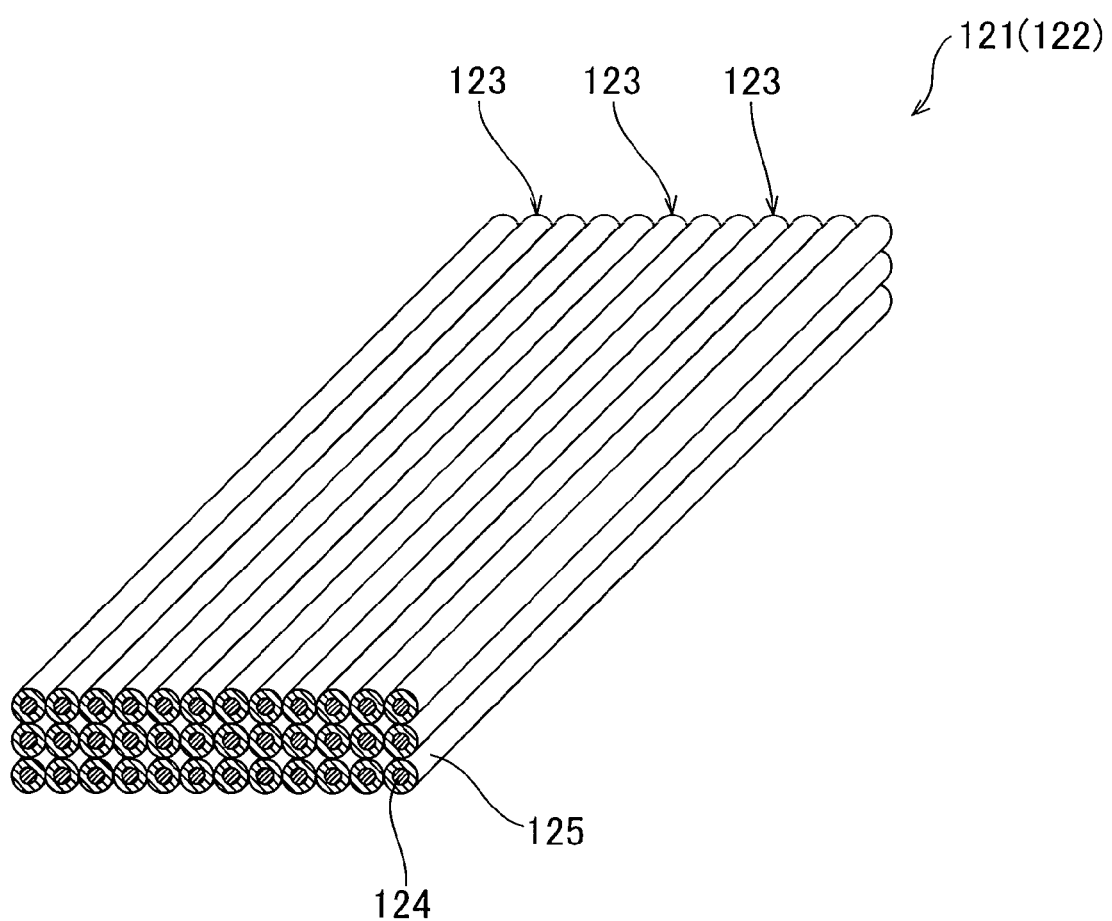
FIG. 11 is a perspective view to explain a conductor plate used in the wiring board, the view representing a second embodiment.

In the wiring board according to the second embodiment, as illustrated in FIG. 11, the conductor plate 121 (122) is disposed instead of the conductor plate 21 (22) in the wiring board 20 according to the first embodiment. The conductor plate 121 (122) is formed by bundling a plurality of conductor lines 123 into a plate-like shape. Each conductor line 123 has a structure that a conductor portion 124 is covered with an insulator 125. Because a high-frequency current having a rectangular waveform in accordance with the switching frequency of a semiconductor element flows through the wiring line (conductor plate) in the wiring board, there is a problem that the wiring line generates heat due to, e.g., the skin effect. In the second embodiment, a surface area of the wiring line (conductor plate 121 (122)) per unit cross-sectional area can be increased by using, as the wiring line, the conductor plate 121 (122) that is formed by bundling the plural conductor lines 123 into a plate-like shape.

In this embodiment, since the conductor plate 121 (122) is formed by bundling the plural conductor lines 123 into a plate-like shape, the surface area of the conductor plate 121 (122) can be increased. As a result, a loss caused by the skin effect can be reduced and heat generation can be suppressed.

Third Embodiment

A third embodiment will be described below. Unlike the conductor plate 21 (22) in the wiring board 20 according to the first embodiment and the conductor plate 121 (122) in the second embodiment, a conductor plate 131 (132) in the third embodiment has a cooling structure formed by cooling holes 137. The conductor plates 131 and 132 are respectively one example of the "first conductor plate" and one example of the "second conductor plate", which terms are used in the appended claims.

Figure 12:
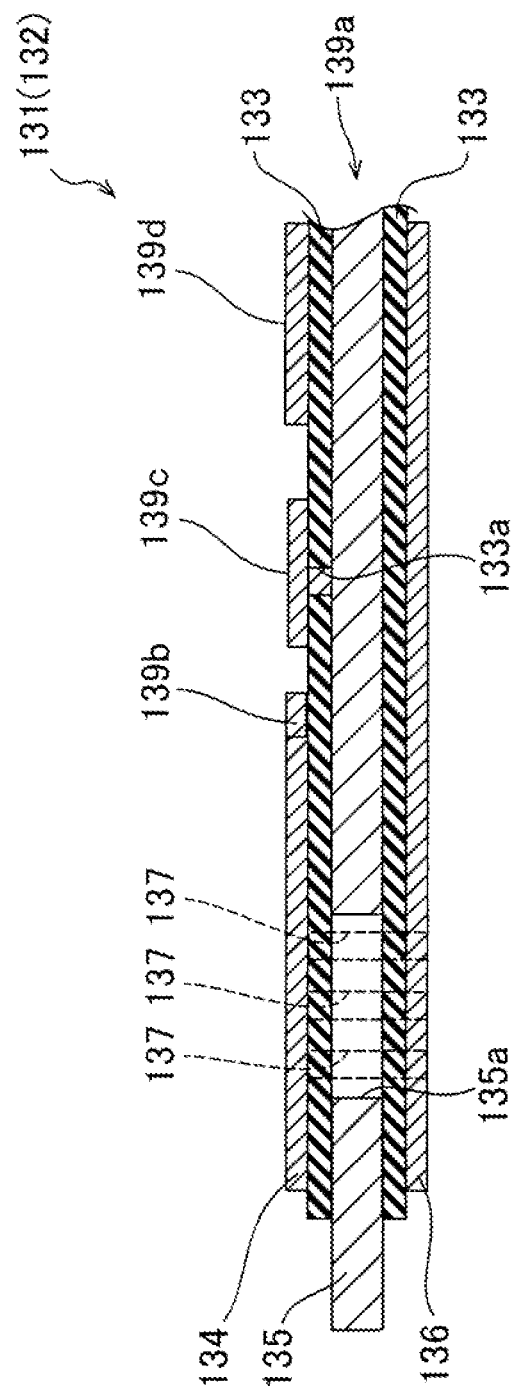
FIG. 12 is a sectional view illustrating a conductor plate used in the wiring board, the view representing a third embodiment.

As illustrated in FIG. 12, the third embodiment includes the conductor plate 131 (132) having the cooling structure formed by the cooling holes 137. The conductor plate 131 (132) includes a wiring portion 139a that is made up of insulating layers 133, a conductor wiring 134 in a first layer, a conductor wiring 135 in a second layer, and a conductor wiring 136 in a third layer, and three electrode portions 139b, 139c and 139d.

In the wiring portion 139a, the conductor wiring 135 in the second layer is arranged on the surface of the conductor wiring 136 in the third layer with the insulating layer 133 interposed therebetween. The conductor wiring 134 in the first layer is arranged on the surface of the conductor wiring 135 in the second layer with the insulating layer 133 interposed therebetween. The cooling holes 137 are formed to extend from an upper surface of the insulating layer 133 on which the conductor wiring 134 in the first layer is formed, and to penetrate through the conductor wiring 135 in the second layer and the conductor wiring 136 in the third layer. The cooling holes 137 are each entirely filled with, e.g., copper, silver or nickel. The cooling hole 137 and the filled copper (or silver, nickel, etc.) form a thermal via. The cooling hole 137 is one example of a "cooling structure", which term is used in this specification.

Figure 13:
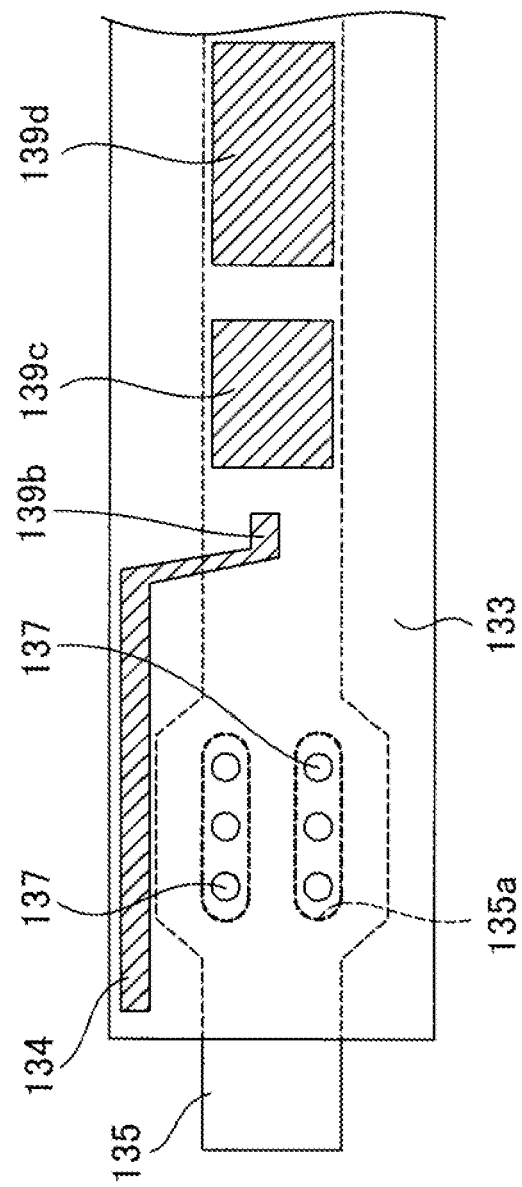
FIG. 13 is a plan view of a first layer of the conductor plate in FIG. 12.
Figure 14:
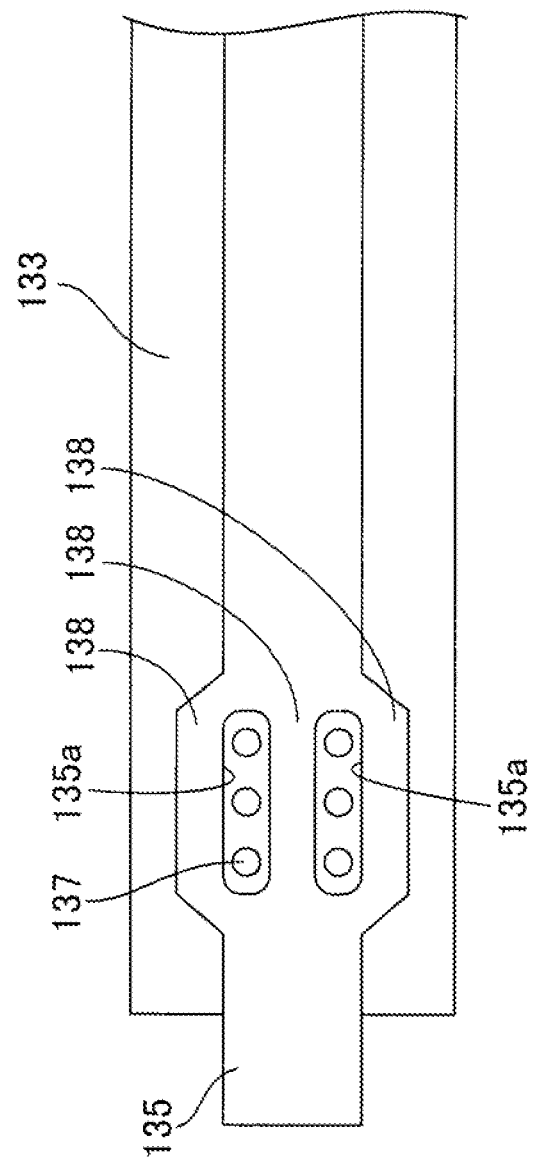
FIG. 14 is a plan view of a second layer of the conductor plate in FIG. 12.

As illustrated in FIGS. 13 and 14, the cooling holes 137 are each formed in a circular shape. Three cooling holes 137 constitute one set and one set of cooling holes 137 is arranged two rows. The conductor wiring 134 in the first layer is connected to the electrode portion 139b while bypassing one set of cooling holes 137. As illustrated in FIG. 14, the conductor wiring 135 in the second layer includes three branched wiring portions 138 that are evenly branched as viewed from above. An opening 135a is formed between adjacent two of the branched wiring portions 138. The opening 135a is filled with an insulator for insulating the cooling holes 137, which are filled with, e.g., copper, from the branched wiring portions 138. By arranging one set of cooling holes 137 between the branched wiring portions 138 in such a way, the conductor wiring 135 in the second layer is electrically insulated from copper, silver or nickel filling the cooling holes 137. The electrode portion 139c is electrically connected to the conductor wiring 135 in the second layer through a via 133a that is formed in the insulating layer 133 between the conductor wiring 134 in the first layer and the conductor wiring 135 in the second layer. Further, the electrode portion 139d is connected to a wiring (not shown) that differs from the conductor wiring 134 in the first layer.

Thus, the electrode portion 139b connected to the conductor wiring 134 in the first layer, the electrode portion 139c connected to the conductor wiring 135 in the second layer, and the electrode portion 139d are electrically insulated from one another. Further, those three electrode portions are electrically insulated from copper, silver or nickel filling the cooling holes 137. In other words, the conductor plate 131 (132) includes the three electrode portions 139b, 139c and 139d corresponding to three terminals (i.e., the gate terminal 15, the source terminal 16, and the drain terminal 17) of the power module 10 according to the first embodiment, for example. The conductor wiring 136 in the third layer is connected to the cooling holes 137 and functions as a heat radiator. With such an arrangement, in this embodiment, the cooling holes 137 are formed near the wiring portion 139a in the state that the cooling holes 137 are electrically insulated from the electrode portions 139b to 139d.

In this embodiment, since the conductor plate 131 (132) includes the cooling structure formed by the cooling holes 137, heat generated by a large current flowing through the wiring portion 139a of the conductor plate 131 (132) can be dissipated through the cooling holes 137.

In this embodiment, since the cooling holes 137 are formed near the wiring portion 139a of the conductor plate 131 (132), the heat generated by the large current flowing through the wiring portion 139a of the conductor plate 131 (132) can be dissipated through the cooling holes 137.

Fourth Embodiment

A fourth embodiment will be described below. The fourth embodiment includes an air-cooling cooler 144 for the cooling holes 137 in the third embodiment described above.

Figure 15:
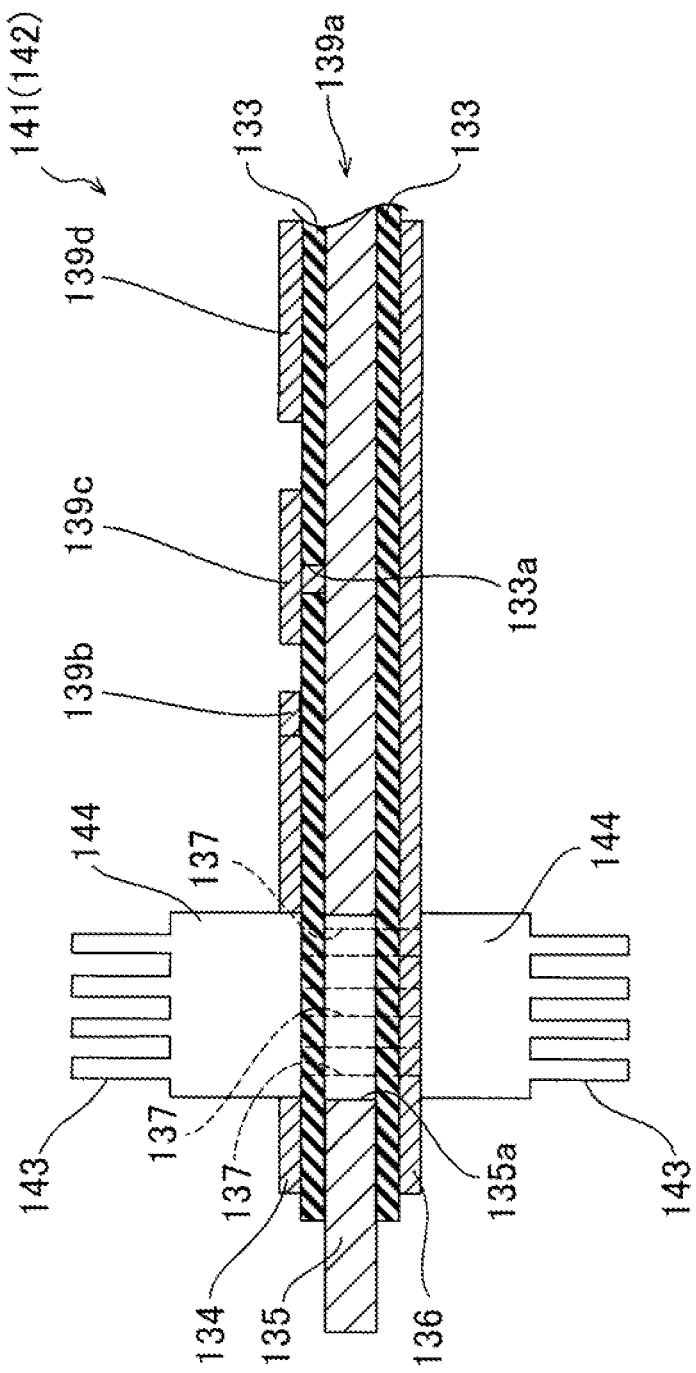
FIG. 15 is a sectional view illustrating a conductor plate used in the wiring board, the view representing a fourth embodiment.

As illustrated in FIG. 15, the air-cooling cooler 144 including a plurality of fins 143 is disposed at each of the upper side and the lower side of the cooling holes 137 in a conductor plate 141 (142) according to the fourth embodiment. The air-cooling cooler 144 is one example of a "cooler", which term is used in this specification. The conductor plates 141 and 142 are respectively one example of the "first conductor plate" and one example of the "second conductor plate", which terms are used in the appended claims. The other construction of the fourth embodiment is similar to that of the third embodiment described above.

Thus, in the fourth embodiment, the cooling structure including the air-cooling cooler 144 connected to the cooling holes 137 is provided. Therefore, heat generated by a large current flowing through the wiring portion 139a of the conductor plate 141 (142) can be dissipated to air by the air-cooling cooler 144 through the cooling holes 137, and the extent of heat dissipation can be increased.

Fifth Embodiment

A fifth embodiment will be described below. The fifth embodiment includes a liquid-cooling cooler 153 for the cooling holes 137 in the fourth embodiment described above.

Figure 16:
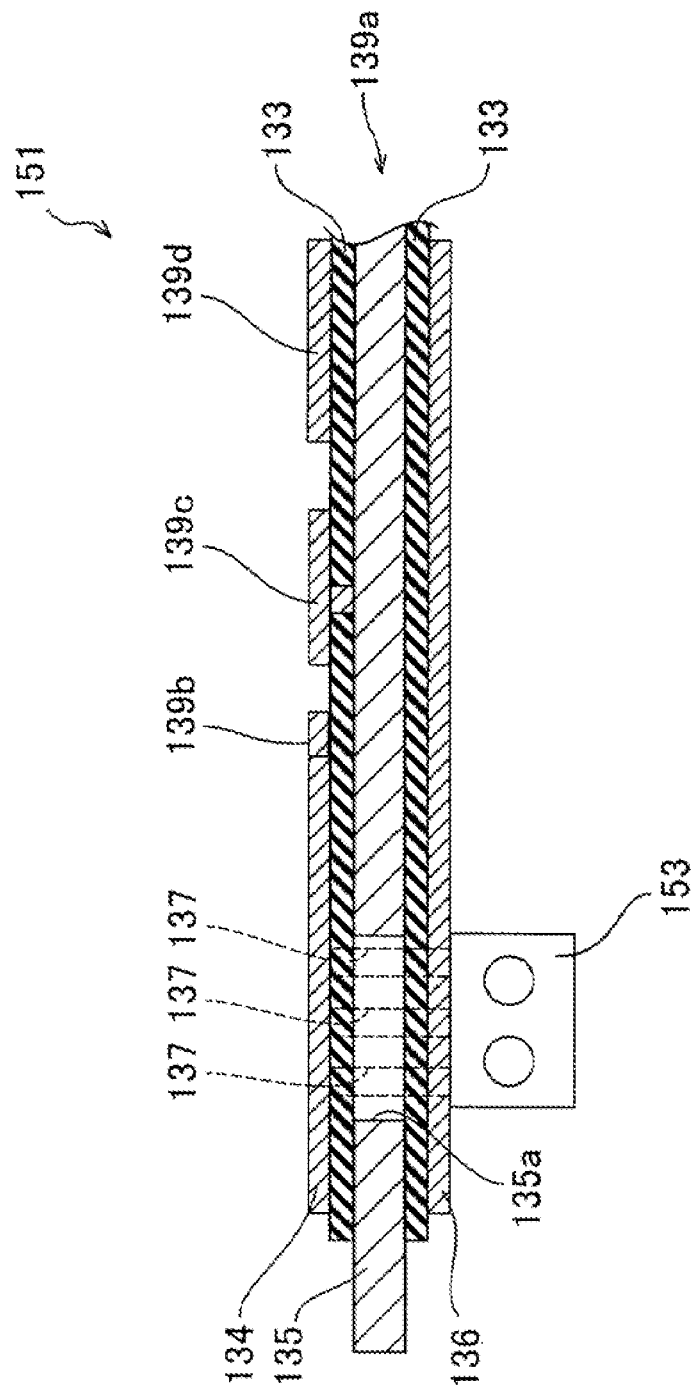
FIG. 16 is a sectional view illustrating a conductor plate used in the wiring board, the view representing a fifth embodiment.

As illustrated in FIG. 16, the liquid-cooling cooler 153 is disposed on the lower side of the cooling holes 137 in a conductor plate 151 (152) according to the fifth embodiment. The liquid-cooling cooler 153 is one example of the "cooler", which term is used in this specification. The conductor plates 151 and 152 are respectively one example of the "first conductor plate" and one example of the "second conductor plate", which terms are used in the appended claims. The other construction of the fifth embodiment is similar to that of the third embodiment described above.

Thus, in the fifth embodiment, the liquid-cooling cooler 153 connected to the cooling holes 137 is provided. Therefore, heat generated by a large current flowing through the wiring portion 139a of the conductor plate 151 (152) can be cooled and dissipated by the liquid-cooling cooler 153 through the cooling holes 137, and the extent of heat dissipation can be increased.

In the third to fifth embodiments described above, the conductor wiring 135 in the second layer includes three branched wiring portions 138 that are evenly branched. Further, the cooling holes 137 are arranged in two rows near the three branched wiring portions 138 in a state bypassing the branched wiring portions 138. With such an arrangement, the heat can be dispersed with branching of the conductor wiring 135 without increasing the electrical resistance of the conductor wiring 135. As a result, the conductor wiring 135 can be effectively cooled through the cooling holes 137. Moreover, since the heat can be dispersed, sufficient cooling can be obtained even when a cooling ability per unit area of the air-cooling cooler 144 or the liquid-cooling cooler 153 is reduced, and hence the size of the air-cooling cooler 144 or the liquid-cooling cooler 153 can be reduced.

Sixth Embodiment

A sixth embodiment will be described below. Unlike the first embodiment (see FIG. 10) in which the conductor plate 21 (22) made of a metal plate in the form of a flat plate (bus bar) is disposed inside the wiring board 20, a conductor plate 161 (162) formed by using a fine wiring member 167 is disposed in the sixth embodiment. The conductor plates 161 and 162 are respectively one example of the "first conductor plate" and one example of the "second conductor plate", which terms are used in the appended claims.

Figure 17:
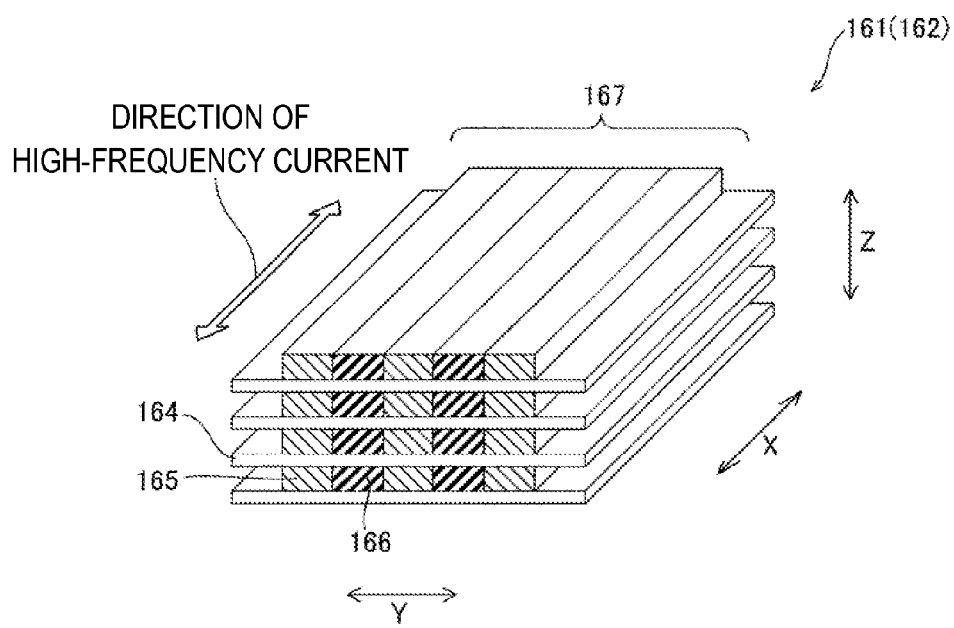
FIG. 17 is a perspective view illustrating a conductor plate used in the wiring board, the view representing a sixth embodiment.
Figure 18:
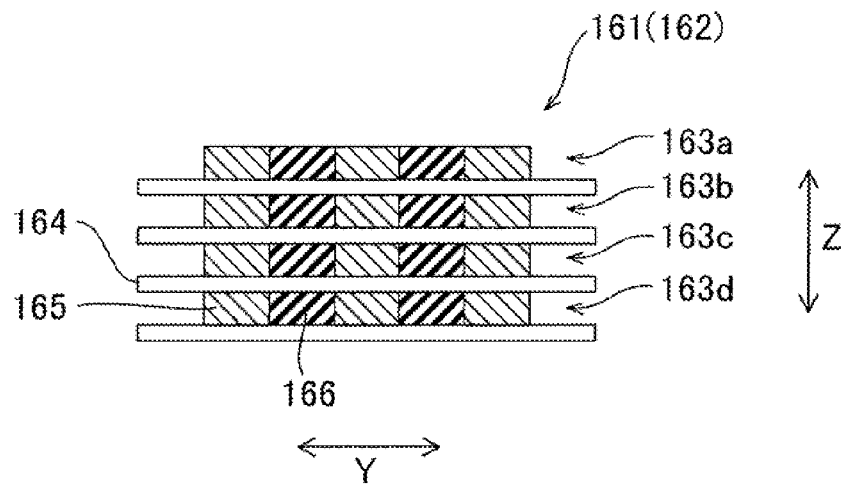
FIG. 18 is a sectional view of the conductor plate in FIG. 17.

As illustrated in FIGS. 17 and 18, the conductor plate 161 (162) in the wiring board according to the sixth embodiment is made up of a first layer 163a, a second layer 163b, a third layer 163c, and a fourth layer 163d, i.e., four layers in total. Each layer includes an insulating substrate 164, which is used as a printed board and which is made of a glass epoxy resin, and a fine wiring conductor 165 disposed on the surface of the insulating substrate 164. The fine wiring conductor 165 is disposed plural (three in FIG. 17) in the same plane (i.e., on one insulating substrate 164). The fine wiring conductor 165 is made of, e.g., copper and has a width (thickness) of, e.g., about 100 μm or more to about 200 μm or less. On the other hand, the conductor plate 21 (22) (see FIG. 10) in the form of a flat plate (bus bar) has a width (thickness) of several millimeters to several centimeters. The width (thickness) of the fine wiring conductor 165 is optionally set depending on a depth from the conductor surface at which a high-frequency current can flow, the depth being calculated on the basis of the frequency of the flowing high-frequency current and the material of the wiring conductor 165. Also, the number of wiring conductors 165 in one layer and the number of layers of the conductor plate 161 (162) are optionally set depending on the electric capacitance. The two wiring conductors 165 stacked with the insulating substrate 164 interposed therebetween are respectively one example of a "first wiring conductor" and one example of a "second wiring conductor", which terms are used in the appended claims.

The wiring conductor 165 is formed to extend in the direction (X-direction) of the high-frequency current. The wiring conductor 165 is disposed plural at a predetermined interval between adjacent two. An insulating layer 166 made of, e.g., a resin for insulating the wiring conductors 165 from each other is disposed between the wiring conductors 165. In other words, the wiring conductor 165 and the insulating layer 166 are alternately arranged in the Y-direction. The wiring conductors 165 (insulating layers 166) in plural layers are arranged in a line in the Z-direction (up-and-down direction). The wiring conductors 165 are interconnected by through holes or vias (not shown) to be held at the same electrical potential. Thus, the fine wiring member 167 is constituted by the wiring conductors 165 and the insulating layers 166.

Steps of manufacturing the conductor plate 161 (162) will be described below with reference to FIGS. 17 and 18.

After bonding a copper foil onto the surface of the insulating substrate 164, the plurality of fine wiring conductors 165 are formed by, e.g., etching. Then, the insulating layers 166 are formed by injecting, e.g., a resin to between the wiring conductors 165. The first layer 163a is thereby formed. Then, the second layer 163b is formed on the first layer 163a. Further, the third layer 163c and subsequent layers are successively formed by repeating similar steps to those described above. As a result, the conductor plate 161 (162) is completed.

Thus, in this embodiment, the conductor plate 161 (162) is formed by using the fine wiring member 167 that is made up of the fine wiring conductors 165 extending in the flowing direction of the high-frequency current. Since one conductor plate 161 (162) is formed by stacking the fine wiring members 167, a surface area of the wiring through which the high-frequency current flows is increased in comparison with the case where the conductor plate 161 (162) is formed by one conductor having a relatively large cross-sectional area. Accordingly, heat can be avoided from concentrating at the surface of the conductor plate 161 (162). Further, since the surface area of the wiring through which the high-frequency current flows is increased, the width (thickness) of the wiring can be reduced and hence the size of the conductor plate 161 (162) can be reduced corresponding to an increase of the surface area.

In this embodiment, each fine wiring member 167 is made up of the plural fine wiring conductors 165 and the conductor plate 161 (162) is formed by stacking plural fine wiring members 167 with the insulating substrate 164 interposed therebetween. Therefore, the number of fine wiring members 167 is increased unlike the case where the fine wiring member 167 made up of the wiring conductors 165 is formed in one layer.

Accordingly, resistance to a current flowing through the conductor plate 161 (162) is reduced and heat generation can be suppressed.

Seventh Embodiment

A seventh embodiment will be described below. Unlike the above-described sixth embodiment in which the wiring conductors 165 are arranged in a line in the Z-direction (up-and-down direction), the wiring conductors 165 and the insulating layers 166 are alternately arranged in the Z-direction (up-and-down direction) in the seventh embodiment.

Figure 19:
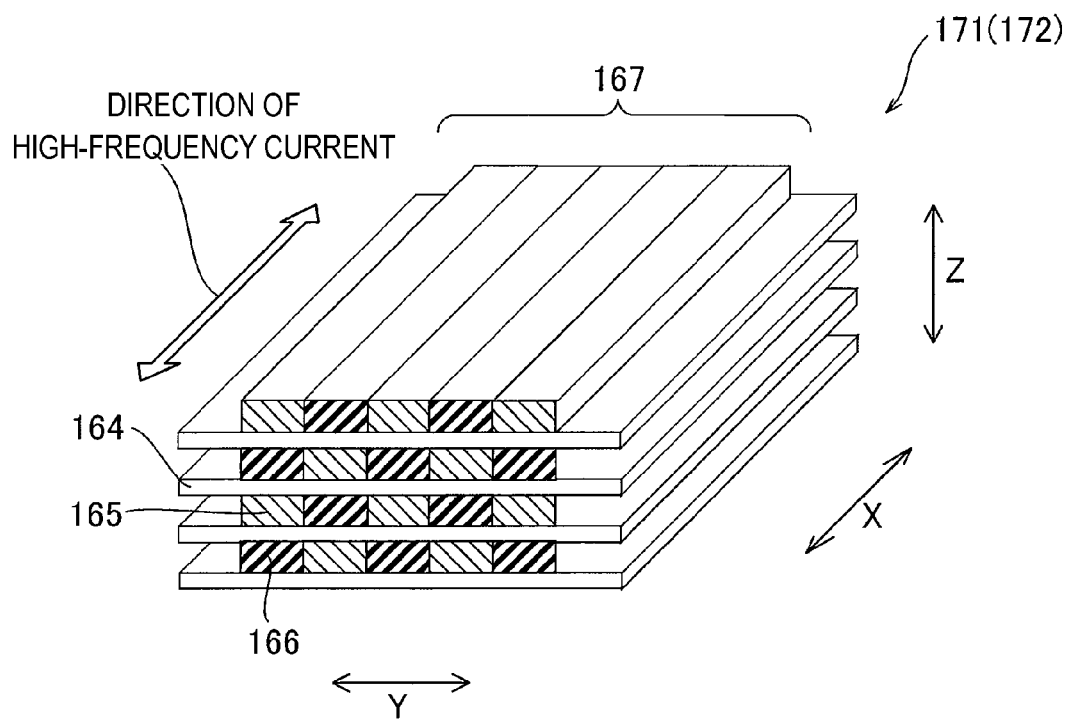
FIG. 19 is a perspective view illustrating a conductor plate used in the wiring board, the view representing a seventh embodiment.
Figure 20:
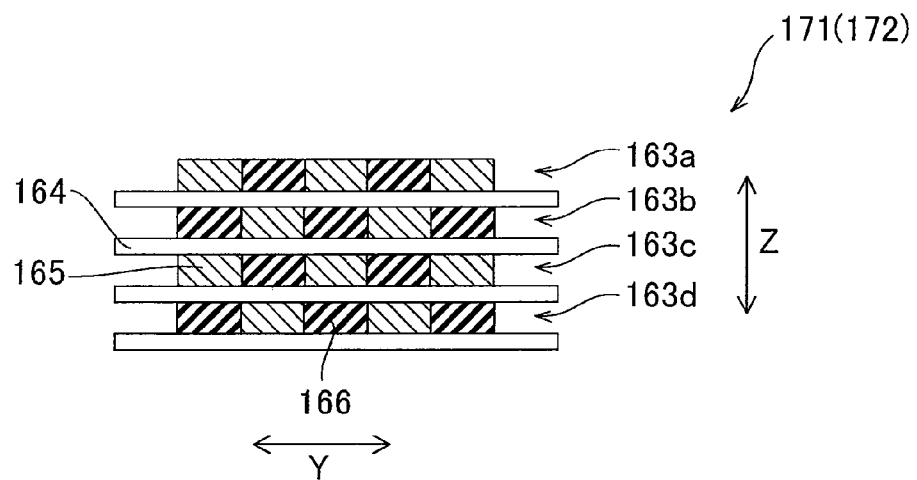
FIG. 20 is a sectional view of the conductor plate in FIG. 19.

In a conductor plate 171 (172) according to the seventh embodiment, as illustrated in FIGS. 19 and 20, the wiring conductors 165 and the insulating layers 166 are alternately arranged in the Z-direction. The conductor plates 171 and 172 are respectively one example of the "first conductor plate" and one example of the "second conductor plate", which terms are used in the appended claims. The order in which the wiring conductors 165 and the insulating layers 166 are arranged in the Z-direction differs between an even row and an odd row. When looking at the wiring conductors 165 and the insulating layers 166 from the X-direction, therefore, the wiring conductors 165 and the insulating layers 166 are arranged in a zigzag pattern. The other construction of the seventh embodiment is similar to that in the sixth embodiment described above.

Eighth Embodiment

An eighth embodiment will be described below. Unlike the above-described sixth embodiment in which the insulating layer 166 is disposed between the wiring conductors 165, a cooling pipe 184 is disposed between the wiring conductors 165 in the eighth embodiment.

Figure 21:
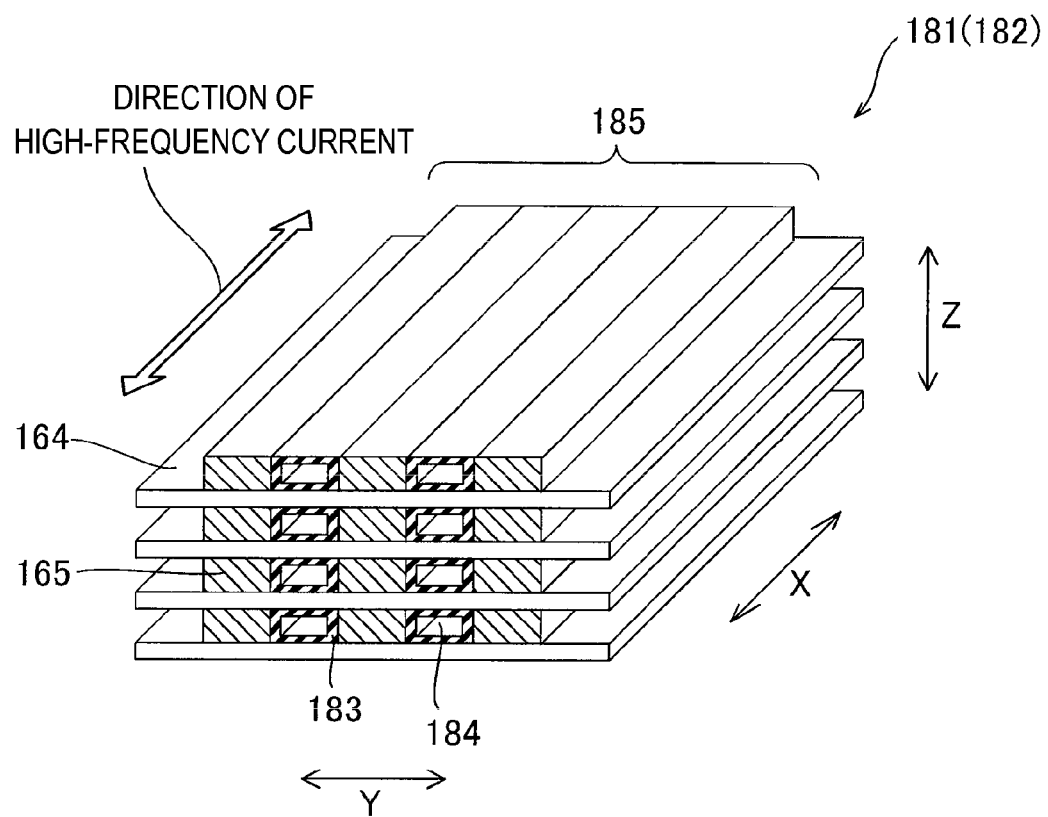
FIG. 21 is a perspective view illustrating a conductor plate used in the wiring board, the view representing an eighth embodiment.
Figure 22:
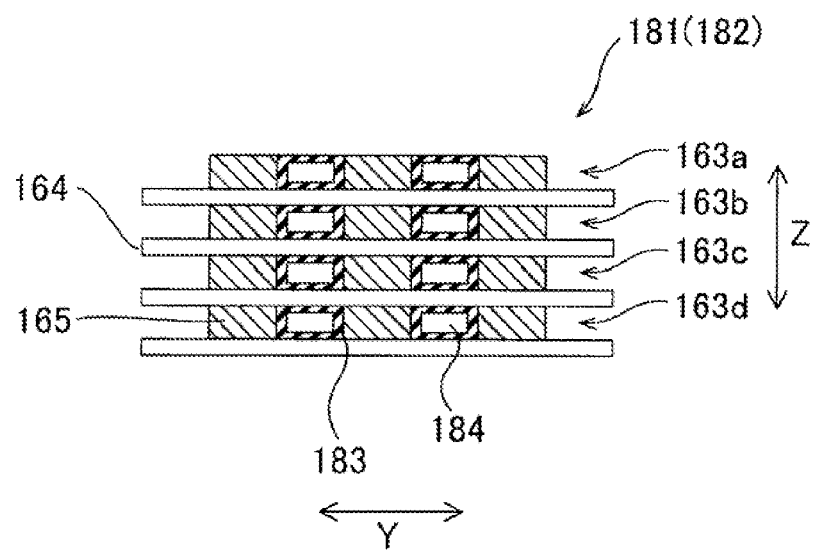
FIG. 22 is a sectional view of the conductor plate in FIG. 21.

In a conductor plate 181 (182) according to the eighth embodiment, as illustrated in FIGS. 21 and 22, the cooling pipe 184 having an outer surface covered with a molded resin 183 is arranged between the wiring conductors 165. The conductor plates 181 and 182 are respectively one example of the "first conductor plate" and one example of the "second conductor plate", which terms are used in the appended claims. The wiring conductors 165 (or the cooling pipes 184) are arranged in stacked relation when viewed in the Z-direction (up-and-down direction). The wiring conductors 165, the resins 183, and the cooling pipes 184 constitute a fine wiring member 185. The other construction of the eighth embodiment is similar to that in the sixth embodiment described above.

Steps of manufacturing the conductor plate 181 (182) will be described below with reference to FIGS. 21 and 22.

After bonding a copper foil onto the surface of the insulating substrate 164, the plurality of fine wiring conductors 165 are formed by, e.g., etching. Then, the cooling pipe 184 previously formed by molding the resin 183 is bonded to the surface of the insulating substrate 164 between the wiring conductors 165. A first layer 163*a* is thereby formed. Then, a second layer 163*b* is formed on the first layer 163*a*. Further, a third layer 163*c* and subsequent layers are successively formed by repeating similar steps to those described above. As a result, the conductor plate 181 (182) is completed.

Thus, in this embodiment, the conductor plate 181 (182) includes the cooling pipe 184 disposed between adjacent two of the wiring conductors 165. In the conductor plate 181 (182), because the wiring conductors 165 are stacked one above another, heat may be locally generated due to thermal interference between the second layer 163*b* and the third layer 163*c*, which are inner layers. One conceivable solution for avoiding such thermal interference is to increase the spacing between the wiring conductors 165. However, if the spacing between the wiring conductors 165 is increased, the size of the conductor plate 181 (182) is increased. By arranging the cooling pipe 184 between the wiring conductors 165 adjacent to each other, it is possible to positively cool the conductor plate 181 (182) and to suppress heat concentration. Further, the conductor plate 181 (182) can be avoided from increasing in its size.

Ninth Embodiment

A ninth embodiment will be described below. Unlike the above-described eighth embodiment in which the wiring conductors 165 (or the cooling pipes 184) are arranged in overlying relation when viewed in the Z-direction (up-and-down direction), the wiring conductors 165 and the cooling pipe 184 are alternately arranged in the Z-direction (up-and-down direction) in the ninth embodiment.

Figure 23:
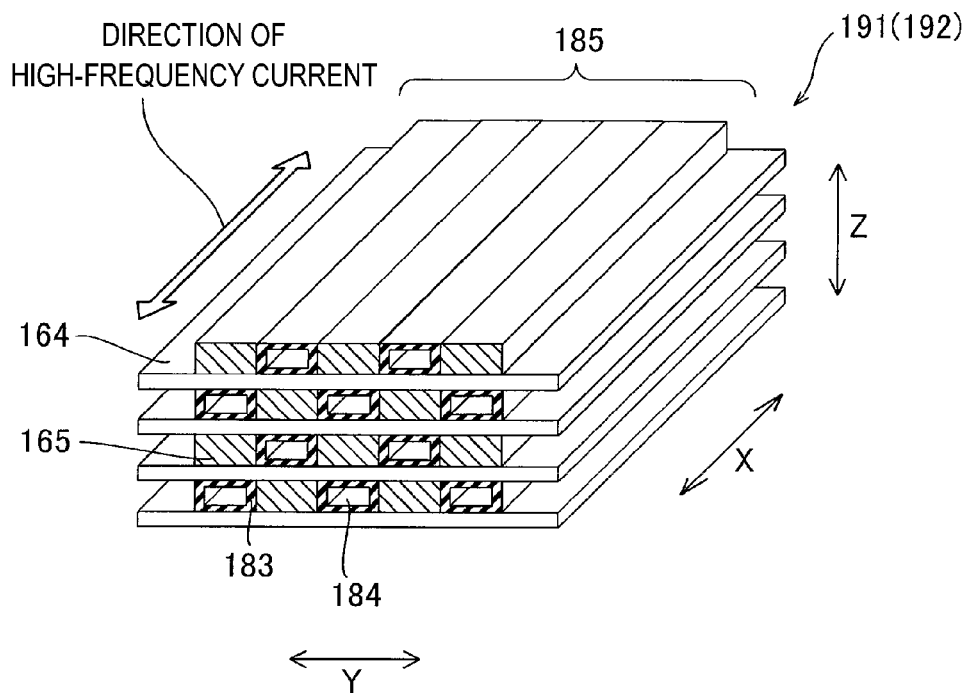
FIG. 23 is a perspective view illustrating a conductor plate used in the wiring board, the view representing a ninth embodiment.
Figure 24:
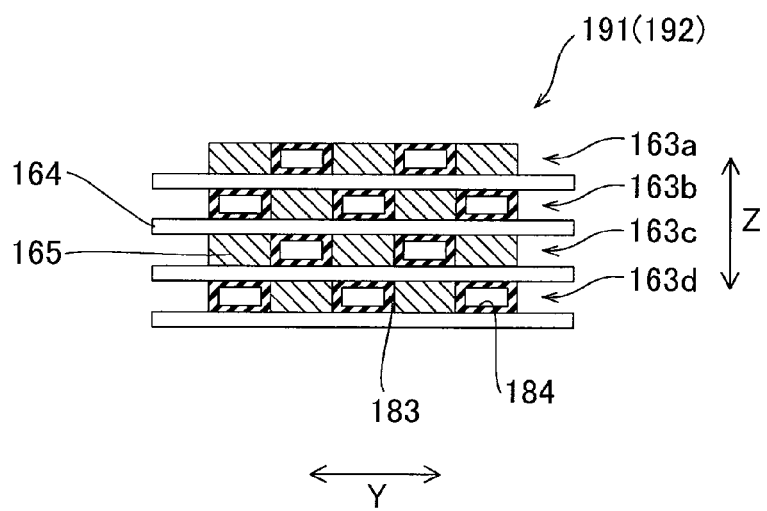
FIG. 24 is a sectional view of the conductor plate in FIG. 23.

In a conductor plate 191 (192) according to the ninth embodiment, as illustrated in FIGS. 23 and 24, the wiring conductors 165 and the cooling pipe 184 are alternately arranged in the Z-direction (up-and-down direction). The conductor plates 191 and 192 are respectively one example of the "first conductor plate" and one example of the "second conductor plate", which terms are used in the appended claims. The order in which the wiring conductors 165 and the cooling pipes 184 are arranged in the Z-direction differs between an even row and an odd row. When looking at the wiring conductors 165 and the cooling pipes 184 from the X-direction, therefore, the wiring conductors 165 and the cooling pipes 184 are arranged in a zigzag pattern. The other construction of the ninth embodiment is similar to that in the eighth embodiment described above.

Tenth Embodiment

A tenth embodiment will be described below. Unlike the above-described seventh embodiment in which the wiring conductors 165 are formed to extend in the X-direction, wiring conductors 203*a* and 203*b* are each formed in a net-like pattern in the tenth embodiment.

Figure 25:
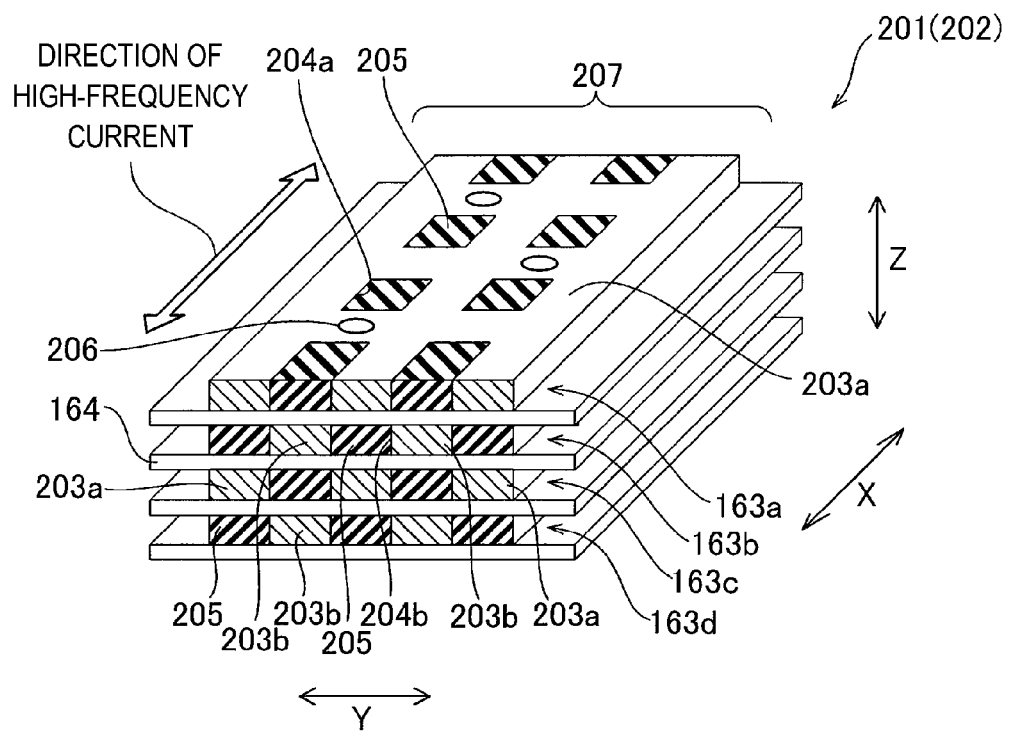
FIG. 25 is a perspective view illustrating a conductor plate used in the wiring board, the view representing a tenth embodiment.
Figure 26:
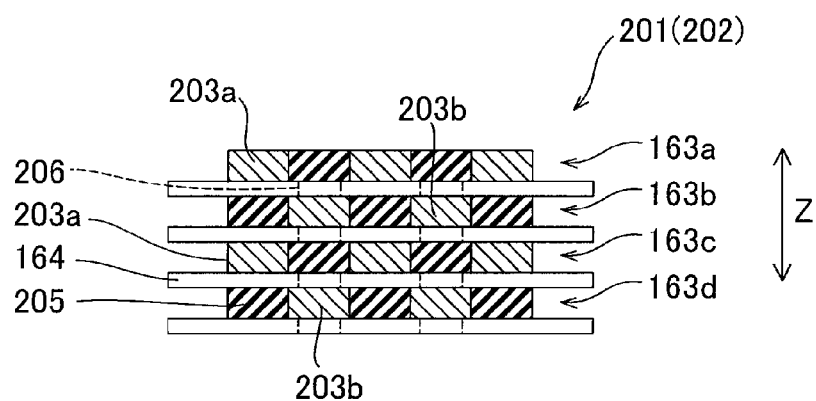
FIG. 26 is a sectional view of the conductor plate in FIG. 25.

In a conductor plate 201 (202) according to the tenth embodiment, as illustrated in FIG. 25, the wiring conductors 203*a* and 203*b* are each formed in a net-like pattern. The conductor plates 201 and 202 are respectively one example of the "first conductor plate" and one example of the "second conductor plate", which terms are used in the appended claims. An insulator 205 made of, e.g., ceramic, silicon nitride, or alumina and having a large dielectric constant is filled in mesh portions 204*a* of the wiring conductor 203*a* and mesh portions 204*b* of the wiring conductor 203*b*. Also, as illustrated in FIG. 26, the wiring conductors 203*a* having substantially the same meshes are disposed in a first layer 163*a* and a third layer 163*c*. The wiring conductor 203*b* having meshes shifted by a half pitch in the Y-direction from the positions of the meshes in the first layer 163*a* and the third layer 163*c* is formed in each of a second layer 163*b* and a fourth layer 163*d*. The wiring conductors 203*a* and 203*b* are stacked with an insulating substrate 164 interposed therebetween. Further, the first layer 163*a* and the third layer 163*c* are arranged in a state shifted by a half pitch in the Y-direction with respect to the second layer 163*b* and the fourth layer 163*d*. The wiring conductors 203*a* and 203*b* are electrically connected to each other by vias 206 penetrating through the insulating substrate 164. With such an arrangement, potentials of the net-like four-layer wiring conductors 203a and 203b disposed in the first layer 163a, the second layer 163b, the third layer 163c, and the fourth layer 163d are held substantially equal to one another. A fine wiring member 207 is constituted by the wiring conductors 203a and 203b and the insulators 205. The wiring conductors 203a and 203b are respectively one example of the "first wiring conductor" and one example of the "second wiring conductor", which terms are used in the appended claims. The via 206 is one example of an "interconnection wiring portion", which term is used in the appended claims.

Thus, in this embodiment, the four-layer wiring conductors 203a and 203b stacked with the insulating substrate 164 interposed between adjacent two thereof are electrically connected to each other by the vias 206 penetrating through the insulating substrates 164. Therefore, impedances of the four-layer wiring conductors 203a and 203b are substantially equal to one another. It is hence possible to keep the impedances of the wiring conductors 203a and 203b from being locally increased, and to avoid an increase in the extent of heat generation.

Eleventh Embodiment

An eleventh embodiment will be described below. Unlike the above-described tenth embodiment in which the wiring conductors 203a and 203b having substantially the same meshes are formed in the individual layers, wiring conductors 213a and 213b having meshes of different size from that of the wiring conductors 203a and 203b are formed in parts of layers in the eleventh embodiment.

Figure 27:
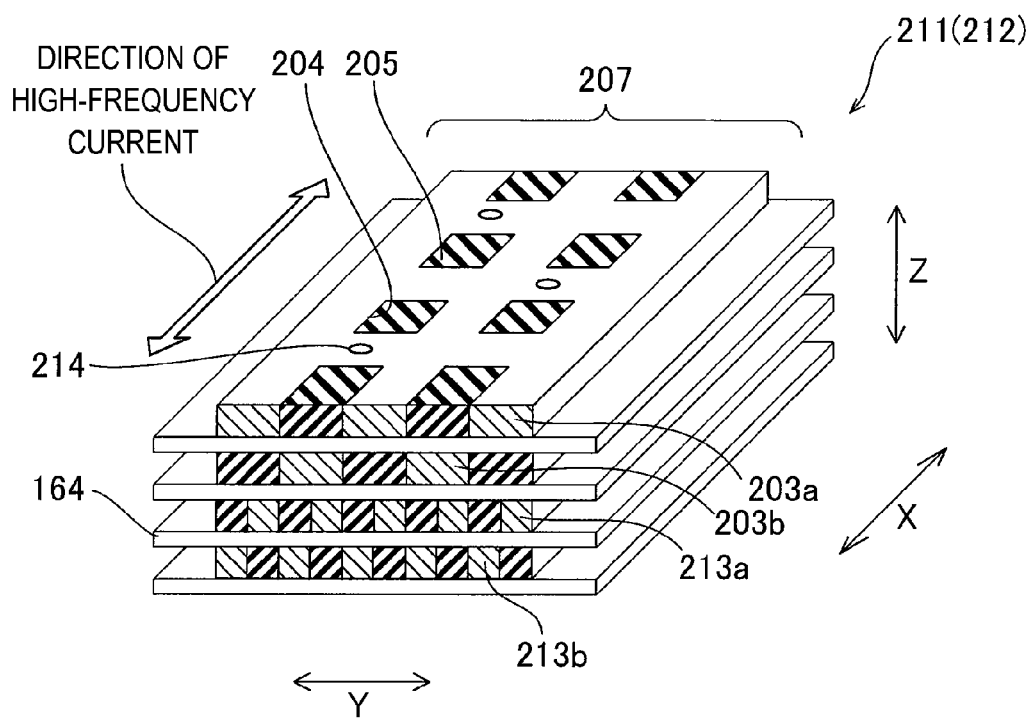
FIG. 27 is a perspective view illustrating a conductor plate used in the wiring board, the view representing an eleventh embodiment.
Figure 28:
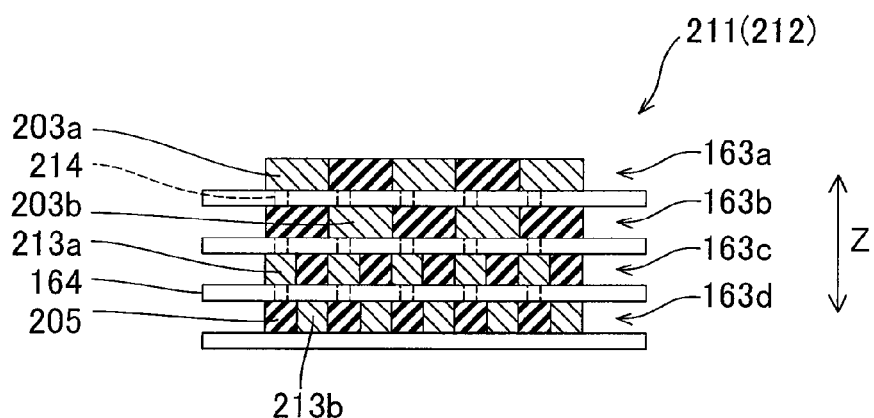
FIG. 28 is a sectional view of the conductor plate in FIG. 27.

In a conductor plate 211 (212) according to the eleventh embodiment, as illustrated in FIGS. 27 and 28, the wiring conductors 203a and 203b disposed in the first layer 163a and the second layer 163b are each formed in a net-like pattern. The conductor plates 211 and 212 are respectively one example of the "first conductor plate" and one example of the "second conductor plate", which terms are used in the appended claims. The wiring conductors 213a and 213b each formed in a net-like pattern are disposed respectively in the third layer 163c and the fourth layer 163d. Meshes of the wiring conductors 213a and 213b disposed in the third layer 163c and the fourth layer 163d are formed in a size that is a half the mesh size of the wiring conductors 203a and 203b disposed in the first layer 163a and the second layer 163b. The wiring conductor 203a in the first layer 163a and the wiring conductor 203b in the second layer 163b are arranged such that their mesh positions are shifted by a half pitch in the Y-direction. Similarly, the wiring conductor 213a in the third layer 163c and the wiring conductor 213b in the fourth layer 163d are arranged such that their mesh positions are shifted by a half pitch in the Y-direction. The wiring conductors 203a, 203b, 213a and 213b are stacked with the insulating substrate 164 interposed between adjacent two thereof. Further, the first layer 163a is arranged in a state shifted by a half pitch in the Y-direction with respect to the second layer 163b. The third layer 163c is arranged in a state shifted by a half pitch in the Y-direction with respect to the fourth layer 163d. The wiring conductors 203a, 203b, 213a and 213b are connected to each other by vias 214 penetrating through the insulating substrates 164. With such an arrangement, potentials of the wiring conductors 203a, 203b, 213a and 213b are held substantially equal to one another. The wiring conductors 213a and 213b are respectively one example of the "first wiring conductor" and one example of the "second wiring conductor", which terms are used in the appended claims. The via 214 is one example of an "interconnection wiring portion", which term is used in the appended claims.

Twelfth Embodiment

A twelfth embodiment will be described below. Unlike the above-described first embodiment in which the conductor plate 21 (22) made of an electroconductive metal plate in the form of a flat plate (bus bar) is used in the wiring board 20, a conductor plate 221 (222) made of a conductor 223 including upper-surface grooves 225 is used in the wiring board 20 in the twelfth embodiment. The conductor plates 221 and 222 are respectively one example of the "first conductor plate" and one example of the "second conductor plate", which terms are used in the appended claims. Also, the conductor 223 is one example of a "wiring conductor", which term is used in the appended claims.

Figure 29:
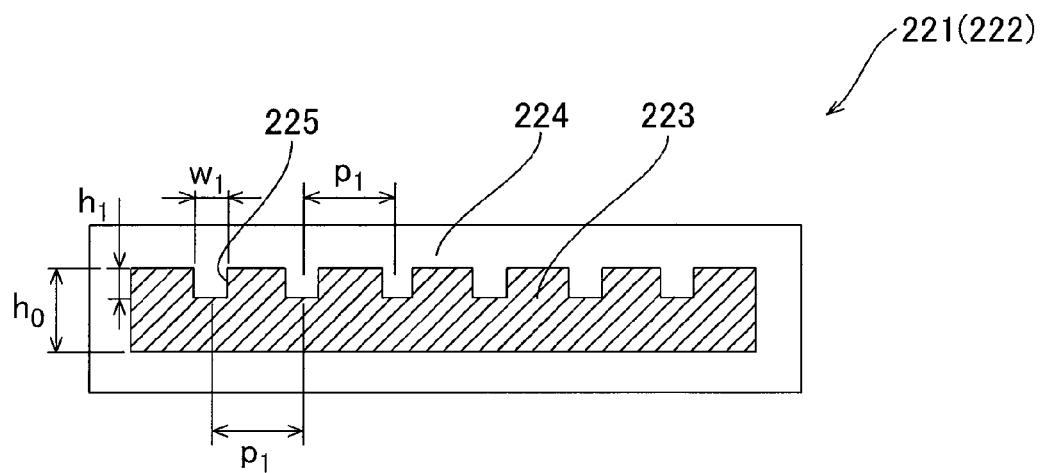
FIG. 29 is a sectional view illustrating a conductor plate used in the wiring board, the view representing a twelfth embodiment.

As illustrated in FIG. 29, the conductor plate 221 (222) according to the twelfth embodiment is constituted by the conductor 223 extending in the flowing direction of the high-frequency current, and an insulator 224. A plurality of upper-surface grooves 225 extending in the flowing direction of the high-frequency current are formed in an upper surface of the conductor 223. The conductor 223 has a thickness $h_0$. Each of the upper-surface grooves 225 has a depth $h_1$ and a width $w_1$. The pitch between the upper-surface grooves 225 is $p_1$.

The surroundings of the conductor 223 having a concave-convex shape formed by the plural upper-surface grooves 225 are covered with the insulator 224. The thickness $h_0$ of the conductor 223 is about 600 μm, and the conductor 223 is grooved such that when the driving frequency of the current is 100 kHz, the upper-surface grooves 225 have the depth $h_1$ of $h_0/3$, the width $w_1$ of $h_0/3$, and the pitch $p_1$ of $h_0$. Thus, the conductor 223 has, in its outer surface, the concave-convex shape extending in the flowing direction of the high-frequency current. The conductor 223 may be grooved by using an etching solution or by mechanical cutting. Because the plural upper-surface grooves 225 have substantially the same depth $h_1$, the cross-section of the conductor 223 can be entirely utilized as a current conduction effective region even when the driving frequency of the current is relatively high, i.e., 100 kHz. When the driving frequency is 100 kHz and the thickness $h_0$ of the conductor 223 is 600 μm, the cross-sectional area of the current conduction effective region is increased about 30% in comparison with the case where the conductor has a flat shape without concaves and convexes (i.e., the upper-surface grooves 225). Accordingly, conduction resistance is reduced.

Thus, in this embodiment, the conductor plate 221 (222) includes the conductor 223 having, in its outer surface, the concave-convex shape extending in the flowing direction of the high-frequency current. With such a structure, the surface area of the conductor 223 becomes larger than the case where the outer surface of the conductor 223 is flat, and a region where the high-frequency current tending to flow near the outer surface of the conductor 223 actually flows can be increased. As a result, resistance against the high-frequency current flowing through the conductor 223 can be reduced.

In this embodiment, the conductor plate 221 (222) further includes the insulator 224 formed in surrounding relation to the conductor 223 having the concave-convex shape. Therefore, current leakage from the conductor 223 can be easily suppressed by the insulator 224.

Thirteenth Embodiment

A thirteenth embodiment will be described below. Unlike the above-described twelfth embodiment in which the upper-surface grooves 225 are formed only in the upper surface of the conductor 223, lower-surface grooves 236 are further formed in a lower surface of a conductor 233 in the thirteenth embodiment. The conductor 233 is one example of the "wiring conductor", which term is used in the appended claims.

Figure 30:
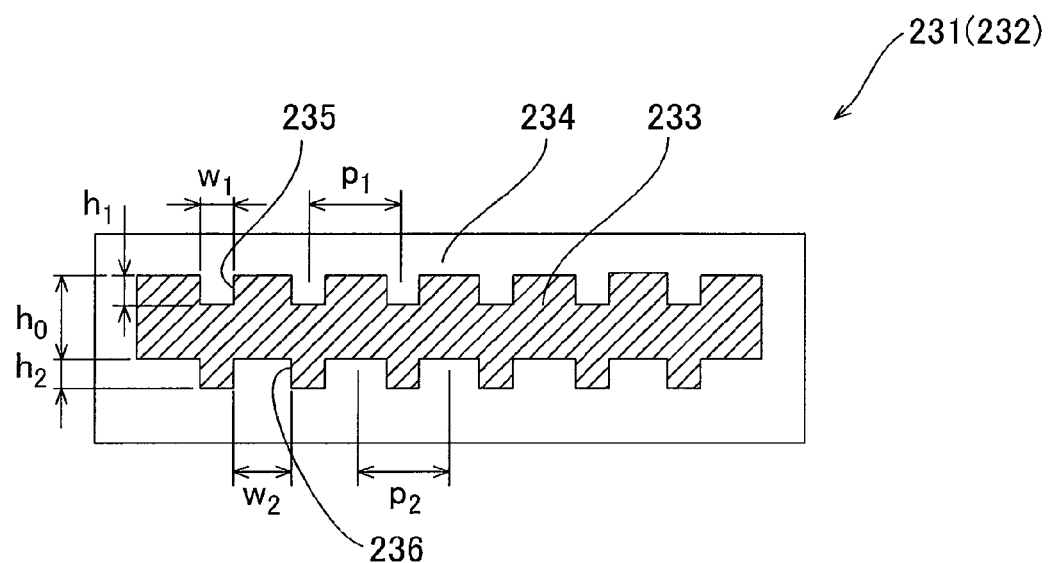
FIG. 30 is a sectional view illustrating a conductor plate used in the wiring board, the view representing a thirteenth embodiment.

As illustrated in FIG. 30, a conductor plate 231 (232) according to the thirteenth embodiment is constituted by the conductor 233 extending in the flowing direction of the high-frequency current, and an insulator 234. The conductor plates 231 and 232 are respectively one example of the "first conductor plate" and one example of the "second conductor plate", which terms are used in the appended claims. A plurality of upper-surface grooves 235 extending in the flowing direction of the high-frequency current are formed in an upper surface of the conductor 233. Further, a plurality of lower-surface grooves 236 are formed in a lower surface of the conductor 233. The conductor 233 has a thickness $h_0$. Each of the upper-surface grooves 235 has a depth $h_1$ and a width $w_1$. The pitch between the upper-surface grooves 235 is $p_1$. Each of the lower-surface grooves 236 has a depth $h_2$ and a width $w_2$. The pitch between the lower-surface grooves 236 is $p_2$.

The surroundings of the conductor 233 are covered with the insulator 234. The thickness $h_0$ of the conductor 233 is 600 µm, and the conductor 233 is grooved such that when the driving frequency of the current is 100 kHz, the upper-surface grooves 235 have the depth $h_1$ of $h_0/3$, the width $w_1$ of $h_0/3$, and the pitch $p_1$ of $h_0$. Further, the conductor 233 is grooved such that the lower-surface grooves 236 have the depth $h_2$ of $h_0/3$, the width $w_2$ of $2h_0/3$, and the pitch $p_1$ of $h_0/2$. Thus, the conductor 233 has, in each outer surface, the concave-convex shape extending in the flowing direction of the high-frequency current. The conductor 233 may be grooved by using an etching solution or by mechanical cutting. The plural upper-surface grooves 235 have substantially the same depth $h_1$, and the plural lower-surface grooves 236 have substantially the same depth $h_2$. Therefore, even when the driving frequency of the current is relatively high, i.e., 100 kHz, the cross-section of the conductor 233 can be entirely utilized as a current conduction effective region. When the driving frequency is 100 kHz and the thickness $h_0$ of the conductor 233 is 600 µm, the cross-sectional area of the current conduction effective region is increased about 60% in comparison with the case where the conductor has a flat shape without concaves and convexes (i.e., the upper-surface grooves 235 and the lower-surface grooves 236). Accordingly, conduction resistance is reduced.

Fourteenth Embodiment

A fourteenth embodiment will be described below. In this embodiment, a terminal 253 of the power module 10 (see FIG. 1) and the electrode portion 21a (22a) of the conductor plate 21 (22) in the wiring board 20 (see FIG. 1) are bonded to each other by a granular bond 251. The terminal 253 is, for example, one of the gate terminal 15, the source terminal 16, and the drain terminal 17 in the first embodiment.

Figure 31:
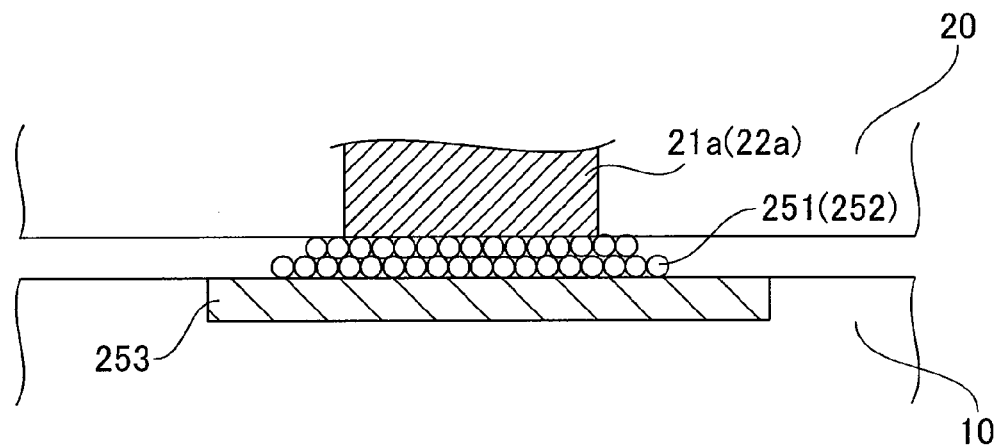
FIG. 31 is a sectional view of a bond, the view representing a fourteenth embodiment.

As illustrated in FIG. 31, the electrode portion 21a (22a) of the conductor plate 21 (22) in the wiring board 20 is bonded to the terminal 253 of the power module 10 with the granular bond 251 interposed therebetween. The granular bond 251 contains small metal particles 252 (e.g., silver particles, gold particles, copper particles, or aluminum particles) having small electrical resistance. A nickel coating, a tin coating or the like may be formed on the surfaces of the metal particles 252. In such a way, the electrode portions 21a (22a) of the wiring board 20 (i.e., the conductor plates 21 and 22) are connected to the semiconductor element 11 in the power module 10 through the terminals 253. The granular bond 251 is one example of a "bond", which term is used in this specification. The metal particles 252 are one example of a "granular metal", which term is used in this specification.

Figure 32:
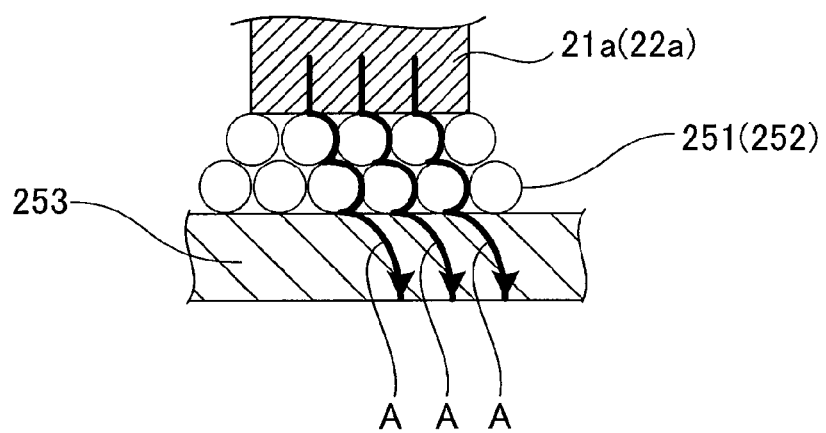
FIG. 32 is a sectional view to explain currents flowing through the bond, the view representing the fourteenth embodiment.

Paths A through which a current flows during a high-frequency electrifying operation will be described below with reference to FIG. 32.

When a current with a frequency of 100 kHz or higher is supplied from the electrode portion 21a (22a) of the wiring board 20 to the power module 10 (i.e., the terminal 253), the current preferentially passes the surfaces of the metal particles 252 contained in the granular bond 251 due to the skin effect. Because the plural metal particles 252 are positioned adjacent to one another in the granular bond 251, the current flows from the electrode portion 21a (22a) to the wiring board 20 while passing the surfaces of the individual metal particles 252.

Thus, in this embodiment, the electrode portion 21a (22a) of the conductor plate 21 (22) is connected to the terminal 253 (i.e., the semiconductor element 11) of the power module 10 while the granular bond 251 containing the metal particles 252 is interposed therebetween. Since the high-frequency current flows near the surfaces of the metal particles 252, the paths through which the high-frequency current flows can be increased by employing the granular bond 251 that contains the plural metal particles 252. It is hence possible to flow a large current through the granular bond 251. Further, the current carrying capacity of the granular bond 251 can be regulated by adjusting the diameter of the metal particles 252 that are contained in the granular bond 251.

Fifteenth Embodiment

A fifteenth embodiment will be described below. In this embodiment, metal particles 261 are contained in a bonding layer 262.

Figure 33:
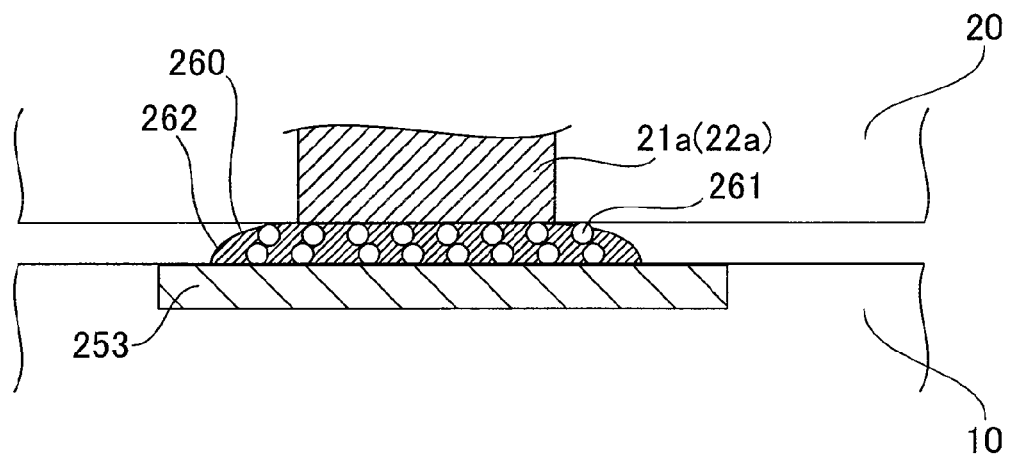
FIG. 33 is a sectional view of a bond, the view representing a fifteenth embodiment.

As illustrated in FIG. 33, the electrode portion 21a (22a) of the conductor plate 21 (22) in the wiring board 20 is bonded to the terminal 253 of the power module 10 with a bond 260 interposed therebetween. The bond 260 includes metal particles 261 having small electrical resistance and dispersed in the bond 260, and an electroconductive bonding layer 262. The metal particles 262 are formed as, e.g., silver particles, gold particles, copper particles, or aluminum particles. A nickel coating, a tin coating or the like may be formed on the surfaces of the metal particles 261. The bonding layer 262 may be a two-dimensional or three-dimensional solder containing, as a principal component, a tin-based solder, a lead-based solder, or tin and lead, or it may be an Au—Si-based brazing alloy that is bondable at high temperature. Further, the bond 260 may be dissolved at high temperature and bonded in a state under application of a magnetic field such that the metal particles 261 are arranged adjacent to each other along a flux line of the magnetic field. The bond 260 is one example of a "bond", which term is used in this specification, and the metal particles 261 are one example of a "granular metal", which term is used in this specification.

Figure 34:
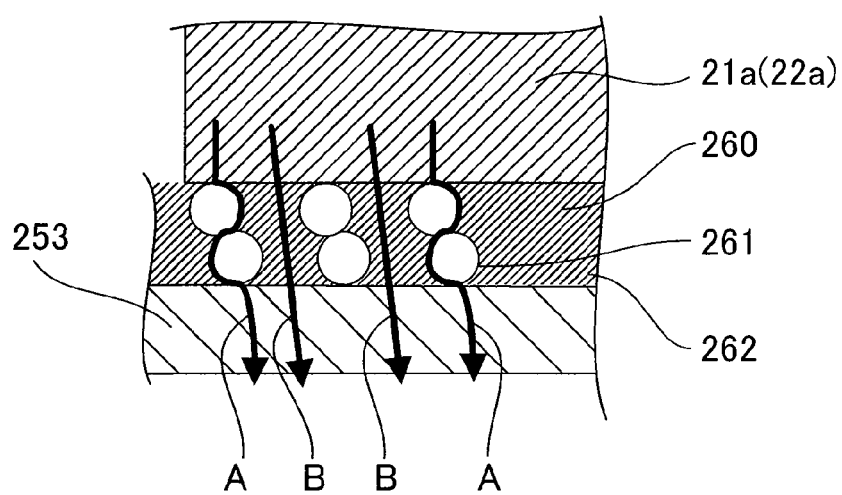
FIG. 34 is a sectional view to explain currents flowing through the bond, the view representing the fifteenth embodiment.

Paths A through which a current flows during a high-frequency electrifying operation and paths B through which a current flows during a low-frequency electrifying operation will be described below with reference to FIG. 34.

When a current with a frequency of 100 kHz or higher is supplied from the electrode portion 21a (22a) of the wiring board 20 to the power module 10 (i.e., the terminal 253) through the bond 260 (i.e., during the high-frequency electrifying operation), the skin effect occurs. Therefore, the current preferentially passes the surfaces of the metal particles 261 contained in the bond 260 (i.e., along the paths A). On the other hand, when a current with a frequency of lower than 100 kHz is supplied from the electrode portion 21a (22a) of the conductor plate 21 (22) in the wiring board 20 to the power module 10 (i.e., the terminal 253) through the bond 260 (i.e., during the low-frequency electrifying operation), the influence of the skin effect is small. Therefore, the current flows through the bonding layer 262 of the bond 260 (i.e., along the paths B) without passing the surfaces of the metal particles 261. Accordingly, the paths having relatively small electrical resistance can be ensured in both of the high-frequency electrifying operation and the low-frequency electrifying operation.

Thus, in this embodiment, the bond 260 includes the electroconductive bonding layer 262 in which the metal particles 261 are dispersed. Therefore, the current flows through the metal particles 261 during the high-frequency electrifying operation. On the other hand, the current flows through the bonding layer 262 during the low-frequency electrifying operation. It is hence possible to flow the current in both the high-frequency electrifying operation and the low-frequency electrifying operation. Further, the current carrying capacity for the high-frequency current and the current carrying capacity for the low-frequency current can be regulated by adjusting a mixture ratio of the metal particles 261 to the electroconductive bonding layer 262 or the diameter of the metal particles 261.

Sixteenth Embodiment

A sixteenth embodiment will be described below. Unlike the above-described first embodiment in which the power module 10 includes one semiconductor element 11, two semiconductor elements 311 and 312 are disposed on the surface of an insulation circuit board 313 in the sixteenth embodiment. The semiconductor elements 311 and 312 are each one example of the "power conversion semiconductor element", which term is used in the appended claims.

Figure 35:
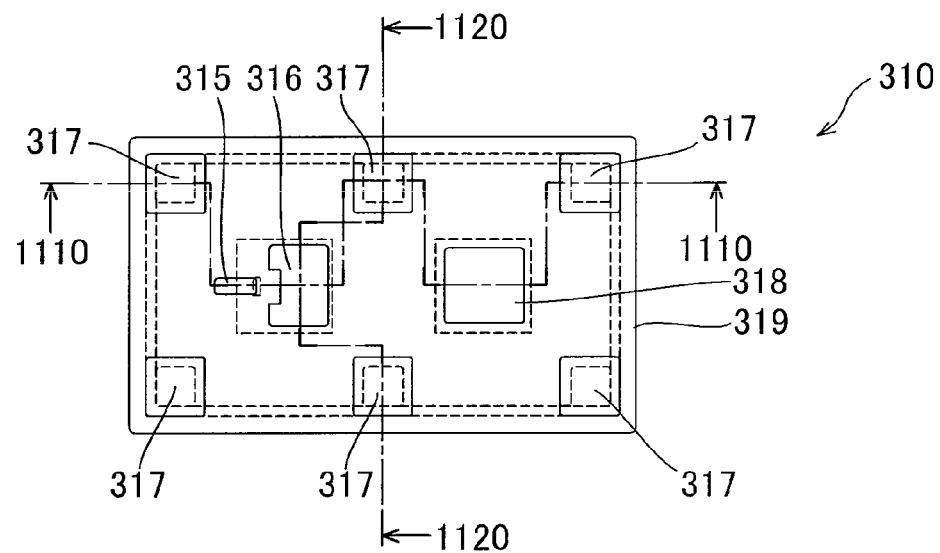
FIG. 35 is a plan view of a power module, the view representing a sixteenth embodiment.
Figure 36:
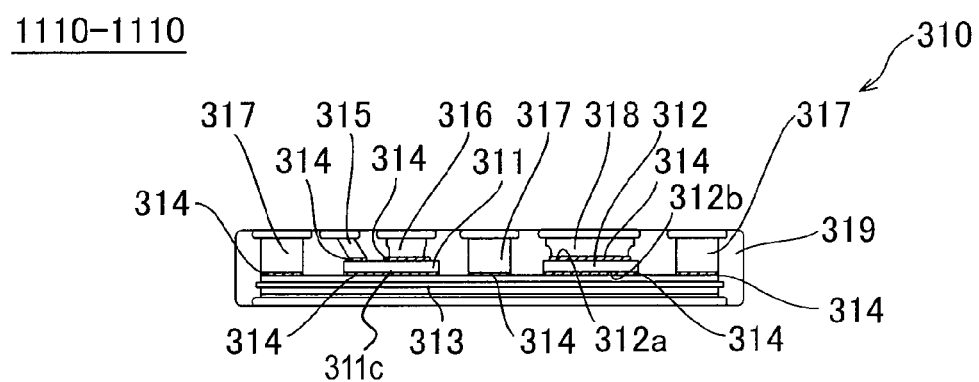
FIG. 36 is a sectional view taken along a line XXXVI-XXXVI in FIG. 35.
Figure 37:
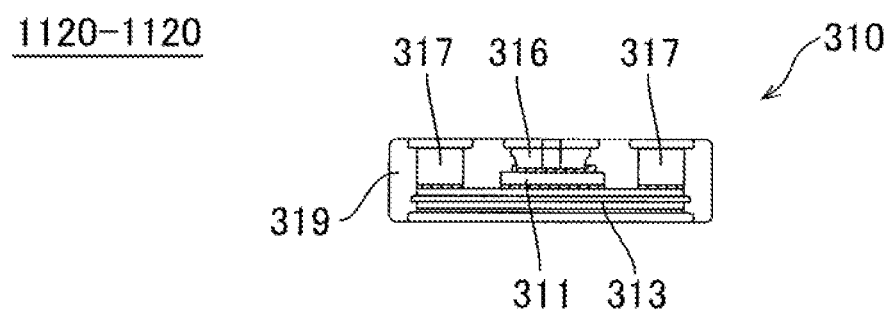
FIG. 37 is a sectional view taken along a line XXXVII-XXXVII in FIG. 35.
Figure 38:
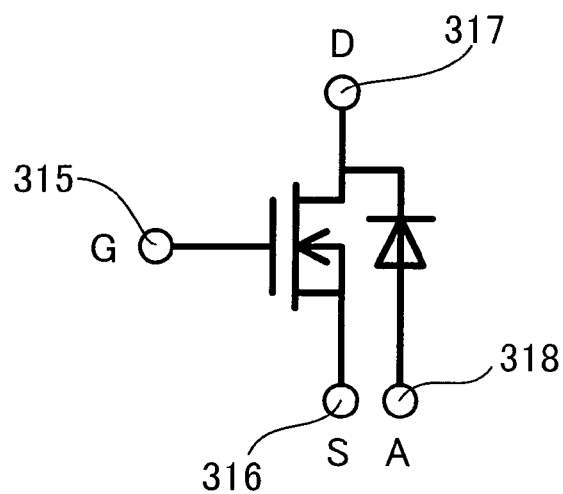
FIG. 38 is a circuit diagram of a power module, the diagram representing the sixteenth embodiment.

In a power module 310 according to the sixteenth embodiment, as illustrated in FIGS. 35 to 37, the semiconductor elements 311 and 312 are disposed on the surface of the insulation circuit board 313 with bonds 314 interposed therebetween. Similarly to the semiconductor element 11 in the first embodiment, the semiconductor element 311 is formed of a FET (Field-Effect Transistor) capable of performing a high-frequency switching operation. The semiconductor element 312 is formed of a first recovery diode (FRD) having an anode electrode 312a and a cathode electrode 312b. An anode terminal 318 is bonded onto the anode electrode 312a of the semiconductor element 312. The cathode electrode 312b of the semiconductor element 312 is electrically connected to a drain electrode 311c of the semiconductor element 311 such that the semiconductor element 312 functions as a free wheel diode (see FIG. 38). The anode terminal 318 is one example of an "electrode conductor", which term is used in this specification.

The gate terminal 315, the source terminal 316, the drain terminal 317, and the anode terminal 318 are each in a pillar shape and are formed to extend toward the top of the power module 10. An upper end surface 315a (see FIG. 41) of the gate terminal 315, an upper end surface 316a (see FIG. 41) of the source terminal 316, an upper end surface 317a (see FIG. 41) of the drain terminal 317, and an upper end surface 318a (see FIG. 41) of the anode terminal 318 are each substantially flat and substantially in a rectangular shape as viewed from above. The upper end surface 315a of the gate terminal 315, the upper end surface 316a of the source terminal 316, the upper end surface 317a of the drain terminal 317, and the upper end surface 318a of the anode terminal 318 have substantially the same height. The gate terminal 315, the source terminal 316, and the drain terminal 317 are each one example of the "electrode conductor", which term is used in this specification.

A resin material 319 made of silicon gel, for example, is molded so as to surround and cover respective lateral surfaces of the semiconductor element 311, the semiconductor element 312, the insulation circuit board 313, the gate terminal 315, the source terminal 316, the drain terminal 317, and the anode terminal 318. Thus, the resin material 319 defines outer contour surfaces of the power module 310. The upper end surface 315a of the gate terminal 315, the upper end surface 316a of the source terminal 316, the upper end surface 317a of the drain terminal 317, and the upper end surface 318a of the anode terminal 318, which are formed in substantially the same height, are exposed at an upper surface of the resin material 319. Therefore, electrical connection to the wiring board 20 can be made at each of the upper end surface 315a of the gate terminal 315, the upper end surface 316a of the source terminal 316, the upper end surface 317a of the drain terminal 317, and the upper end surface 318a of the anode terminal 318.

The insulation circuit board 313 has a structure that metal plates are affixed to both surfaces of an insulator made of ceramic, for example. Heat generated from the semiconductor element 311 and the semiconductor element 312 is dissipated upwards from the gate terminal 315 (upper end surface 315a thereof), the source terminal 316 (upper end surface 316a thereof), the drain terminal 317 (upper end surface 317a thereof), and the anode terminal 318 (upper end surface 318a thereof). In addition, the heat is also dissipated from the underside of the insulation circuit board 313. The insulation circuit board 313 is one example of a "heat dissipating member", which term is used in this specification.

Seventeenth Embodiment

A seventeenth embodiment will be described below. Unlike the above-described sixteenth embodiment in which the outer contour surfaces are defined by the resin material 319, the outer contour surfaces are defined in the seventeenth embodiment by a lower heat spreader 313a and an upper heat spreader 313b each having outer contour surfaces corresponding to those of a case. The case-like lower heat spreader 313a and the case-like upper heat spreader 313b are made of a metal having electrical conductivity and thermal conductivity.

Figure 39:
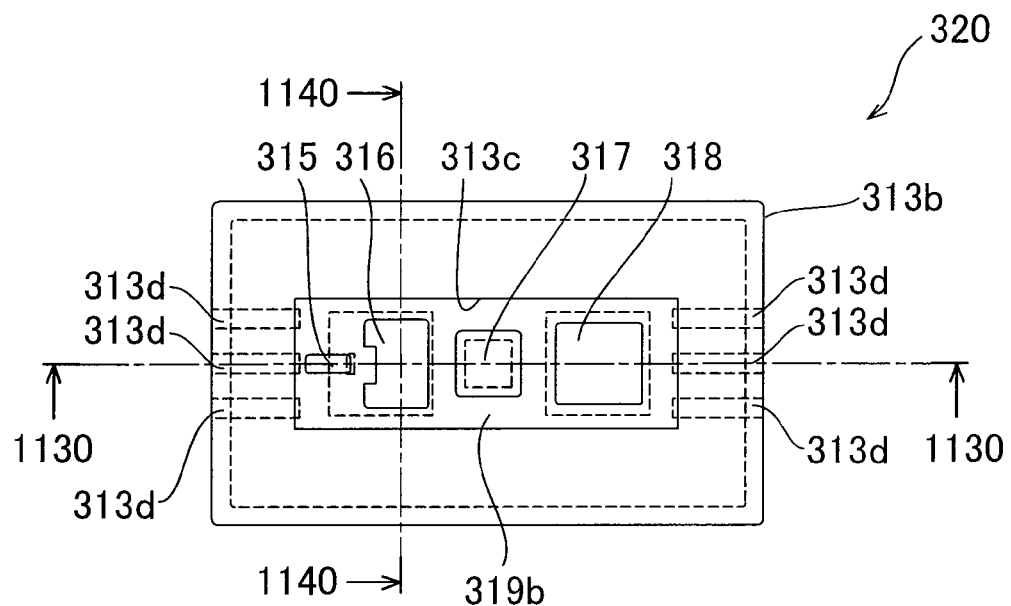
FIG. 39 is a plan view of a power module, the view representing a seventeenth embodiment.
Figure 40:
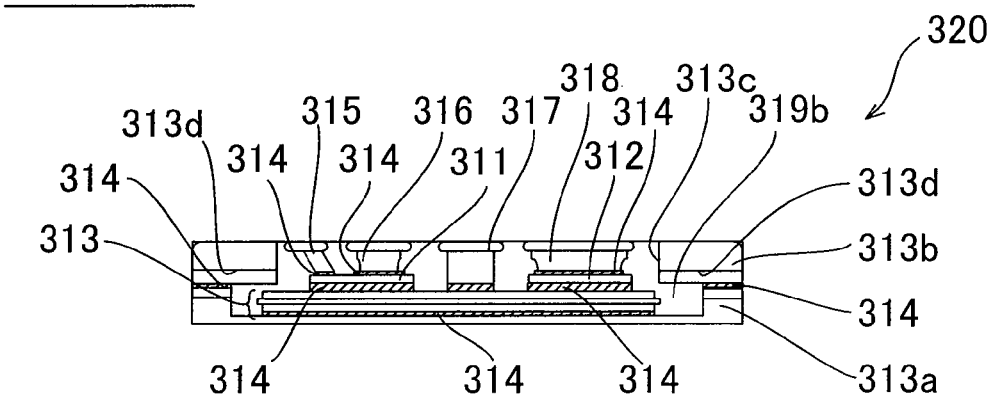
FIG. 40 is a sectional view taken along a line XXXX-XXXX in FIG. 39.

In a power module 320 according to the seventeenth embodiment, as illustrated in FIGS. 39 and 40, the semiconductor element 311, the semiconductor element 312, and the drain terminal 317 are bonded onto the surface of the insulation circuit board 313 with the bonds 314 interposed therebetween. The gate terminal 315 and the source terminal 316 are bonded onto the surface of the semiconductor element 311 with the bonds 314 interposed therebetween. The anode terminal 318 is bonded onto the surface of the semiconductor element 312 with the bond 314 interposed therebetween.

Figure 41:
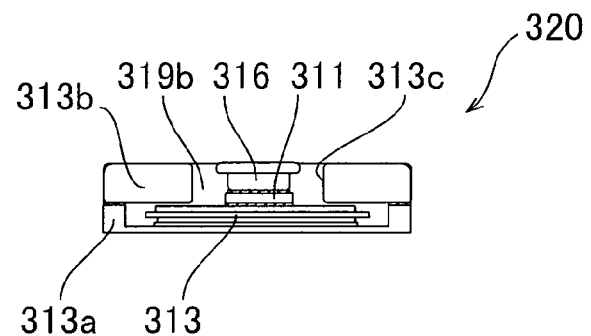
FIG. 41 is a sectional view taken along a line XXXXI-XXXXI in FIG. 39.

The lower heat spreader 313a having the heat dissipating function is arranged at a lower surface of the insulation circuit board 313. The lower heat spreader 313a is formed in a box-like (case-like) shape having a bottom surface and lateral surfaces. The upper heat spreader 313b is arranged on the lower heat spreader 313a with the bond 314 interposed therebetween. The upper heat spreader 313b is formed in a box-like (case-like) shape having a top surface and lateral surfaces. As illustrated in FIG. 41, an opening 313c is formed in the top surface of the upper heat spreader 313b. Further, the semiconductor element 311 and the semiconductor element 312 are contained inside the lower heat spreader 313a and the upper heat spreader 313b. With such an arrangement, the heat generated from the semiconductor element 311 and the semiconductor element 312 can be dissipated from the bottom surface and the lateral surfaces of the lower heat spreader 313a and from the top surface and the lateral surfaces of the upper heat spreader 313b.

Figure 42:
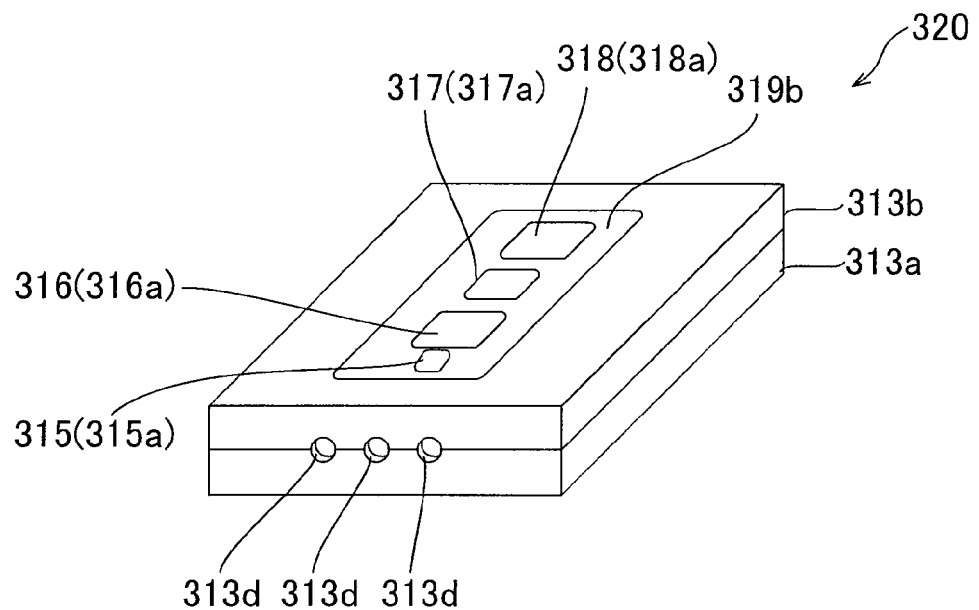
FIG. 42 is a perspective view looking the power module from the front surface side, the view representing the seventeenth embodiment.
Figure 43:
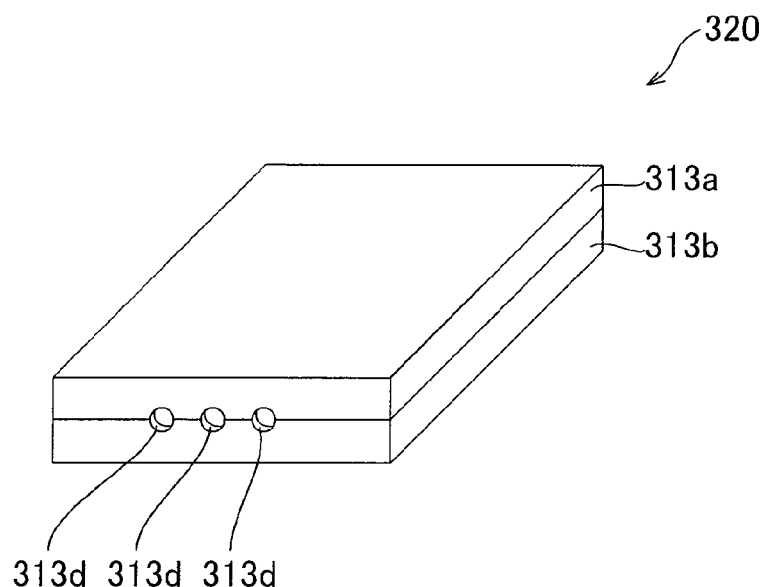
FIG. 43 is a perspective view looking the power module from the rear surface side, the view representing the seventeenth embodiment.

As illustrated in FIGS. 42 and 43, resin injection holes 313d are formed in the lateral surfaces of the lower heat spreader 313a and the upper heat spreader 313b. By injecting a resin through the resin injection holes 313d, spaces between the lower heat spreader 313a and the upper heat spreader 313b and between the semiconductor element 311 and the semiconductor element 312 are filled with the resin material 319b. The upper end surface 315a of the gate terminal 315, the upper end surface 316a of the source terminal 316, the upper end surface 317a of the drain terminal 317, and the upper end surface 318a of the anode terminal 318 are exposed at the surface of the resin material 319b (i.e., at the opening 313c in the upper heat spreader 313b).

Eighteenth Embodiment

An eighteenth embodiment will be described below. In this embodiment, the power module 320 according to the above-described seventeenth embodiment includes a heatsink 321b.

Figure 44:
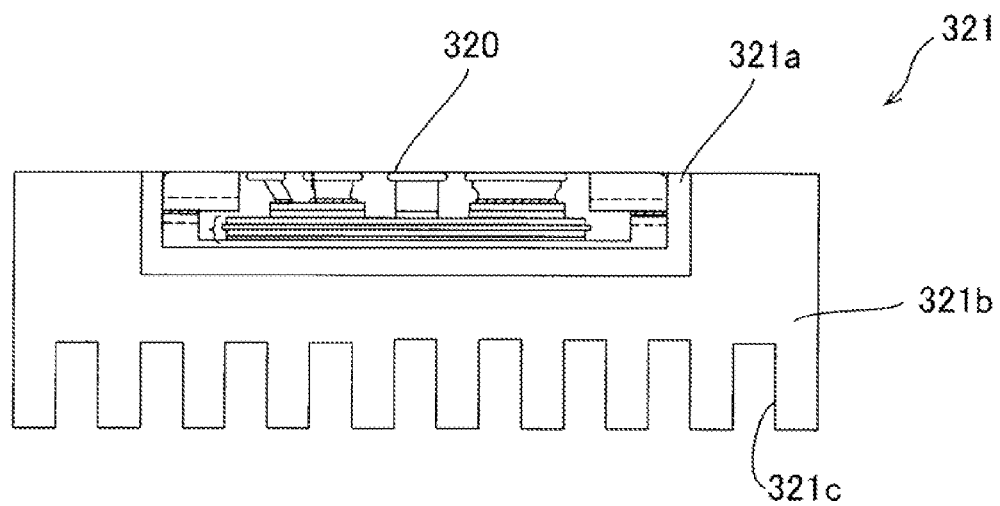
FIG. 44 is a sectional view of a power module, the view representing an eighteenth embodiment.

In a power module 321 according to the eighteenth embodiment, as illustrated in FIG. 44, the heatsink 321b is coupled to the power module 320 according to the seventeenth embodiment in a state covering lateral surfaces and a lower surface thereof with insulating and thermo-conductive grease 321a interposed between them. The heatsink 321b includes a plurality of fins 321c. The provision of the heatsink 321b reduces heat resistance of the power module 321. It is also possible to relieve thermal saturation due to an abrupt temperature rise, which may be caused by an overload, etc. As a result, the heat dissipation ability can be further increased.

Nineteenth Embodiment

A nineteenth embodiment will be described below. Unlike the above-described sixteenth embodiment (see FIG. 36) in which the semiconductor element 311, etc. are disposed on the surface of the insulation circuit substrate 313, the semiconductor element 311, etc. are disposed on the surface of a metal plate 323 in the nineteenth embodiment.

Figure 45:
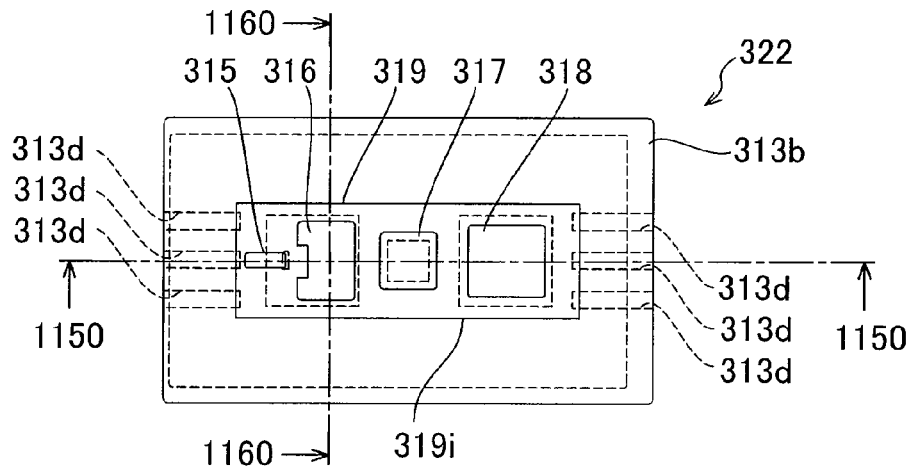
FIG. 45 is a plan view of a power module, the view representing a nineteenth embodiment.
Figure 46:
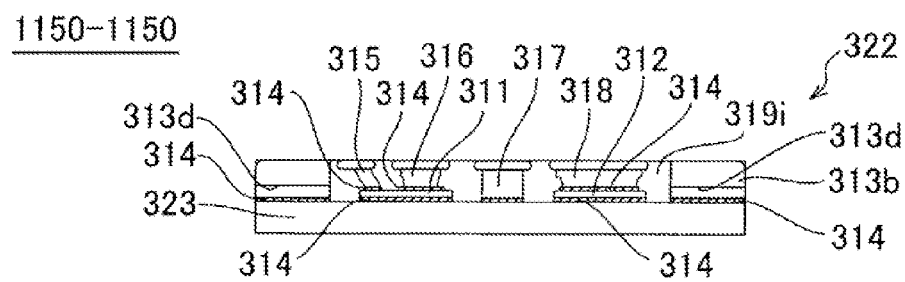
FIG. 46 is a sectional view taken along a line XXXXVI-XXXXVI in FIG. 45.
Figure 47:
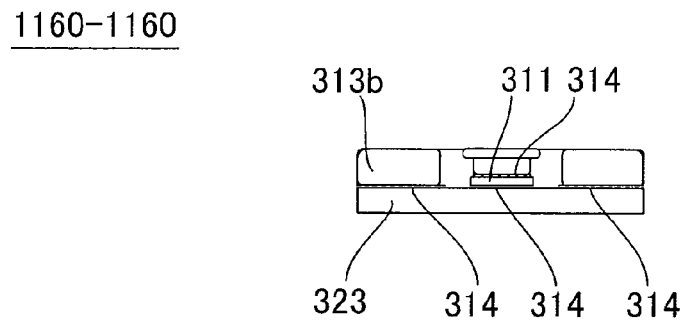
FIG. 47 is a sectional view taken along a line XXXXVII-XXXXVII in FIG. 45.

In a power module 322 according to the nineteenth embodiment, as illustrated in FIGS. 45 to 47, the semiconductor element 311, the semiconductor element 312, and the drain terminal 317 are disposed on the surface of the metal plate 323 with the bonds 314 interposed therebetween. The gate terminal 315 and the source terminal 316 are disposed on the surface of the semiconductor element 311 with the bonds 314 interposed therebetween. The anode terminal 318 is disposed on the surface of the semiconductor element 312 with the bond 314 interposed therebetween.

The upper heat spreader 313b is disposed on the surface of the metal plate 323 so as to surround the semiconductor element 311, the semiconductor element 312, the gate terminal 315, the source terminal 316, the drain terminal 317, and the anode terminal 318. Spaces between adjacent ones of the upper heat spreader 313b, the semiconductor element 311, the semiconductor element 312, the gate terminal 315, the source terminal 316, the drain terminal 317, and the anode terminal 318 are filled with a resin material 319i. In this embodiment, the case-like lower heat spreader 313a is not disposed and the metal plate 323 in the form of a flat plate is used to constitute a lower heat spreader (heat dissipating plate). Potentials of the metal plate 323 and the upper heat spreader 313b are substantially equal to that of the semiconductor element 312 on the side facing the metal plate 323 (i.e., on the cathode side thereof). Accordingly, an external circuit board (not shown) and the semiconductor element 312 can be electrically connected to each other with ease.

Twentieth Embodiment

A liquid-cooling cooler 400 according to a twentieth embodiment will be described below. For example, the power modules 10 according to the above-described first embodiment are arranged on an upper surface of the liquid-cooling cooler 400. The liquid-cooling cooler 400 is one example of a "cooling structure", which term is used in this specification.

Figure 48:
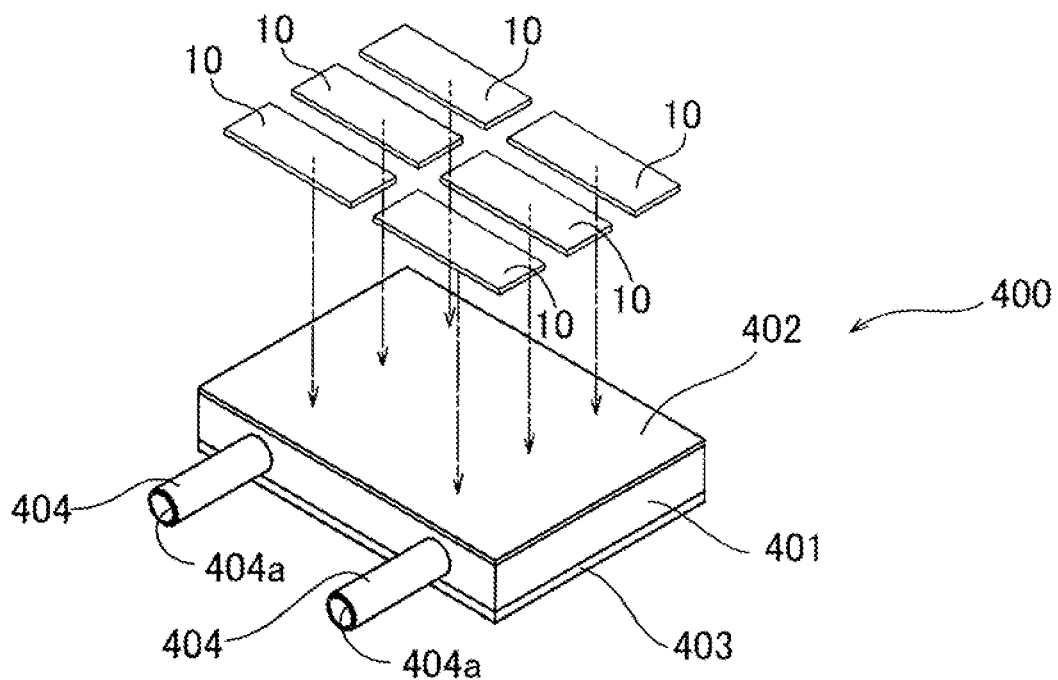
FIG. 48 is a perspective view of a liquid-cooling cooler, the view representing a twentieth embodiment.
Figure 49:
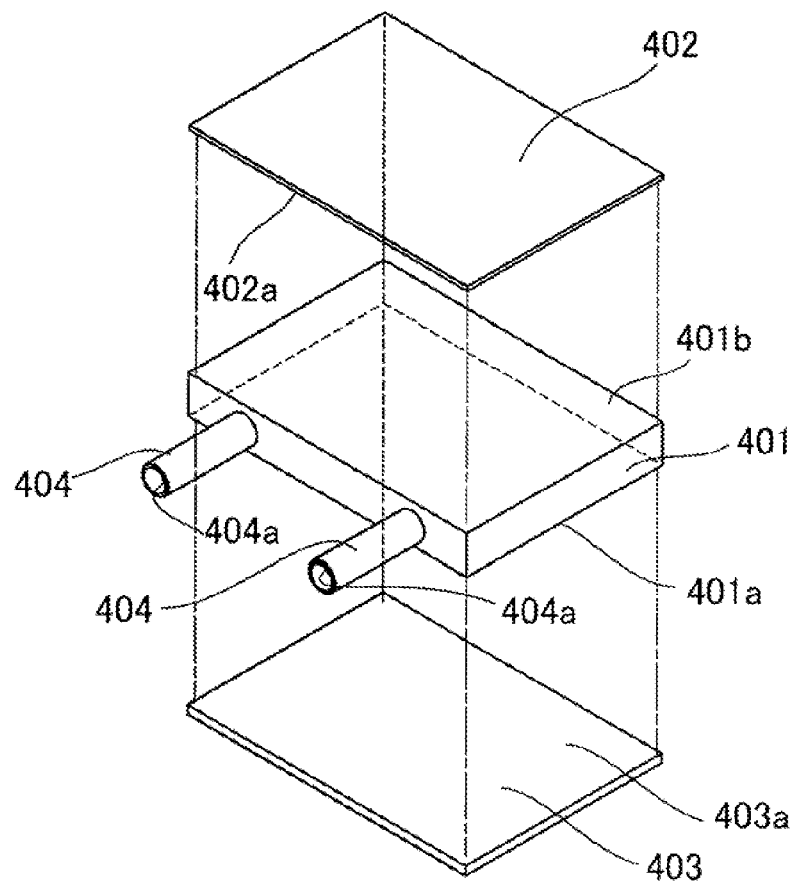
FIG. 49 is an exploded perspective view of the liquid-cooling cooler, the view representing the twentieth embodiment.

As illustrated in FIGS. 48 and 49, the liquid-cooling cooler 400 according to the twentieth embodiment includes a cooling plate base 401, a cooling plate cover 402 disposed on an upper surface of the cooling plate base 401, a cooling plate bottom 403 disposed at a lower surface thereof, and pipes 404 disposed at a lateral surface of the cooling plate base 401. The pipes 404 may be joints (couplers). The cooling plate base 401 and the cooling plate bottom 403 are combined with each other by brazing a rear (lower) surface 401a of the cooling plate base 401 and a brazed surface 403a of the cooling plate bottom 403. The cooling plate base 401 and the cooling plate cover 402 are combined with each other by bonding a front (upper) surface 401b of the cooling plate base 401 and an insulation-bonded surface 402a of the cooling plate cover 402 in an insulated manner. With the cooling plate base 401 and the cooling plate cover 402 being insulated from each other through the insulation bonding, even when the power module 10, according to the first embodiment, disposed on the upper surface of the liquid-cooling cooler 400 has a potential, the potential of the power module 10 is kept from being short-circuited to the cooling plate base 401.

Figure 50:
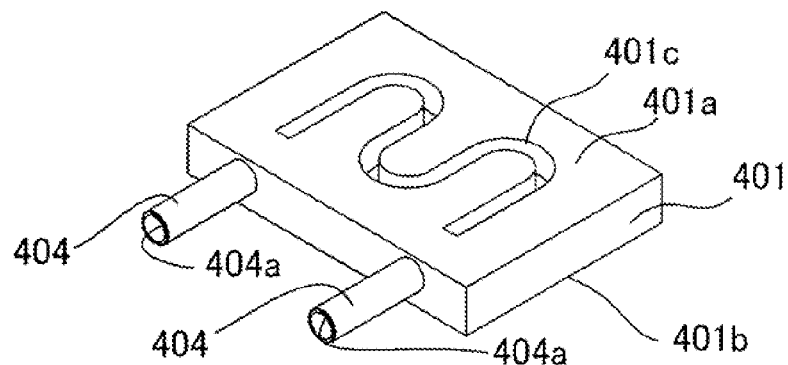
FIG. 50 is a perspective view of a liquid-cooling plate base of the liquid-cooling cooler, the view representing the twentieth embodiment.

As illustrated in FIG. 50, a coolant channel 401c is provided in the rear surface side of the cooling plate base 401. The coolant channel 401c and inner spaces 404a of the pipes 404 are connected to each other, thus constituting a coolant flow path for the liquid-cooling cooler 400.

The liquid-cooling cooler 400 is connected to, e.g., the metal plate 12 (see FIG. 5) on the bottom surface side of the power module 10 according to the first embodiment. With such an arrangement, heat can be dissipated from the bottom surface (outer surface) side of the power module 10 illustrated in FIG. 5. As a result, the twentieth embodiment can dissipate heat from not only the inner side of the power conversion device 100 (i.e., from the electrode surface side of the power module 10) through the liquid-cooling pipes 31 and 32 inside the wiring board 20, but also from the bottom surface (metal plate 12) side of the power module 10 with the liquid-cooling cooler 400.

Thus, this embodiment includes the metal plate 12 arranged on the rear surface side of the semiconductor element 11, and the liquid-cooling cooler 400 connected to the metal plate 12. With the provision of the liquid-cooling cooler 400 connected to the metal plate 12, it is possible to dissipate heat from the rear surface side of the semiconductor element 11 through the metal plate 12, as well as from the front surface side of the semiconductor element 11 (i.e., from the side including the connection surface to the wiring board 20), but also. As a result, the extent of heat dissipation from the power conversion device 100 can be further increased by using the liquid-cooling cooler 400.

Twenty-First Embodiment

A twenty-first embodiment will be described below. Unlike the above-described twentieth embodiment in which the surfaces of the cooling plate base 401 and the cooling plate cover 402 are flat, recesses and projections are formed in surfaces of a cooling plate base 411 and a cooling plate cover 413 of a liquid-cooling cooler 410 in the twenty-first embodiment. The liquid-cooling cooler 410 is one example of the "cooling structure", which term is used in this specification.

Figure 51:
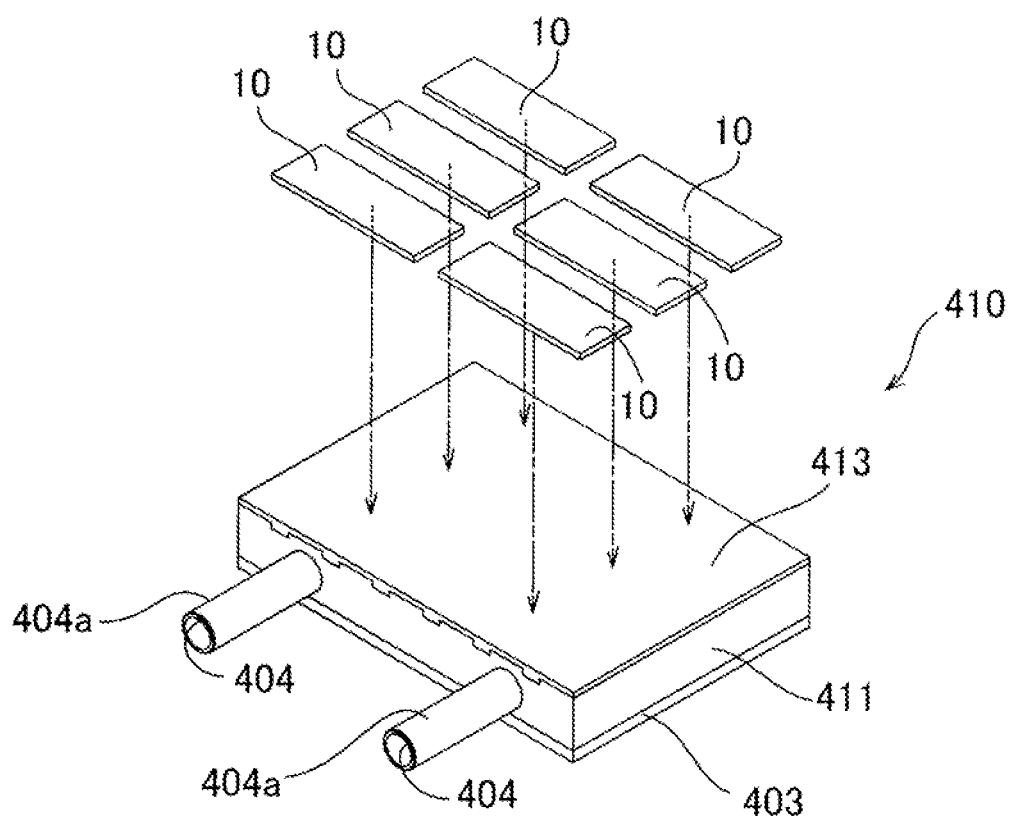
FIG. 51 is a perspective view of a liquid-cooling cooler, the view representing a twenty-first embodiment.
Figure 52:
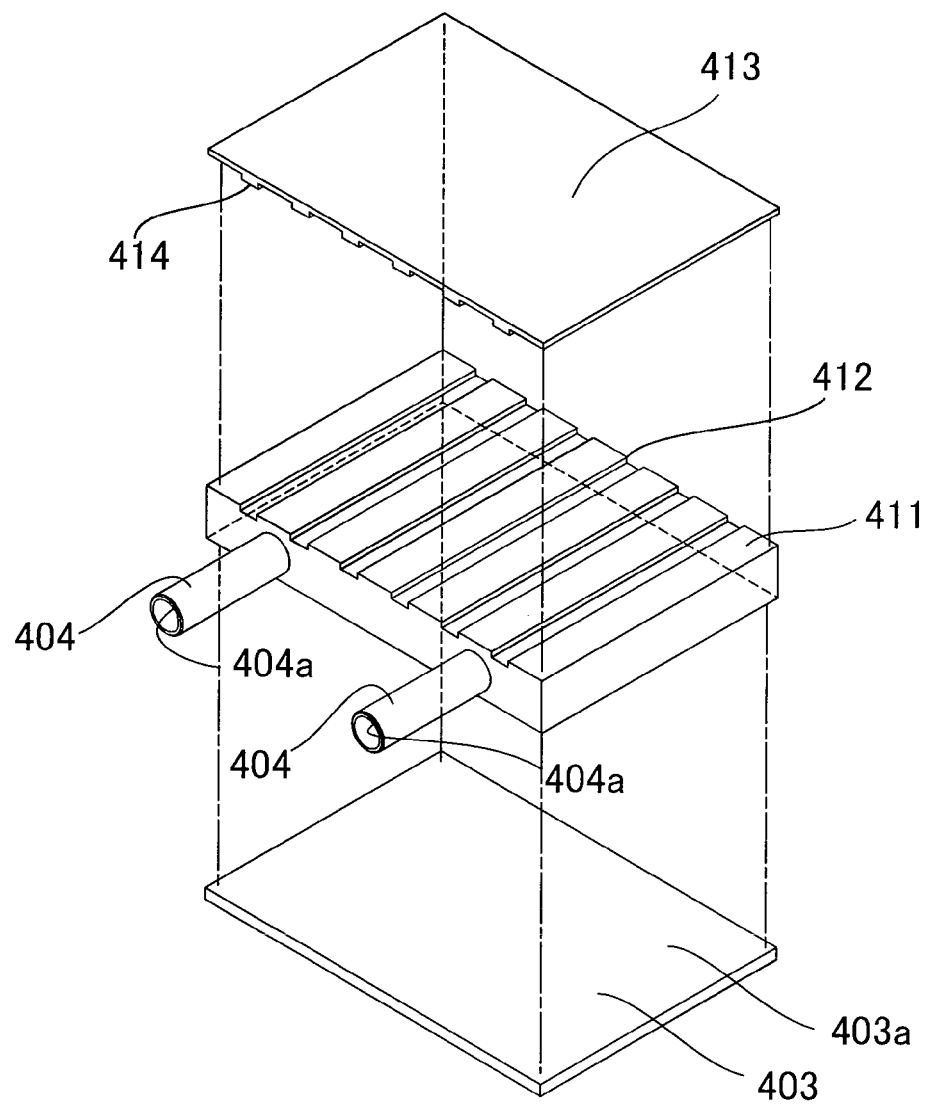
FIG. 52 is an exploded perspective view of the liquid-cooling cooler, the view representing the twenty-first embodiment.

As illustrated in FIGS. 51 and 52, a plurality of recesses 412, each having a rectangular cross-section, are formed in an upper surface of the cooling plate base 411 of the liquid-cooling cooler 410 according to the twenty-first embodiment. A plurality of projections 414, each having a rectangular cross-section, are formed on a lower surface of the cooling plate cover 413, the lower surface facing the cooling plate base 411. The recesses 412 of the cooling plate base 411 and the projections 414 of the cooling plate cover 413 are engageable with each other. With such an arrangement, a contact area between the cooling plate base 411 and the cooling plate cover 413 is increased, whereby the extent of heat dissipation can be increased. The shapes of the recesses and the projections are not limited to the rectangular cross-section insofar as they can increase the contact area between the cooling plate base 411 and the cooling plate cover 413. For example, the recesses and the projections may have cross-sections each having a shape of saw tooth waveform. The other construction of the twenty-first embodiment is similar to that of the above-described twentieth embodiment.

Twenty-Second Embodiment

A twenty-second embodiment will be described below. Unlike the above-described twentieth embodiment in which the cooling plate cover 402 is disposed, a liquid-cooling cooler 420 in the twenty-second embodiment does not include the cooling plate cover. The liquid-cooling cooler 420 is one example of the "cooling structure", which term is used in this specification.

Figure 53:
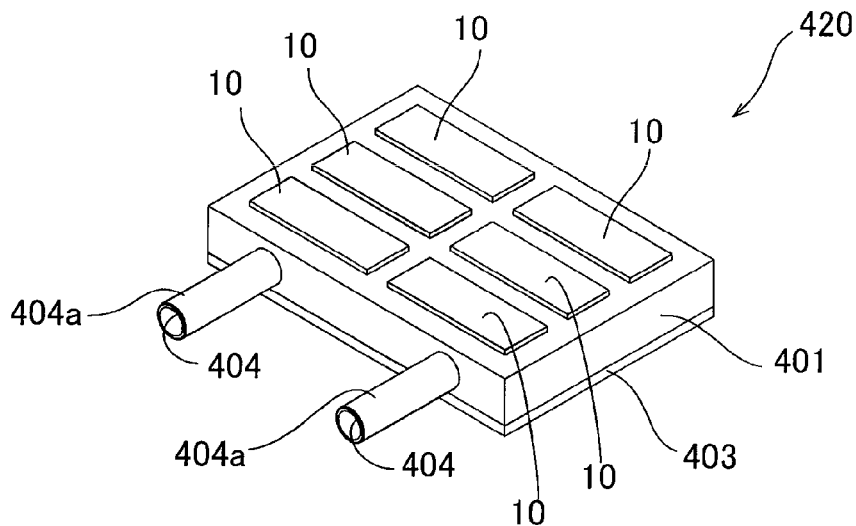
FIG. 53 is a perspective view of a liquid-cooling cooler, the view representing a twenty-second embodiment.
Figure 54:
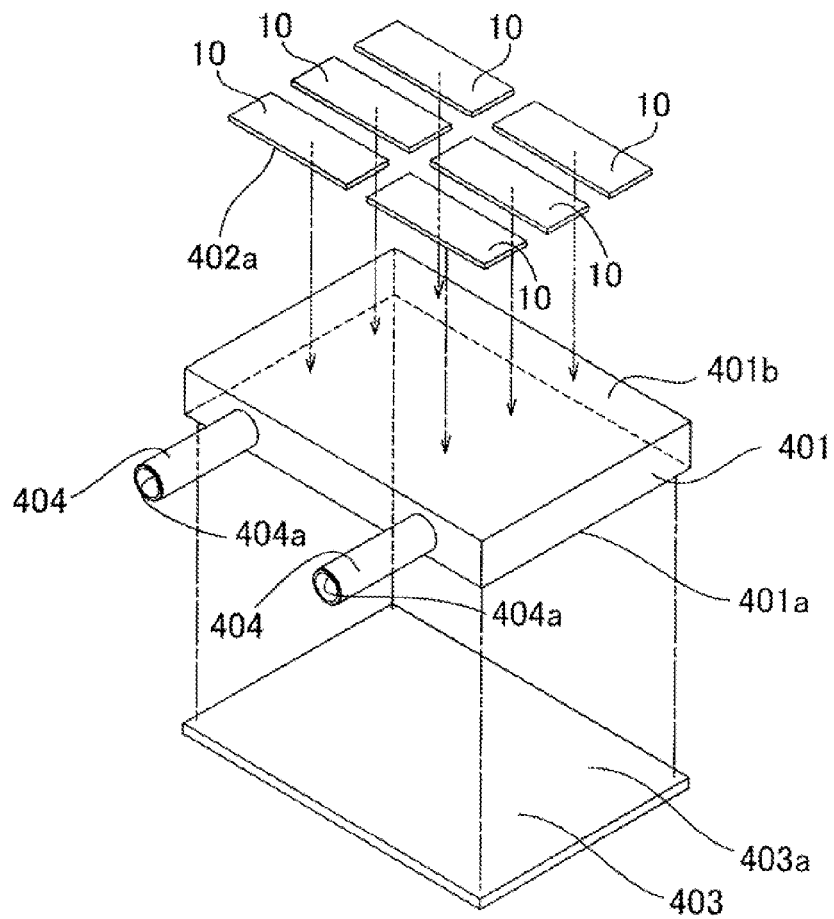
FIG. 54 is an exploded perspective view of the liquid-cooling cooler, the view representing the twenty-second embodiment.

As illustrated in FIGS. 53 and 54, the plural power modules 10 are directly disposed on the upper surface of the cooling plate base 401 of the liquid-cooling cooler 402 according to the twenty-second embodiment without providing the cooling plate cover (see FIG. 48). The upper surface of the cooling plate base 401 and the bottom surface (insulation-bonded surface 402a) of each of the power module 10 are combined with each other by insulation bonding. Thus, the cooling plate base 401 and the power module 10 are insulated from each other. The other construction of the twenty-second embodiment is similar to that of the above-described twentieth embodiment.

Twenty-Third Embodiment

A twenty-third embodiment will be described below. Unlike the above-described twenty-second embodiment in which the upper surface of the cooling plate base 401 is flat, recesses 412 are formed in an upper surface of the cooling plate base 411 of a liquid-cooling cooler 430 in the twenty-third embodiment. The liquid-cooling cooler 430 is one example of the "cooling structure", which term is used in this specification.

Figure 55:
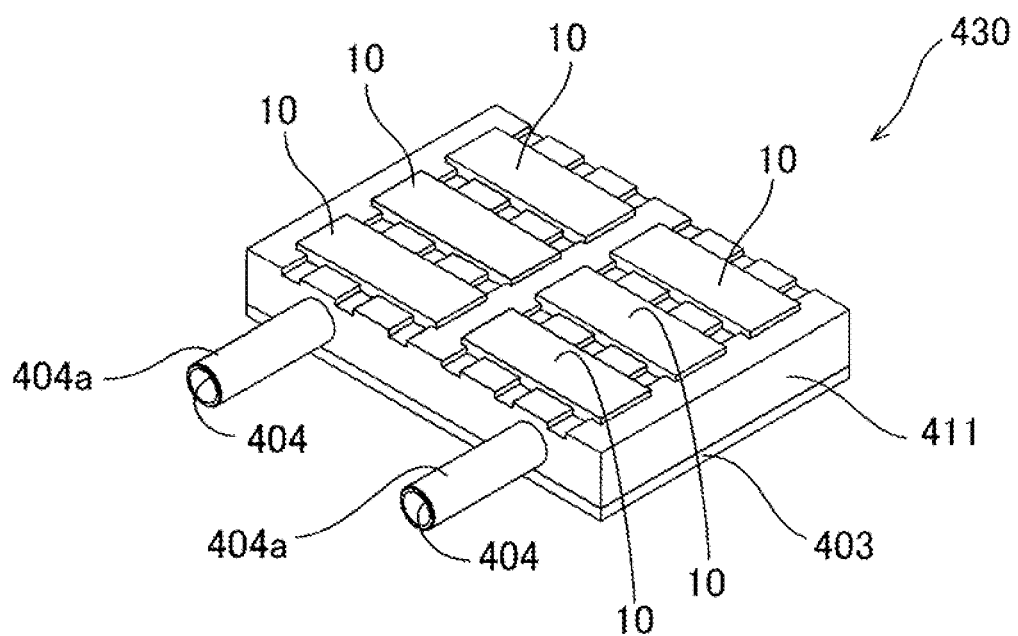
FIG. 55 is a perspective view of a liquid-cooling cooler, the view representing a twenty-third embodiment.
Figure 56:
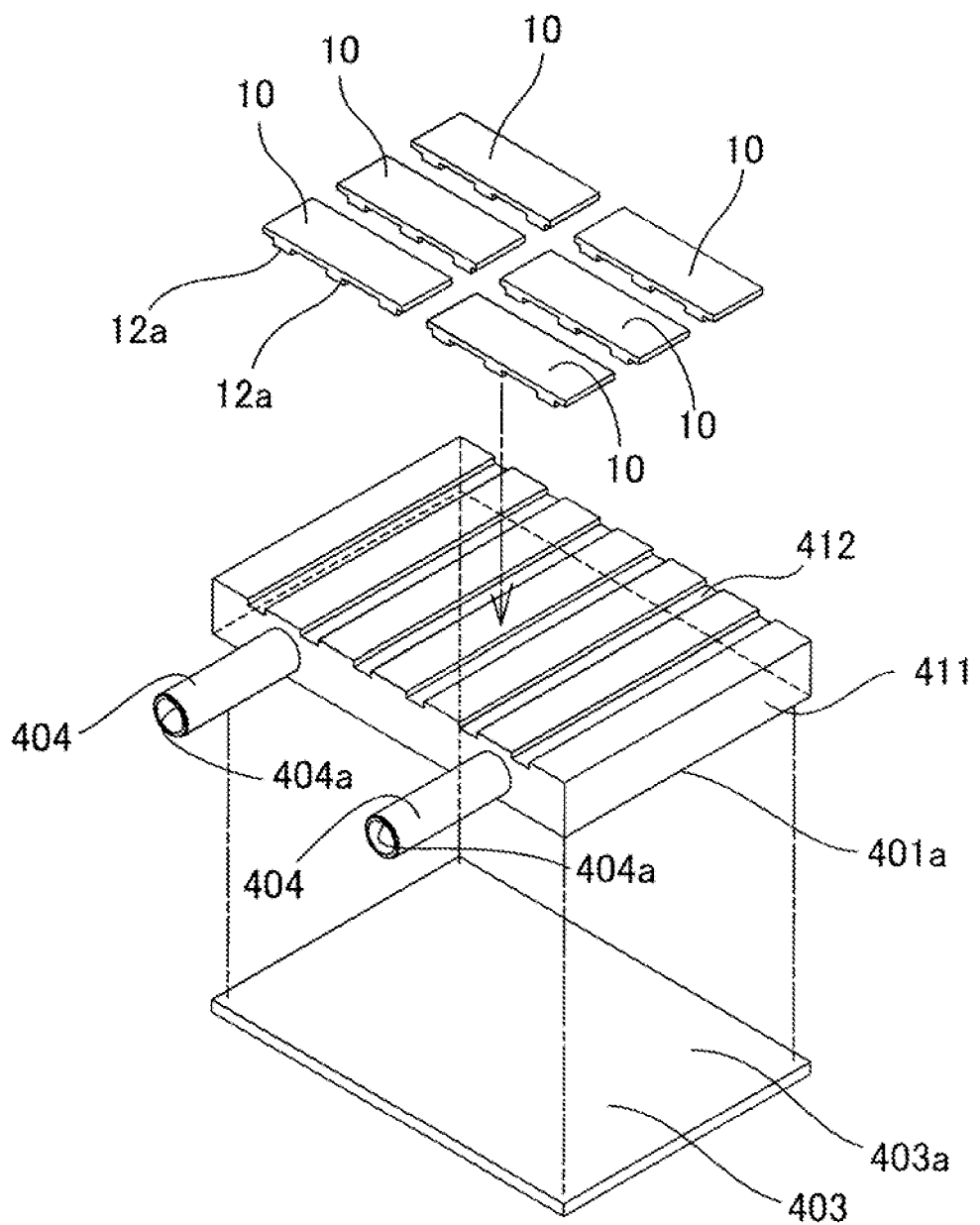
FIG. 56 is an exploded perspective view of the liquid-cooling cooler, the view representing the twenty-third embodiment.

As illustrated in FIGS. 55 and 56, recesses 412 having rectangular cross-sections are formed in the upper surface of the cooling plate base 411 of the liquid-cooling cooler 430 according to the twenty-third embodiment. Projections 12a having rectangular cross-sections and being engageable with the recesses 412 of the cooling plate base 411 are formed on the lower surface (metal plate 12) of the power module 10. The liquid-cooling cooler 430 is constituted by engaging the recesses 412 of the cooling plate base 411 with the projections 12a of the power module 10. The shapes of the recesses and the projections are not limited to the rectangular cross-section insofar as they can increase the contact area between the cooling plate base 411 and the power module 10. For example, the recesses and the projections may have cross-sections each having a shape of saw tooth waveform. The other construction of the twenty-third embodiment is similar to that of the above-described twenty-second embodiment.

Twenty-Fourth Embodiment

A twenty-fourth embodiment will be described below. In this embodiment, a partition plate 443 is disposed inside a cooling plate base 441 of a liquid-cooling cooler 440. The liquid-cooling cooler 440 is one example of the "cooling structure", which term is used in this specification.

Figure 57:
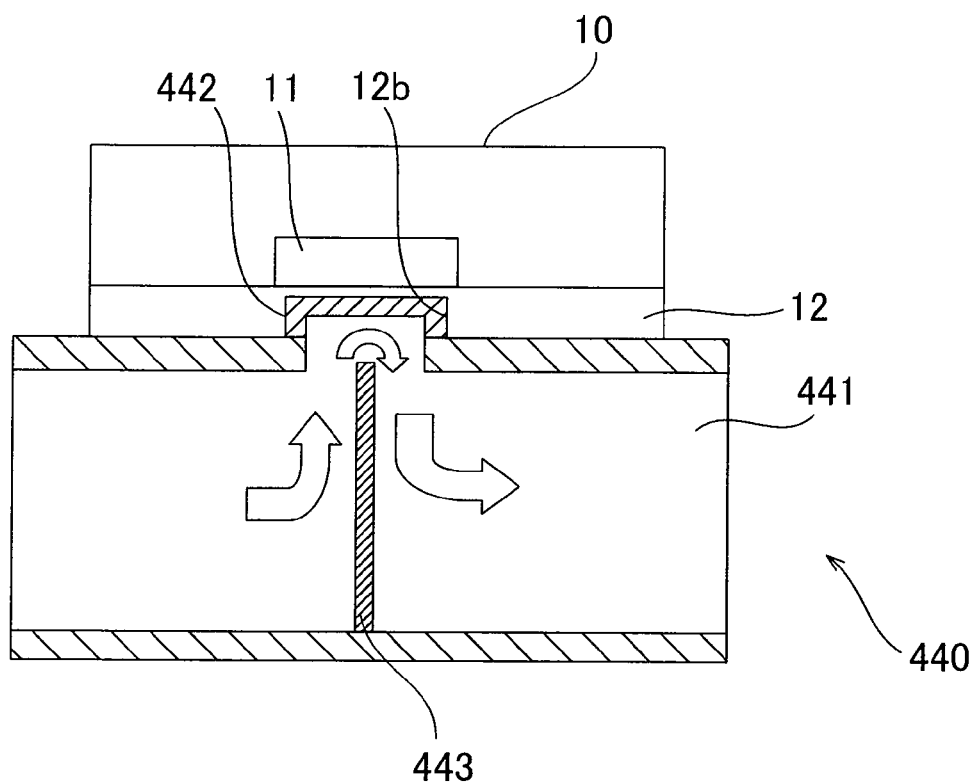
FIG. 57 is a sectional view of the liquid-cooling cooler, the view representing a twenty-fourth embodiment.

As illustrated in FIG. 57, a projection 442 is formed on an upper surface of the cooling plate base 441 of the liquid-cooling cooler 440 according to the twenty-fourth embodiment. A recess 12b engageable with the projection 442 of the cooling plate base 441 is formed in the lower surface of the metal plate 12 of the power module 10. The recess 12b of the metal plate 12 is formed at a position corresponding to the semiconductor element 11. The partition plate 443 is disposed in a region of the cooling plate base 441 corresponding to the semiconductor element 11. With such an arrangement, the flow of a coolant flowing through the inside of the cooling plate base 441 is accelerated near the partition plate 443. Therefore, the cooling ability of the liquid-cooling cooler 440 can be increased.

Thus, in this embodiment, the recess 12b is formed in the metal plate 12 of the power module 10. Further, the projection 442 engageable with the recess 12b of the metal plate 12 is formed on the upper surface of the cooling plate base 441. Accordingly, the distance between the power module 10 and the coolant flowing through the cooling plate base 441 is reduced, whereby the extent of heat dissipation from the power module 10 to the cooling plate base 441 can be increased.

Twenty-Fifth Embodiment

A twenty-fifth embodiment will be described below. Unlike the above-described twenty-fourth embodiment in which the recess 12b is formed in the metal plate 12, a via 453 is formed in the twenty-fifth embodiment. A liquid-cooling cooler 450 is one example of the "cooling structure", which term is used in this specification.

Figure 58:
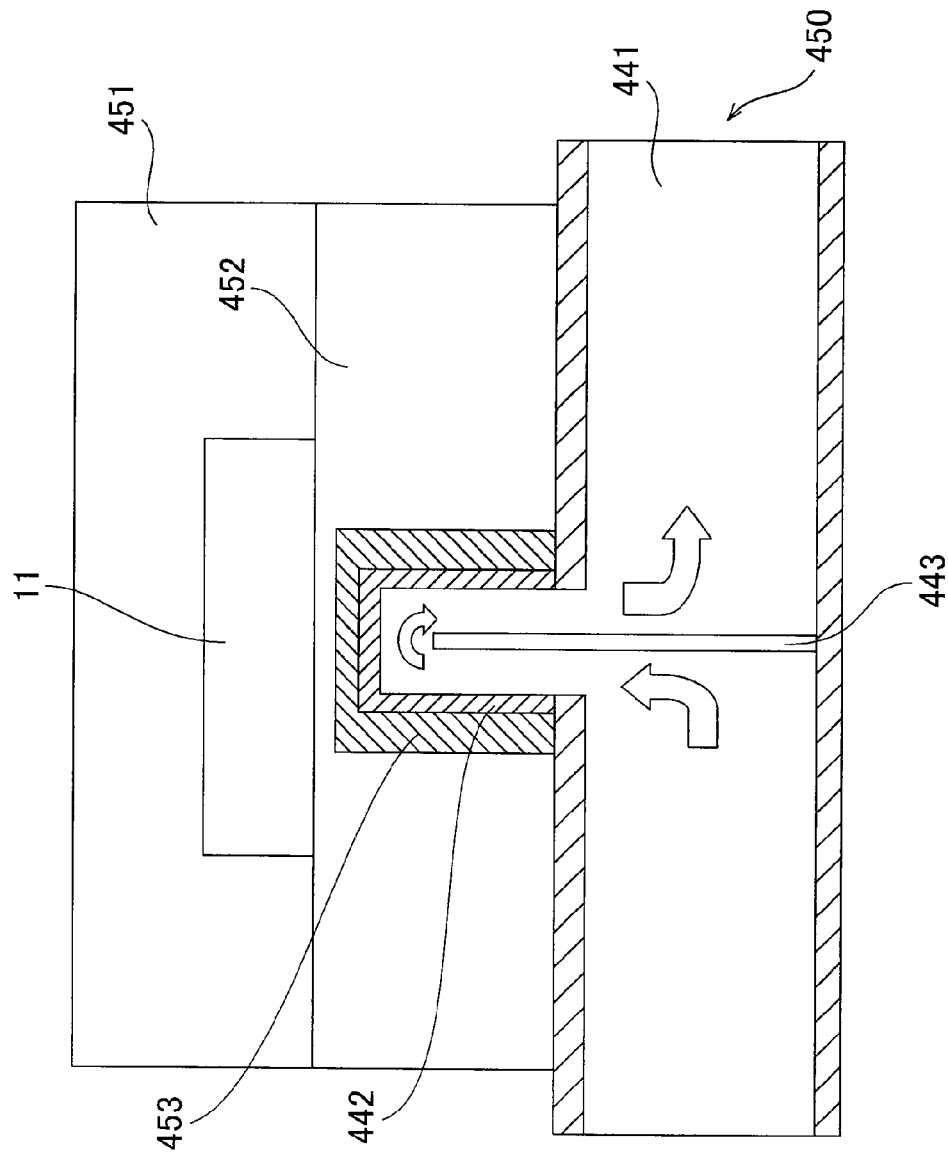
FIG. 58 is a sectional view of the liquid-cooling cooler, the view representing a twenty-fifth embodiment.

In the twenty-fifth embodiment, as illustrated in FIG. 58, the via (hole) 452 closed at its upper end is formed in a lower surface of a substrate 452 on which the semiconductor element 11 of a power module 451 is disposed. A via previously formed in the substrate 452 for electrical connection can be utilized as the via 453. Further, the via 453 of the substrate 452 is engageable with a projection 442 formed on the cooling plate base 441 of the liquid-cooling cooler 450. With such an arrangement, the power module 451 and the cooling plate base 441 of the liquid-cooling cooler 450 can be engaged with each other without separately forming a recess in the power module 451.

Twenty-Sixth Embodiment

A large-current terminal block 500 according to a twenty-sixth embodiment will be described below. In this embodiment, for example, an inverter unit 510 and a converter unit 520, each including the power module 10 and the wiring board 20 according to the first embodiment, are connected to the large-current terminal block 500. The inverter unit 510 is one example of a "power conversion device" and a "first power conversion device", which terms are used in the appended claims. The converter unit 520 is one example of the "power conversion device" and a "second power conversion device", which terms are used in the appended claims.

Figure 59:
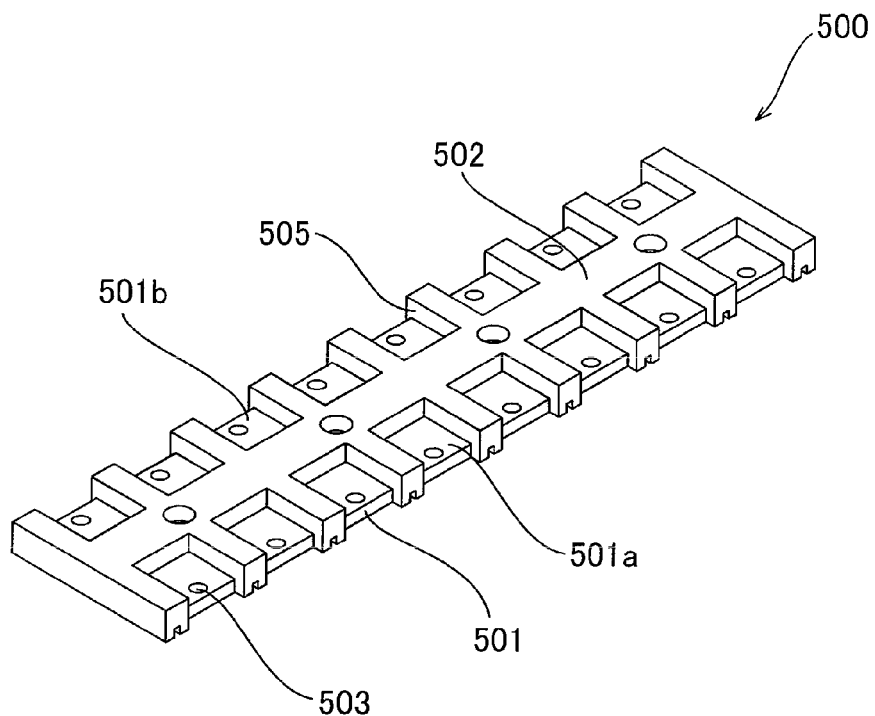
FIG. 59 is a perspective view of a large-current terminal block, the view representing a twenty-sixth embodiment.
Figure 60:
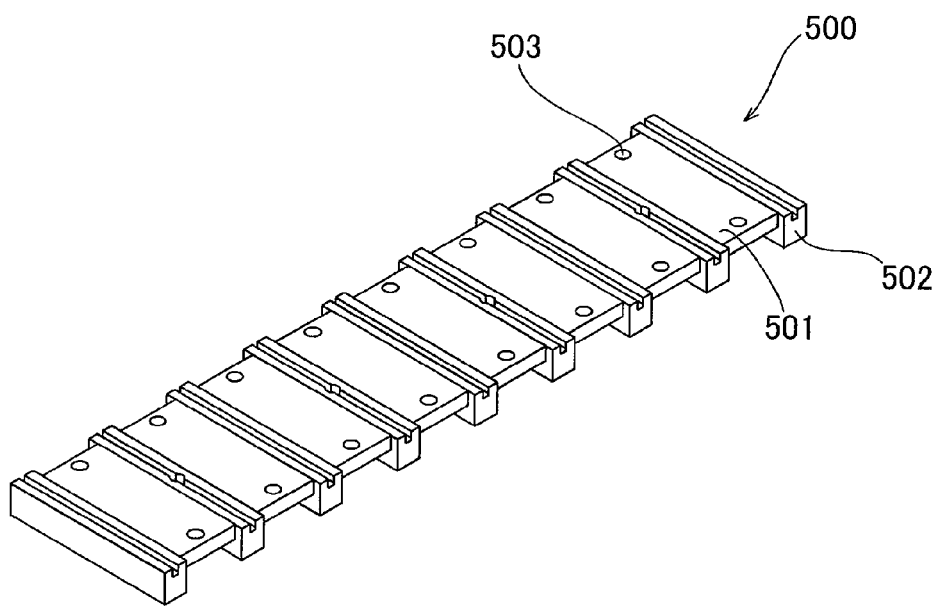
FIG. 60 is a perspective view looking the large-current terminal block from the rear surface side, the view representing the twenty-sixth embodiment.
Figure 61:
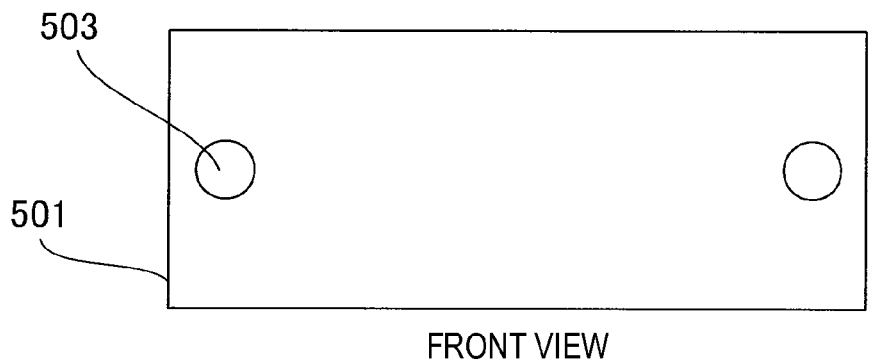
FIG. 61 is a front view of a connection terminal portion, the view representing the twenty-sixth embodiment.
Figure 62:
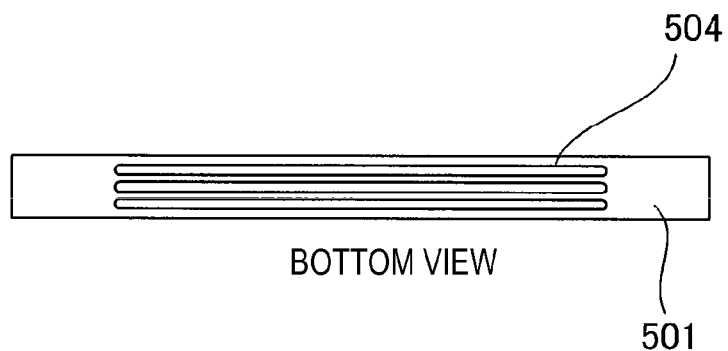
FIG. 62 is a bottom view of the connection terminal portion, the view representing the twenty-sixth embodiment.
Figure 63:
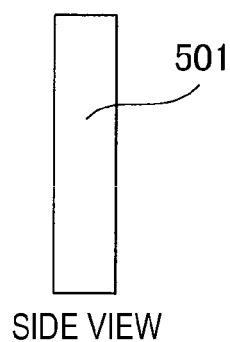
FIG. 63 is a side view of the connection terminal portion, the view representing the twenty-sixth embodiment.

As illustrated in FIGS. 59 and 60, the large-current terminal block 500 includes connection terminal members 501 and an insulating resin portion 502. As illustrated in FIG. 61, two holes 503 are formed in each of the connection terminal members 501. As illustrated in FIG. 62, a plurality of slits 504 are formed in each of the connection terminal members 501 while penetrating therethrough. The slits 504 in the connection terminal members 501 are filled with a resin when the connection terminal members 501 and the resin portion 502 are integrated with each other by resin molding. The connection terminal member 501 includes a connection terminal portion 501a for connection to the inverter unit 510, and a connection terminal portion 501b for connection to the converter unit 520. The large-current terminal block 500 is one example of a "terminal block", which term is used in the appended claims. The resin portion 502 is one example of an "insulating portion", which term is used in the appended claims. The connection terminal portion 501a and the connection terminal portion 501b are respectively one example of a "first connection terminal portion" and one example of a "second connection terminal portion", which terms are used in the appended claims.

As illustrated in FIG. 59, the resin portion 502 includes a raised step 505 to secure an insulation distance between adjacent two of the connection terminal members 501.

Figure 64:
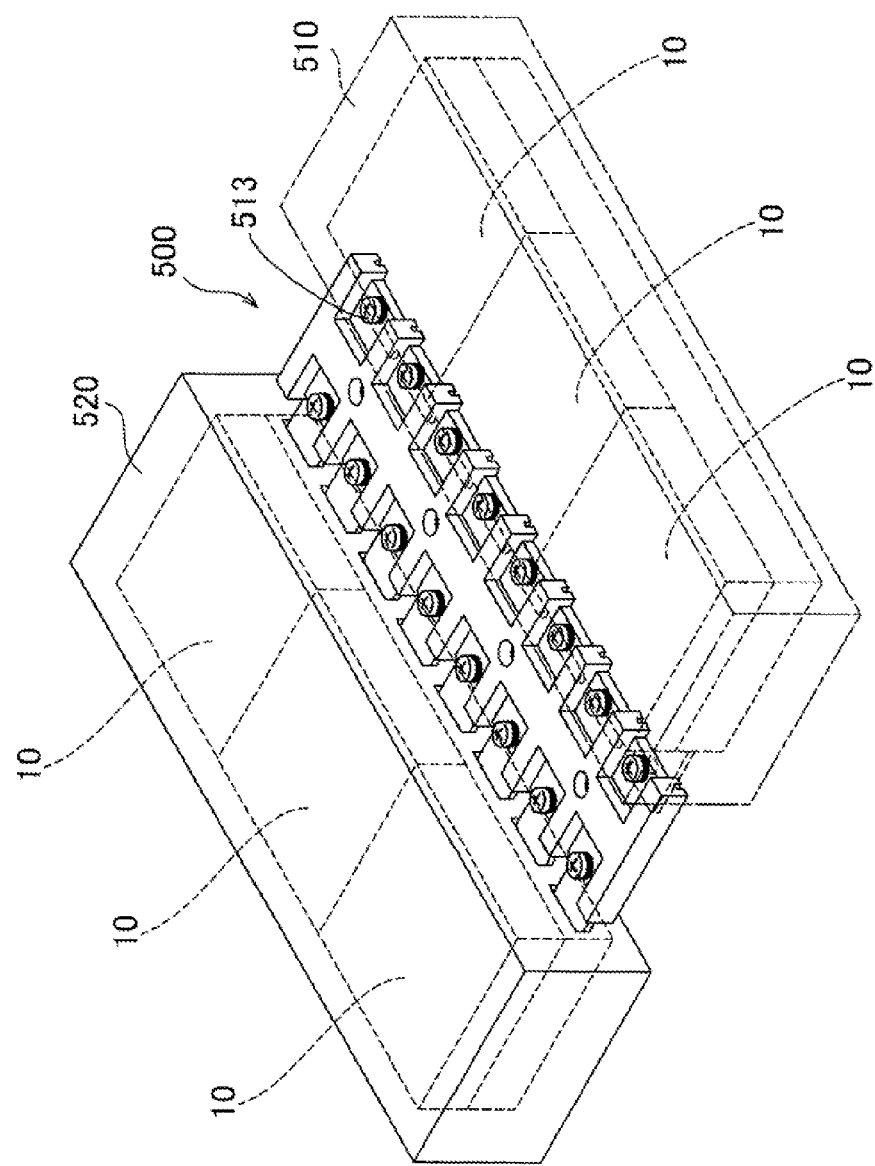
FIG. 64 is a perspective view of the large-current terminal block connected to an inverter unit and a converter unit, the view representing the twenty-sixth embodiment.
Figure 65:
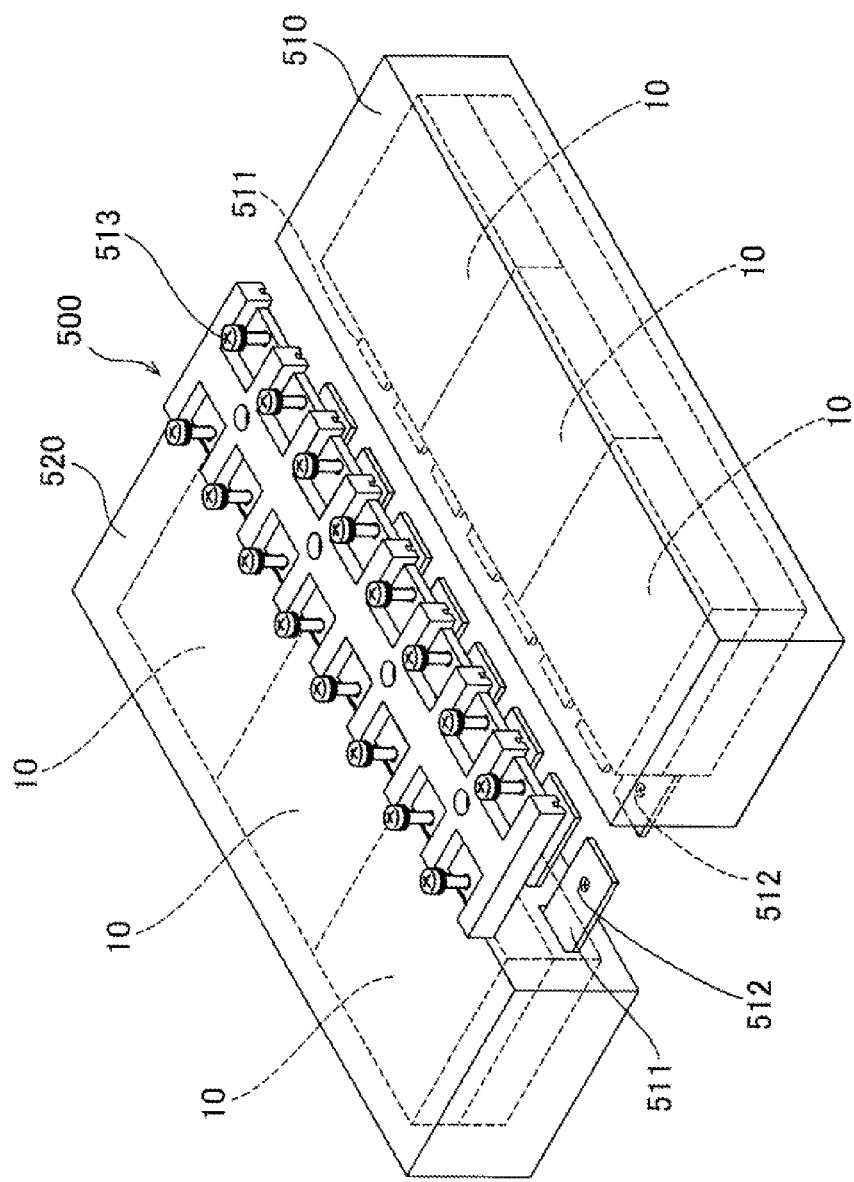
FIG. 65 is a perspective view of the large-current terminal block before it is connected to the inverter unit and the converter unit, the view representing the twenty-sixth embodiment.

As illustrated in FIGS. 64 and 65, the large-current terminal block 500 is connectable to the inverter unit 510 and the converter unit 520. For example, the power modules 10 according to the first embodiment are disposed inside the inverter unit 510 and the converter unit 520. The inverter unit 510 and the converter unit 520 includes, for connection to the large-current terminal block 500, a plurality of terminals 511 allowing a large and high-frequency current to flow therethrough. The terminal 511 is one example of a "terminal portion", which term is used in the appended claims. Those plural terminals 511 are electrically connected to the electrodes (i.e., the control electrodes 11a, the source electrodes 11b, and the drain electrodes 11c) of the semiconductor elements 11 in the individual power modules 10. Holes 512 are formed in the terminals 511. The large-current terminal block 500 can be connected to the inverter unit 510 and the converter unit 520 by coupling the connection terminal portions 501a and the connection terminal portions 501b of the large-current terminal block 500 to the corresponding terminals 511 of the inverter unit 510 and the converter unit 520 with screws 513. When the holes 512 in the terminals 511 are tapped holes, the screws 513 and the terminals 511 can be fastened together by tightening, e.g., nuts over the screws 513 from the rear side of the terminals 511.

Thus, in this embodiment, the large-current terminal block 500 includes the plural connection terminal members 501 made of metal, and the resin portion 502 made of resin and insulating adjacent two of the connection terminal members 501 from each other. Further, the insulating resin portion 502 includes the raised step 505 providing a level difference at the boundary between the connection terminal member 501 and the resin portion 502. With such an arrangement, the insulation distance (creeping distance) between adjacent two of the connection terminal members 501 through the resin portion 502 can be increased with the presence of the raised step 505, and the pitch between the connection terminal members 501 can be reduced. As a result, the size of the large-current terminal block 500 can be reduced.

In this embodiment, the connection terminal members 501 of the large-current terminal block 500 include the slits 504, and the slits 504 are filled with the same resin as that forming the resin portion 502. By thus filling the resin in the slits 504, the connection terminal members 501 can be easily fixed to the large-current terminal block 500.

In this embodiment, as described above, the connection terminal members 501 of the large-current terminal block 500 include the connection terminal portions 501a for connection to the inverter unit 510 and the connection terminal portions 501b for connection to the converter unit 520. Therefore, the inverter unit 510 and the converter unit 520 can be easily connected to the large-current terminal block 500 through the connection terminal portions 501a and the connection terminal portions 501b, respectively.

Twenty-Seventh Embodiment

A twenty-seventh embodiment will be described below. In this embodiment, a connection terminal member 531 includes spring terminals 534.

Figure 66:
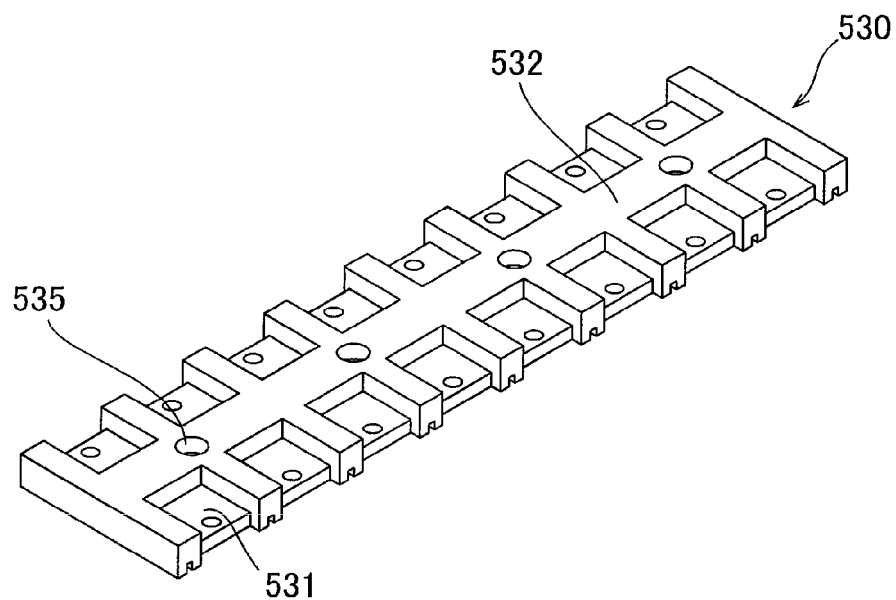
FIG. 66 is a perspective view of a large-current terminal block, the view representing a twenty-seventh embodiment.
Figure 67:
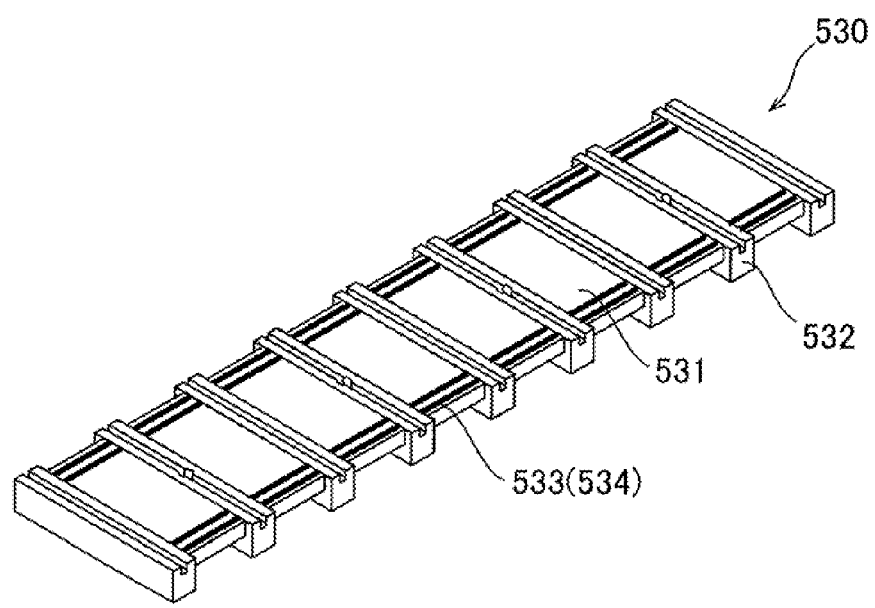
FIG. 67 is a perspective view looking the large-current terminal block from the rear surface side, the view representing the twenty-seventh embodiment.
Figure 68:
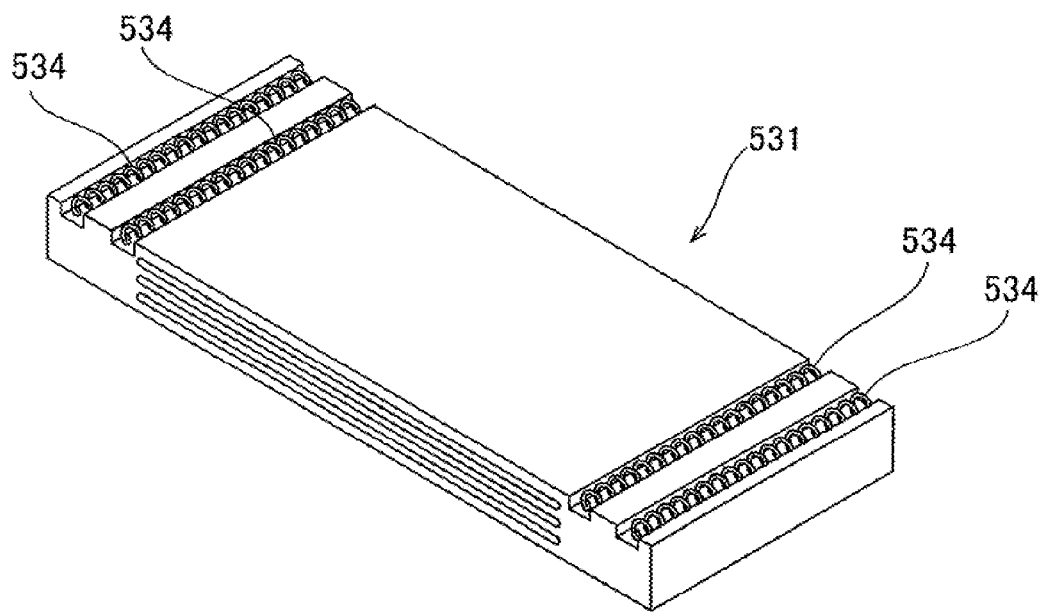
FIG. 68 is a perspective view of a connection terminal portion of the large-current terminal block, the view representing the twenty-seventh embodiment.
Figure 69:
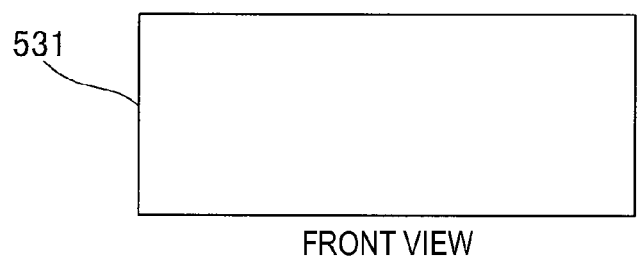
FIG. 69 is a front view of the connection terminal portion, the view representing the twenty-seventh embodiment.
Figure 70:
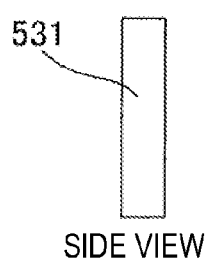
FIG. 70 is a side view of the connection terminal portion, the view representing the twenty-seventh embodiment.
Figure 71:
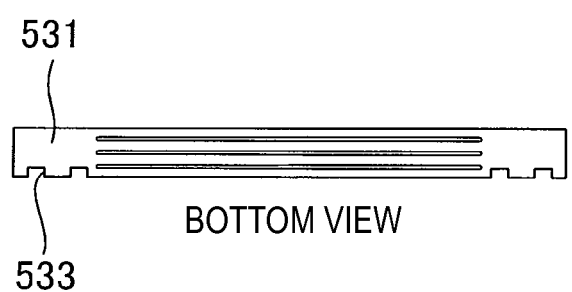
FIG. 71 is a bottom view of the connection terminal portion, the view representing the twenty-seventh embodiment.
Figure 72:
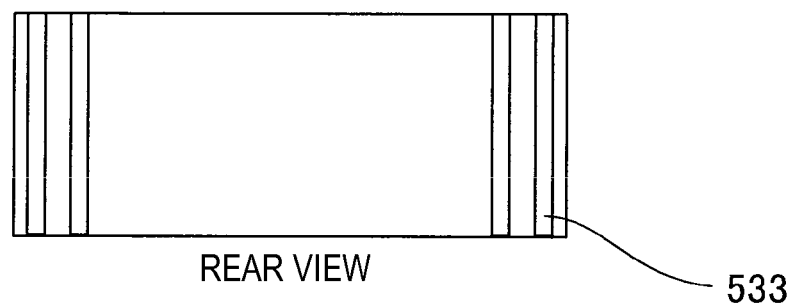
FIG. 72 is a rear view of the connection terminal portion, the view representing the twenty-seventh embodiment.

As illustrated in FIGS. 66 to 68, a large-current terminal block 530 includes the connection terminal members 531 and a resin portion 532. As illustrated in FIGS. 71 and 72, four grooves 533 are formed in each of the connection terminal members 531 (see FIGS. 69 to 72). Further, as detailed in FIG. 68, the spring terminals 534 are mounted in the grooves 533 of the connection terminal member 531. As illustrated in FIG. 66, attachment holes 535 are formed in the resin portion 532. The large-current terminal block 530 is one example of the "terminal block", which term is used in the appended claims. The resin portion 532 is one example of the "insulating portion", which term is used in the appended claims.

Figure 73:
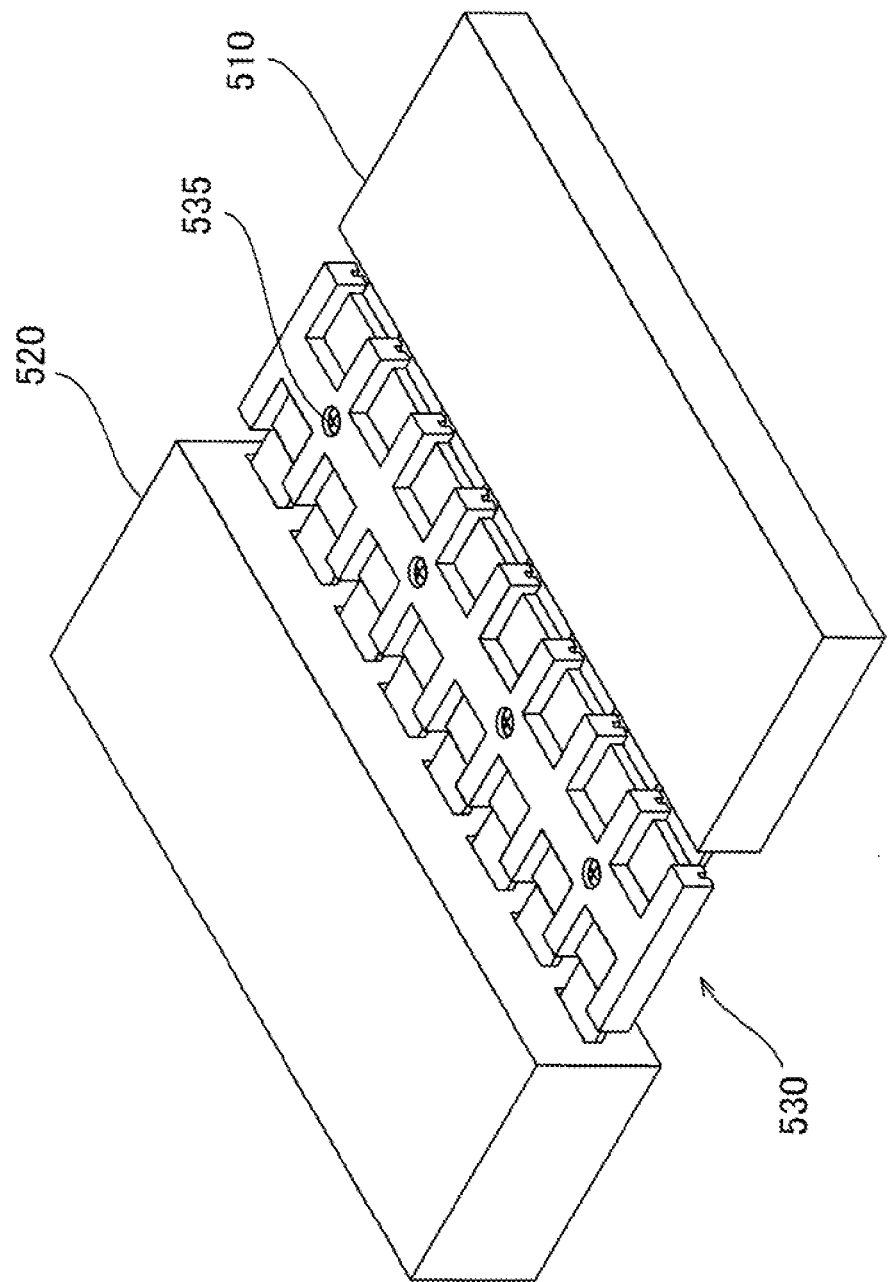
FIG. 73 is a perspective view of the large-current terminal block connected to the inverter unit and the converter unit, the view representing the twenty-seventh embodiment.
Figure 74:
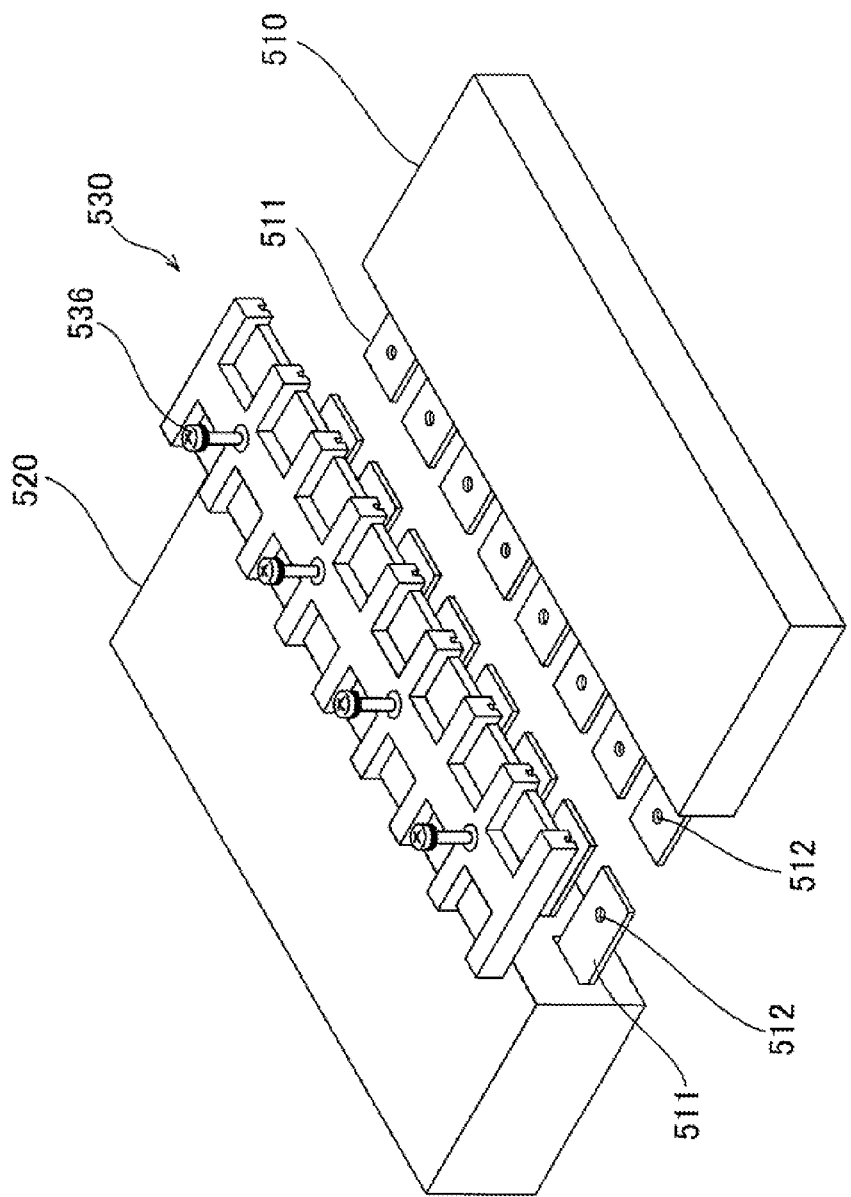
FIG. 74 is a perspective view of the large-current terminal block before it is connected to the inverter unit and the converter unit, the view representing the twenty-seventh embodiment.

As illustrated in FIGS. 73 and 74, the large-current terminal block 530 is attached, by using screws 536, to a housing, e.g., a case or a cooler (not shown), which covers the inverter unit 510 and the converter unit 520. At that time, the large-current terminal block 530 is contacted with (pressed against) the terminals 511 of the inverter unit 510 and the converter unit 520. Accordingly, there are no screws for connecting the large-current terminal block 530 to the terminals 511 of the inverter unit 510 and the converter unit 520. On the other hand, because the large-current terminal block 530 and the terminals 511 of the inverter unit 510 and the converter unit 520 are not firmly fixed to each other, contact pressure varies between the large-current terminal block 530 and the terminals 511. With the provision of the spring terminals 534, however, the electrical connection between the large-current terminal block 530 and the terminals 511 can be stabilized.

Reference Example

A reference example will be described below. Unlike the above-described sixth embodiment in which the conductor plate 161 (162) is formed of the fine wiring member 167, a wiring circuit inside the wiring board 20 is entirely formed by using fine wiring members in the reference example.

Figure 75:
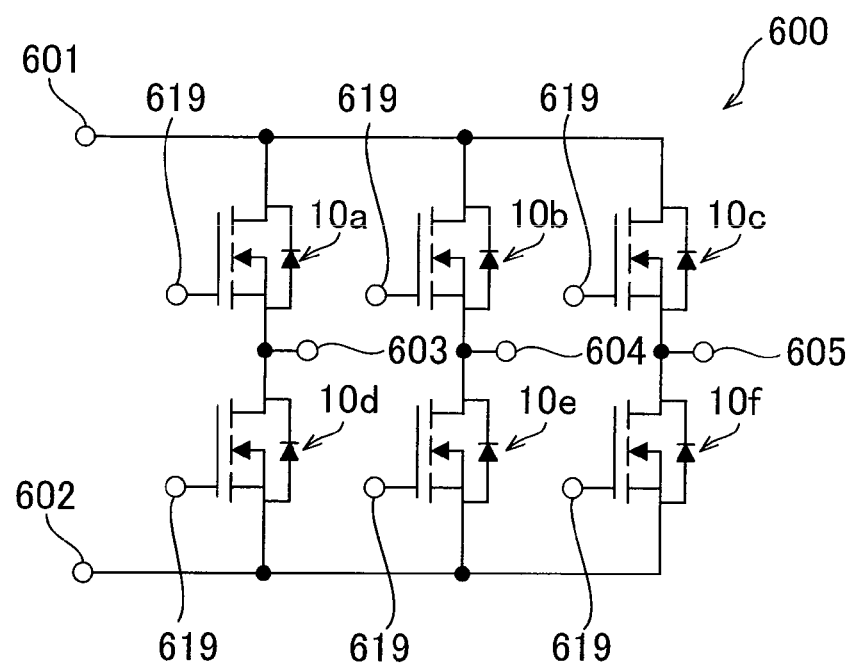
FIG. 75 is a circuit diagram of a power conversion device, the diagram representing a reference example.

As illustrated in FIG. 75, a power conversion device 600 according to the reference example for the embodiment includes a wiring board 617 (FIG. 76) having a P-terminal 601, an N-terminal 602, a U-terminal 603, a V-terminal 604, and a W-terminal 605, and six power modules 10 (10a to 10f). Every two of the six power modules 10 (10a to 10f) in pair are connected in parallel in three stages, whereby a 3-phase full-bridge circuit is constituted.

More specifically, the power module 10a and the power module 10d are connected in series. The power module 10b and the power module 10e are connected in series. The power module 10c and the power module 10f are connected in series. The drain sides of the power modules 10a, 10b and 10c are connected to the P-terminal 601. The source sides of the power modules 10a, 10b and 10c are connected respectively to the U-terminal 603, the V-terminal 604, and the W-terminal 605. The drain sides of the power modules 10d, 10e and 10f are connected respectively to the U-terminal 603, the V-terminal 604, and the W-terminal 605. The source sides of the power modules 10d, 10e and 10f are connected to the N-terminal 602.

Figure 76:
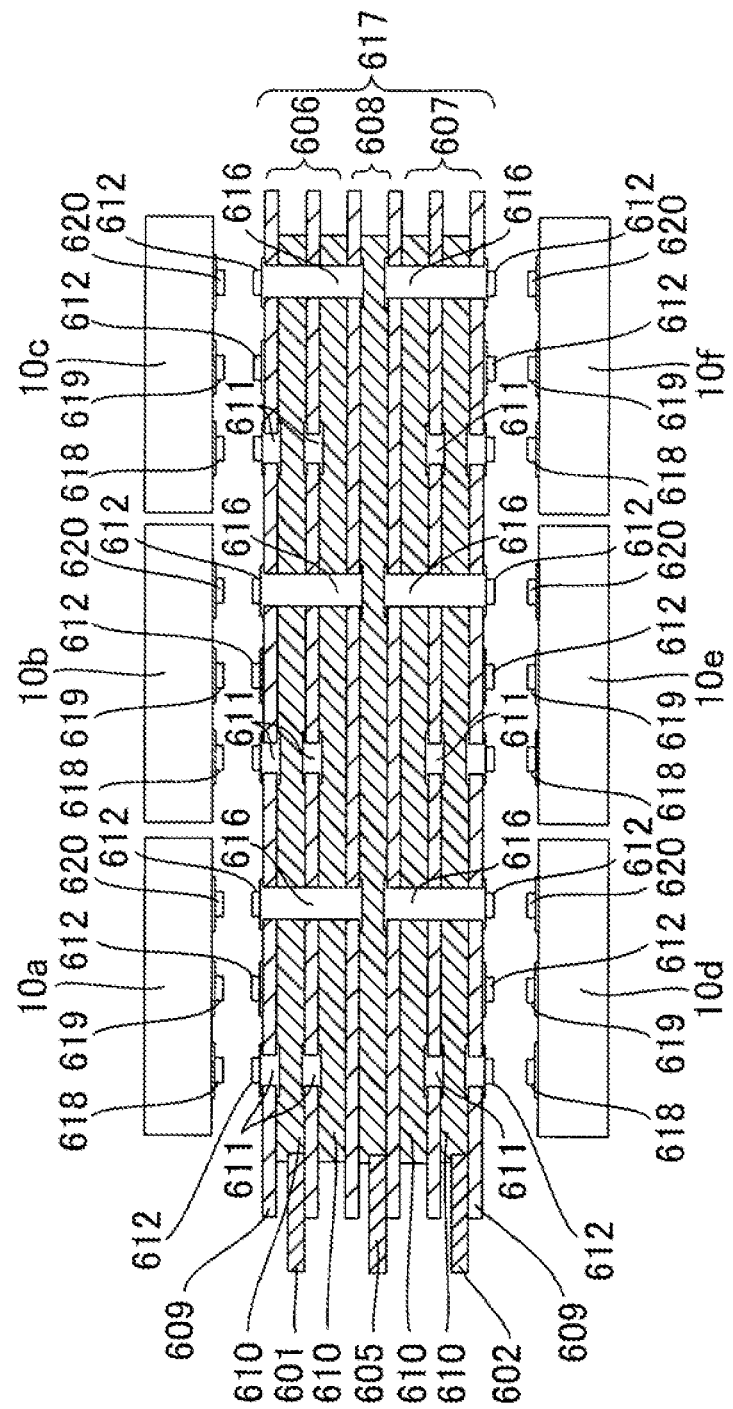
FIG. 76 is a sectional view to explain an inner structure of a wiring board in the power conversion device, the diagram representing the reference example.

In a practical structure illustrated in FIG. 76, the three power modules 10a, 10b and 10c are connected to a P-potential layer 606, and the three power modules 10d, 10e and 10f are connected to an N-potential layer 607. The P-potential layer 606 and the N-potential layer 607 are connected to an output potential layer 608.

The P-potential layer 606 is constituted by two insulating substrates 609 and two fine wiring members 610. The fine wiring members 610 are formed of, e.g., one of the fine wiring members according to the above-described sixth to eleventh embodiments. The two fine wiring members 610 are connected to each other by vias 611 such that they are held at the same electrical potential. Connection terminals 612 for connection to the power modules 10a, 10b and 10c are disposed on an upper surface of one of the insulating substrates 609. The P-terminal 601 is disposed at one end of one of the fine wiring members 610.

The N-potential layer 607 is constituted by two insulating substrates 609 and two fine wiring members 610. The two fine wiring members 610 are connected to each other by vias 611 such that they are held at the same electrical potential. Connection terminals 612 for connection to the power modules 10d, 10e and 10f are disposed on a lower surface of one of the insulating substrates 609. The N-terminal 602 is disposed at one end of one of the fine wiring members 610.

Figure 77:
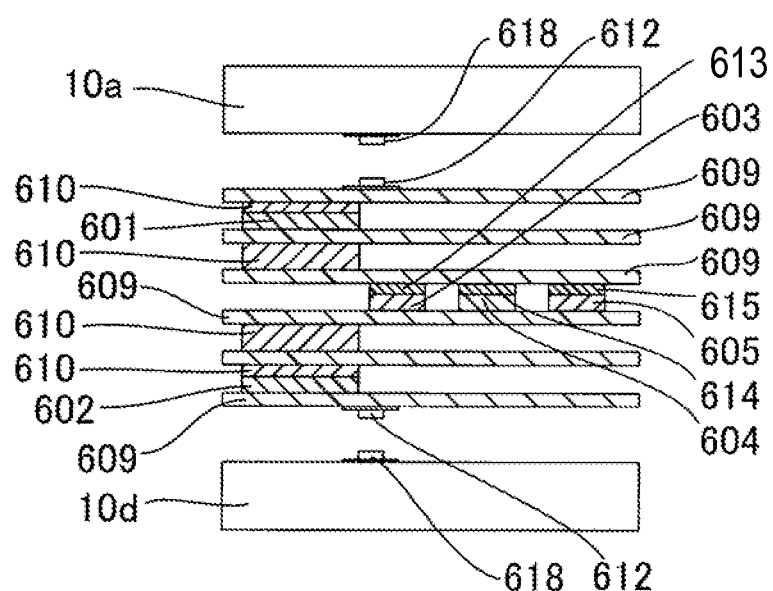
FIG. 77 is a sectional view to explain the inner structure of the wiring board in the power conversion device, the diagram representing the reference example.
Figure 78:
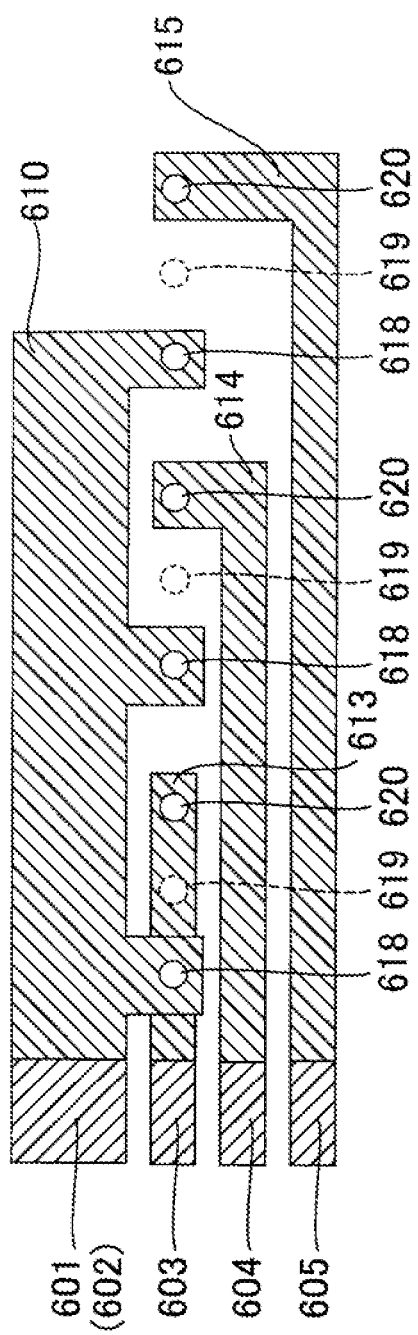
FIG. 78 is a plan view to explain an output potential layer of the wiring board in the power conversion device, the diagram representing the reference example.

As illustrated in FIGS. 77 and 78, the output potential layer 608 is constituted by a U-phase output wiring 613, a V-phase output wiring 614, a W-phase output wiring 615, and two insulating substrates 609 (see FIG. 76). The U-phase output wiring 613, the V-phase output wiring 614, and the W-phase output wiring 615 are arranged in a state sandwiched between the two insulating substrates 609. The U-terminal 603, the V-terminal 604, and the W-terminal 605 are disposed at respectively one ends of the U-phase output wiring 613, the V-phase output wiring 614, and the W-phase output wiring 615.

As illustrated in FIG. 76, the P-potential layer 606 is stacked on an upper surface of the output potential layer 608, and the connection terminals 612 are electrically connected to the U-phase output wiring 613, the V-phase output wiring 614, and the W-phase output wiring 615 via through-holes 616. The N-potential layer 607 is stacked on a lower surface of the output potential layer 608, and the connection terminals 612 are electrically connected to the U-phase output wiring 613, the V-phase output wiring 614, and the W-phase output wiring 615 via through-holes 616. The wiring board 617 is constituted by the P-potential layer 606, the N-potential layer 607, and the output potential layer 608.

The 3-phase full-bridge circuit, illustrated in FIG. 75, is constituted by connecting the drain terminals 618, the gate terminals 619, and the source terminals 620 of the power modules 10 (10a to 10f) to the connection terminals 612 of the wiring board 617. When the 3-phase full-bridge circuit is driven, a high-frequency current in a rectangular waveform depending on the switching frequency of the power modules 10a to 10f flows through wiring lines extending from the P-terminal 601 and the N-terminal 602 (i.e., wiring lines from the P-terminal 601 to the power modules 10a to 10c through the fine wiring member 610 and wiring lines from the N-terminal 602 to the power modules 10d to 10f through the fine wiring member 610).

Recently, development of power semiconductor elements using new materials, such as SiC and GaN, has progressed. It is said that the switching frequency in the case utilizing those new materials is several hundreds Hz to 1 MHz. Therefore, heat concentration in the wiring surface due to uneven wiring impedance tends to become an actual problem in practical use. By applying the fine wiring member 610 to the wiring board 617 as described above, the wiring impedance can be made more even. Further, the heat concentration in the wiring surface can be relieved. As a result, the size of the power conversion device can be reduced.

The embodiments disclosed herein are to be construed in all respects as illustrative and not restrictive. The scopes stated in the embodiments are to be construed as being defined not in the foregoing description of the embodiments, but in the appended claims, and as involving all changes that are equivalent in meaning and scope to the claims.

For example, while the first embodiment has been described above in connection with the example in which three power modules are arranged on each of the upper and lower surface of the wiring board, practical applications are not limited to that example. The power module(s) may be arranged, e.g., only one of the upper and lower surfaces of the wiring board.

While the first embodiment has been described above in connection with the example in which a total of six power modules are connected to the wiring board, practical applications are not limited to that example. As another example, five or less power modules may be connected to the wiring board, or seven or more power modules may be connected to the wiring board.

While the first embodiment has been described above in connection with the example in which the wiring board is molded with the insulating resin material to fill the spaces between adjacent ones of the conductor plates, the liquid-cooling pipes, and the capacitance member, and to define the outer contours of the wiring board, practical applications are not limited to that example. As another example, the resin material may be filled at least between the conductor plates and the liquid-cooling pipes. Alternatively, the resin material may be filled only between the conductor plates and the liquid-cooling pipes. The resin material may not define the outer contour of the wiring board. As another example, the wiring board may be contained in a case and the resin material may be filled into individual inner spaces of the wiring board within the case.

While the first embodiment has been described above in connection with the example in which the insulating resin material molding the wiring board contains the filler, e.g., alumina, silica, aluminum nitride, or silicon nitride, for increasing the thermal conductivity, practical applications are not limited to that example. The resin material may not contain the filler for increasing the thermal conductivity.

While the first embodiment has been described above in connection with the example in which the wiring board is molded with the insulating resin material to fill the spaces between adjacent ones of the conductor plates, the liquid-cooling pipes, and the capacitance member, thereby covering the surroundings of the liquid-cooling pipes with the resin material, practical applications are not limited to that example. As another example, the resin material may be filled only between the conductor plates and the liquid-cooling pipes instead of covering the liquid-cooling pipes entirely.

While the first embodiment has been described above in connection with the example in which the wiring board includes the capacitance member made up of the dielectric plate, the first conductor, and the second conductor, practical applications are not limited to that example. As another example, the wiring board may not include the capacitance member.

While the first embodiment has been described above in connection with the example in which a total of six liquid-cooling pipes are disposed in the wiring board, practical applications are not limited to that example. As another example, five or less liquid-cooling pipes may be disposed in the wiring board, or seven or more liquid-cooling pipes may be disposed in the wiring board.

While the first embodiment has been described above in connection with the example in which the liquid-cooling pipes are disposed to extend in the lengthwise direction of the wiring board in a state crossing the conductor plates, practical applications are not limited to that example. As another example, the liquid-cooling pipes may be disposed to extend along the conductor plates without crossing the conductor plates. The liquid-cooling pipes are arranged at least near the conductor plates.

While the first embodiment has been described above in connection with the example in which the liquid-cooling pipes are disposed to linearly extend in the lengthwise direction of the wiring board, practical applications are not limited to that example. As another example, the liquid-cooling pipes may be disposed in a bent form. More specifically, the liquid-cooling pipes may be bent along, e.g., the conductor plates within the wiring board.

While the first to twenty-seventh embodiments have been described above in connection with the example in which the FET formed on the SiC substrate containing silicon carbide (SiC) as a principal component and being able to perform the high-frequency switching operation is used as the semiconductor element, practical applications are not limited to that example. As another example, a FET formed on a GaN substrate containing gallium nitride (GaN) as a principal component and being able to perform the high-frequency switching operation may be used as the semiconductor element. A MOSFET (Metal Oxide Semiconductor Field-Effect Transistor) formed on a Si substrate containing silicon (Si) as a principal component may be used as the semiconductor element. Further, an IGBT (Insulated Gate Bipolar Transistor) or the like other than the FET may be used as the semiconductor element.

While the third to fifth embodiments have been described above in connection with the example in which the cooling holes are filled with, e.g., copper, silver, or nickel, practical applications are not limited to that example. As another example, the cooling holes may be not filled with, e.g., copper, silver, or nickel.

While the twenty-sixth and twenty-seventh embodiments have been described above in connection with the example in which the power modules are disposed in the inverter unit and the converter unit, practical applications are not limited to that example. As another example, the power modules according to the above-described embodiments may be disposed in electronic equipment other than the inverter unit and the converter unit.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board comprising:
   a conductor plate including a wiring portion and an electrode portion connected to a power conversion semiconductor element;
   a liquid-cooling pipe mounted near the conductor plate and causing a cooling liquid to be supplied therethrough; and
   an insulating resin material arranged at least between the conductor plate and the liquid-cooling pipe.

2. The wiring board according to claim 1, wherein the resin material contains a filler for increasing thermal conductivity.

3. The wiring board according to claim 2, wherein the resin material is molded such that the resin material covers the conductor plate while the electrode portion of the conductor plate is exposed, and
   the power conversion semiconductor element is connectable to the exposed electrode portion.

4. The wiring board according to claim 3, wherein the resin material is molded such that the resin material covers surroundings of the liquid-cooling pipe.

5. The wiring board according to claim 1, wherein the conductor plate is disposed to extend in a predetermined direction as viewed from above, and
   the liquid-cooling pipe is disposed to extend in a direction crossing the conductor plate as viewed from above.

6. The wiring board according to claim 5, further comprising:
   a capacitance member including a dielectric plate having a plate-like shape, a first conductor arranged on one surface of the dielectric plate, and a second conductor arranged on the other surface of the dielectric plate,
   wherein the wiring portion of the conductor plate is connected to corresponding one of the first conductor and the second conductor of the capacitance member.

7. The wiring board according to claim 6, wherein the conductor plate includes a first conductor plate arranged on one surface side of the wiring board and connected to one power conversion semiconductor element, and a second conductor plate arranged on the other surface side of the wiring board and connected to the other power conversion semiconductor element, and
   the liquid-cooling pipe includes a first liquid-cooling pipe arranged between the first conductor of the capacitance member and the first conductor plate, and a second liquid-cooling pipe arranged between the second conductor of the capacitance member and the second conductor plate.

8. The wiring board according to claim 7, wherein the wiring portion of the first conductor plate is connected to the first conductor of the capacitance member, and the wiring portion of the second conductor plate is connected to the second conductor of the capacitance member.

9. The wiring board according to claim 7, wherein the conductor plate, the liquid-cooling pipe, and the capacitance member are integrally molded with the insulating resin material.

10. The wiring board according to claim 9, wherein the conductor plate is formed by bundling a plurality of conductor lines into a plate-like shape.

11. The wiring board according to claim 9, wherein the conductor plate includes a fine wiring member that is formed of a fine wiring conductor extending in a flowing direction of a high-frequency current.

12. The wiring board according to claim 11, wherein the fine wiring member includes the plurality of fine wiring conductors arranged in a same plane adjacent to each other with an interval therebetween, and
the wiring board further includes a cooling pipe arranged between the wiring conductors adjacent to each other.

13. The wiring board according to claim 12, wherein the fine wiring member formed of the wiring conductor includes a first wiring conductor and a second wiring conductor, which are stacked with an insulating substrate interposed therebetween.

14. The wiring board according to claim 13, further comprising an interconnection wiring portion penetrating through the insulating substrate and electrically interconnecting the first wiring conductor and the second wiring conductor, which are stacked with the insulating substrate interposed therebetween.

15. The wiring board according to claim 9, wherein the conductor plate includes a wiring conductor that has, in an outer surface thereof, a concave-convex shape extending in a flowing direction of a high-frequency current.

16. A power conversion device comprising:
a power conversion semiconductor element; and
a wiring board electrically connected to the power conversion semiconductor element, the wiring board including:
a conductor plate including a wiring portion and an electrode portion connected to the power conversion semiconductor element,
a liquid-cooling pipe mounted near the conductor plate and causing a cooling liquid to be supplied therethrough; and
an insulating resin material arranged at least between the conductor plate and the liquid-cooling pipe.

17. The power conversion device according to claim 16, wherein the power conversion semiconductor element is formed of a semiconductor made of SiC or GaN.

18. The power conversion device according to claim 17, further comprising terminals electrically connected to electrodes of the power conversion semiconductor element; and
a terminal block connected to the terminals,
wherein the terminal block includes a plurality of metal-made connection terminal members, and a resin-made insulating portion that insulates adjacent two of connection terminal members from each other, and
the insulating portion has a raised step providing a level difference at a boundary between the connection terminal member and the insulating portion.

19. The power conversion device according to claim 18, wherein the connection terminal members of the terminal block include slits, and
the slits are filled with the same resin as that forming the insulating portion.

20. The power conversion device according to claim 19, wherein the power conversion device includes a first power conversion device and a second power conversion device, and
the connection terminal members of the terminal block include first connection terminal portions for connection to the first power conversion device, and second connection terminal portions for connection to the second power conversion device.

* * * * *